(12) United States Patent
Nagasawa et al.

(10) Patent No.: US 11,417,842 B2
(45) Date of Patent: Aug. 16, 2022

(54) CONDUCTIVE POLYMER COMPOSITE AND CONDUCTIVE POLYMER COMPOSITION

(71) Applicant: SHIN-ETSU CHEMICAL CO., LTD., Tokyo (JP)

(72) Inventors: Takayuki Nagasawa, Joetsu (JP); Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 79 days.

(21) Appl. No.: 16/783,258

(22) Filed: Feb. 6, 2020

(65) Prior Publication Data

US 2020/0259094 A1 Aug. 13, 2020

(30) Foreign Application Priority Data

Feb. 8, 2019 (JP) .............................. JP2019-021118

(51) Int. Cl.
*H01L 51/50* (2006.01)
*H01L 51/00* (2006.01)
(Continued)

(52) U.S. Cl.
CPC ........ *H01L 51/0035* (2013.01); *C08F 212/30* (2020.02); *C08F 220/382* (2020.02); *H01L 51/5092* (2013.01); *H01L 51/5234* (2013.01)

(58) Field of Classification Search
CPC .................. C08F 212/20; C08F 212/24; C08F 220/382; C08F 212/26; C08F 212/30;
(Continued)

(56) References Cited

U.S. PATENT DOCUMENTS

2007/0069185 A1 3/2007 Hsu et al.
2015/0340118 A1 11/2015 Nagasawa et al.
(Continued)

FOREIGN PATENT DOCUMENTS

EP 2 947 126 A1 11/2015
JP 2008-146913 A 6/2008
(Continued)

OTHER PUBLICATIONS

Mar. 9, 2021 Office Action issued in European Patent Application No. 20155974.7.
(Continued)

*Primary Examiner* — Mark Kopec
*Assistant Examiner* — Jaison P Thomas
(74) *Attorney, Agent, or Firm* — Oliff PLC

(57) ABSTRACT

Provided are a conductive polymer composite and composition which: improve water volatilization efficiency during film formation by incorporating a novel non-doping fluorinated unit in a dopant polymer; also reduce H⁺ generation by using the non-doping fluorinated unit in place of an acid unit generating extra acids; have good filterability and film formability; and are capable of forming a film having high transparency and good flatness when the film is formed. The conductive polymer composite is a composite containing: (A) a π-conjugated polymer; and (B) a dopant polymer which is a copolymer containing a repeating unit "a" shown by the following general formula (1) and at least one repeating unit "b" selected from repeating units shown by the following general formulae (2-1) to (2-7).

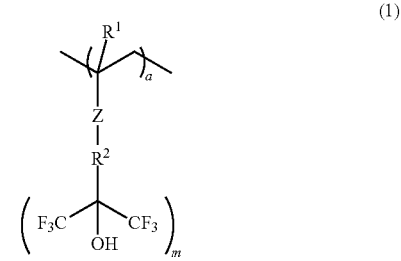

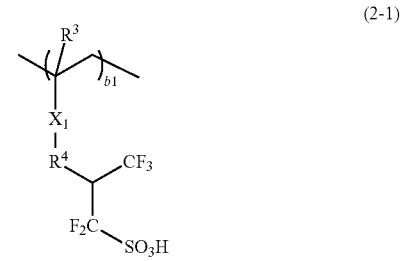

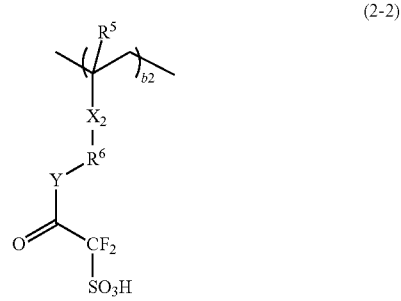

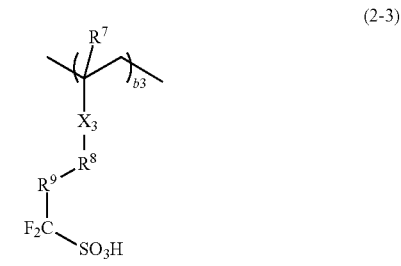

(Continued)

-continued (2-4)

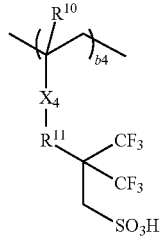

(2-5)

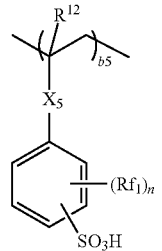

(2-6)

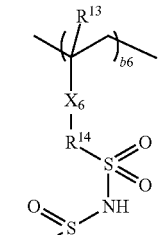

(2-7)

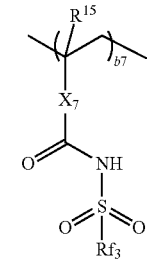

13 Claims, No Drawings

(51) Int. Cl.
*C08F 212/14* (2006.01)
*C08F 220/38* (2006.01)
*H01L 51/52* (2006.01)

(58) Field of Classification Search
CPC .... C08F 212/14; C08F 220/24; C09D 125/18; H01B 1/125; H01L 51/0035; H01L 51/5092; H01L 51/5234
See application file for complete search history.

(56) References Cited

U.S. PATENT DOCUMENTS

| | | |
|---|---|---|
| 2016/0064112 A1 | 3/2016 | Hatakeyama et al. |
| 2016/0064113 A1 | 3/2016 | Hatakeyama et al. |
| 2016/0071626 A1 | 3/2016 | Hatakeyama et al. |
| 2016/0075875 A1* | 3/2016 | Hatakeyama ........... C08L 65/00 252/500 |
| 2016/0078977 A1* | 3/2016 | Hatakeyama .......... H01B 1/124 252/500 |
| 2017/0058066 A1 | 3/2017 | Hatakeyama et al. |
| 2017/0058144 A1 | 3/2017 | Hatakeyama et al. |
| 2017/0233596 A1* | 8/2017 | Hatakeyama ........ C09D 125/18 252/500 |
| 2018/0240564 A1 | 8/2018 | Hatakeyama et al. |
| 2020/0247926 A1* | 8/2020 | Hatakeyama ....... C08F 220/382 |

FOREIGN PATENT DOCUMENTS

| | | |
|---|---|---|
| JP | 2008-546899 A | 12/2008 |
| JP | 2016-050304 A | 4/2016 |
| JP | 2016-056348 A | 4/2016 |
| JP | 2016-188350 A | 11/2016 |
| JP | 2017-043753 A | 3/2017 |
| JP | 2017-145323 A | 8/2017 |
| JP | 2018-135471 A | 8/2018 |

OTHER PUBLICATIONS

May 12, 2020 Extended Search Report issued in European Patent Application No. 20155974.7.
Oct. 26, 2021 Office Action issued in Japanese Patent Application No. 2019-021118.

* cited by examiner

CONDUCTIVE POLYMER COMPOSITE AND CONDUCTIVE POLYMER COMPOSITION

TECHNICAL FIELD

The present invention relates to a conductive polymer composite, a conductive polymer composition, and a substrate on which an electrode layer or a hole injection layer in an organic EL device is formed from the conductive polymer composite or the conductive polymer composition.

BACKGROUND ART

A polymer having a conjugated double bond (a π-conjugated polymer) does not show conductivity by itself, but becomes a conductive polymer material by doping with an appropriate anion molecule which causes electron or hole to move. (Hetero)aromatic polymers such as polythiophene, polyselenophene, polytellurophene, polypyrrole, polyaniline, a mixture thereof, and the like, have been used as the π-conjugated polymer, and a sulfonic acid-based anion has most frequently been used as the anion molecule (a dopant). This is because the sulfonic acid, which is a strong acid, interacts efficiently with the π-conjugated polymer.

As the sulfonic acid-based anion dopant, sulfonic acid polymers such as polyvinylsulfonic acid and polystyrenesulfonic acid (PSS) have widely been used (Patent Document 1). In addition, among the sulfonic acid polymers, a vinyl perfluoroalkyl ether sulfonic acid represented by Nafion® has been used for fuel cell applications.

The polystyrenesulfonic acid (PSS) which is a sulfonic acid homopolymer has high efficiency in doping to the π-conjugated polymer since sulfonic acids are continuously present as the monomer unit in the polymer main chain, and it can improve dispersibility of the doped π-conjugated polymer in water. This is because hydrophilicity is retained by the presence of sulfo groups excessively present in the PSS compared with the doped portion, so that the dispersibility into water is dramatically improved.

Polythiophene using the PSS as a dopant can be handled as a highly conductive aqueous dispersion, and is thus expected as a coating-type transparent electrode film material in place of ITO (indium tin oxide) used as a transparent electrode in organic EL, solar cell, and so forth. While thin-film devices including organic EL, solar cell, and so forth are in such a trend that all the layers are made from coating-type material, high conductivity is not required, but it is desirable to apply polythiophene as a coating material which functions as an injection layer to reduce the carrier transfer load from an electrode to a carrier transfer layer.

Since PSS is a water-soluble resin having quite a high affinity to water, when a composite is formed together with a π-conjugated polymer, the polymer having hydrophobic nature can be dispersed as particles in water. This dispersion can be handled as a liquid, and adding a surfactant and so forth thereto enables film formation by coating of organic and inorganic substrates, which are otherwise hardly coated. In the aforementioned applications also, such dispersion can form films on the substrates. As the method for forming the film, for example, coating with a spin coater or the like, bar coating, dipping, comma coating, spray coating, roll coating, screen printing, flexographic printing, gravure printing, or ink-jet printing may be employed for the coating, followed by a heat treatment with a hot air circulation furnace, hot plate, or the like, by IR or UV irradiation, or the like, so that a conductive film can be formed.

On the other hand, due to the high hydrophilicity of PSS, a large amount of moisture remains in a film formed by coating a substrate with a composite of a π-conjugated polymer with PSS as a dopant, followed by heating with a hot air circulation furnace, hot plate, or the like, by IR or UV irradiation, or the like. After device formation and sealing, the moisture volatizes and fills the device, for example, and consequently significantly lowers the device performance in some cases. When this material is used for a film (thin film) constituting, for example, an organic EL, the moisture remaining in the film and moisture absorbed from the external atmosphere in the manufacturing process till sealing volatize or permeate an adjacent layer after constituent layers are laminated and sealed. When the moisture condenses in the sealed device or in the film, this causes defects and lowers the device functions such as decreased the function of the light emitting layer and increased voltage for driving the device due to the moisture in the film. Consequently, there are problems such as shortened device lifetime.

Moreover, when a composite of a π-conjugated polymer with PSS as a dopant is used as a transparent electrode material or a hole injection layer material in an organic thin-film device such as organic EL or solar cell, there are other problems of low affinity to organic solvents and low coatability on hydrophobic substrates besides the aforementioned problems of moisture remaining after film formation. These make it difficult to form a film by spin coating or with various printing devices. Meanwhile, PEDOT-PSS, which has been studied for wide applications, absorbs light in the visible light range and the transmittance is low. Hence, this material has a difficulty in application to light permeable, light emitting devices, and has natures such that particles of a composite containing PEDOT-PSS are likely to aggregate. Even after the composition material is prepared in a liquid state, the filtration and purification are difficult. Coating with this material without filtration has brought about problems that: the coating is improperly carried out due to the influence of the particle aggregates; even if a uniform film is obtained, the surface roughness is poor; when the uniform film is employed for organic EL, solar cell, or the like having a laminate structure, problems such as impaired carrier transfer and short circuit are likely to occur due to such large surface unevenness or pinhole.

Patent Documents 2, 3 propose conductive polymer compositions formed by using: a π-conjugated polymer formed of a repeating unit selected from thiophene, pyrrole, aniline, and polycyclic aromatic compounds; and a dopant polymer incorporating a fluorinated acid unit. It is disclosed that an aqueous dispersion of a conductive polymer composite is obtained by combining water, a precursor monomer of the π-conjugated polymer, a fluorinated acid polymer, and an oxidizing agent in any order.

By introducing a fluorinated acid unit, the affinity of the fluorine atoms to organic solvents is imparted to the dopant polymer. As a result, the composite including the π-conjugated polymer as a whole has higher affinity to organic solvents and hydrophobic substrate surface, improving the dispersibility of the composite in organic solvents and coatability on hydrophobic substrates.

CITATION LIST

Patent Literature

Patent Document 1: Japanese Unexamined Patent Application Publication No. 2008-146913

Patent Document 2: Japanese Translation of PCT International Application Publication No. 2008-546899

Patent Document 3: Japanese Unexamined Patent Application Publication No. 2016-188350

SUMMARY OF INVENTION

Technical Problem

Nevertheless, after the film formation, there is no effect of reducing residual moisture in the film. Meanwhile, the dopant is composed of a fluorinated acid unit, and such an acid unit as styrenesulfonic acid, which is a constituent monomer of PSS; the amount of $H^+$ generated from extra sulfonated terminals other than the sulfonated terminal for doping the π-conjugated polymer is not controlled. In other words, in a case where every repeating unit of the dopant polymer is a unit having a sulfonated terminal, the repeating units constituting the π-conjugated polymer are not doped therewith at a ratio of 1:1. Hence, the sulfonated terminals of the repeating units of the dopant polymer in a non-doping state are present as free acids, so that the acidity of the material in a liquid state before film formation is very high. Due to the influence of such high acidity, a problem occurs that surrounding members corrode progressively in the coating step. Furthermore, even after a formed film is dried, the dopant polymer as a constituent of a thin-film device causes $H^+$ to diffuse into the device structure through the adjacent layer or from a side surface of the laminate structure, bringing about problems such as chemical changes in constituent layers, and decreases in function, device performance as a whole, and durability.

The present invention has been made in view of the above circumstances, and an object thereof is to provide a conductive polymer composite and a conductive polymer composition which: improve water volatilization efficiency during film formation by incorporating a novel non-doping fluorinated unit in a dopant polymer; also reduce $H^+$ generation by using the non-doping fluorinated unit in place of an acid unit generating extra acids; have good filterability and film formability; and are capable of forming a film having high transparency and good flatness when the film is formed.

Solution to Problem

To achieve the object, the present invention provides a conductive polymer composite which comprises a composite comprising:

(A) a π-conjugated polymer; and (B) a dopant polymer comprising a copolymer containing a repeating unit "a" shown by the following general formula (1) and at least one repeating unit "b" selected from repeating units shown by the following general formulae (2-1) to (2-7),

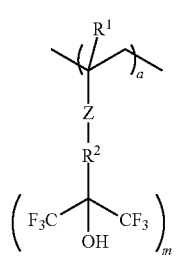

(1)

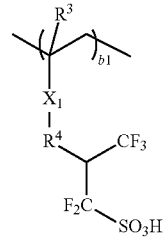

(2-1)

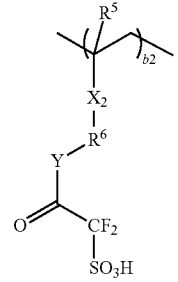

(2-2)

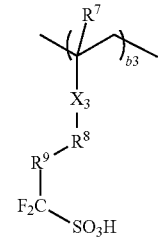

(2-3)

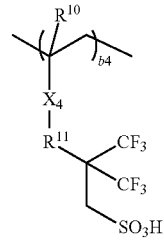

(2-4)

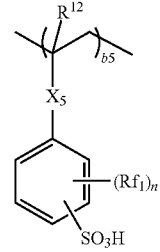

(2-5)

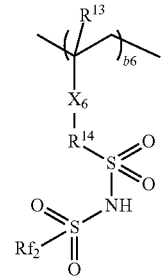

(2-6)

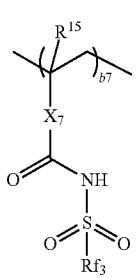

(2-7)

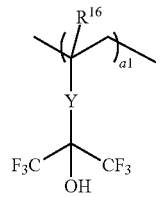

(4-1)

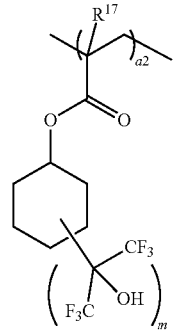

(4-2)

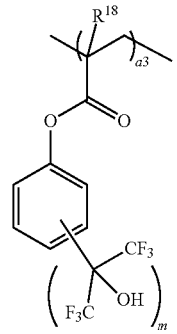

(4-3)

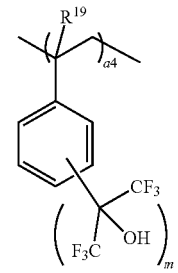

(4-4)

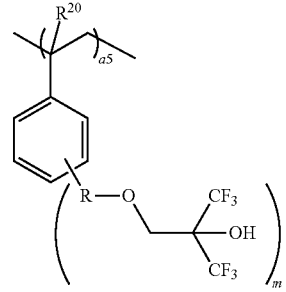

(4-5)

wherein $R^1$ represents a hydrogen atom or a methyl group; Z represents any of a phenylene group, a naphthylene group, and an ester group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, $R^2$ represents a linear, branched, or cyclic hydrocarbon group having 1 to 12 carbon atoms optionally having one or both of a single bond and an ether group; "m" represents any one of 1 to 3; $R^3$, $R^5$, $R^7$, $R^{10}$, $R^{12}$, $R^{13}$, and $R^{15}$ each independently represent a hydrogen atom or a methyl group; $R^4$, $R^6$, $R^8$, $R^{11}$, and $R^{14}$ each independently represent any of a single bond and a linear, branched, or cyclic hydrocarbon group having 1 to 12 carbon atoms optionally having one or both of an ether group and an ester group; $R^9$ represents a linear or branched alkylene group having 1 to 4 carbon atoms, and one or two hydrogen atoms in $R^9$ are optionally substituted with a fluorine atom; $X_1$, $X_2$, $X_3$, $X_4$, $X_6$, and $X_7$ each independently represent any of a single bond, a phenylene group, a naphthylene group, an ether group, an ester group, and an amide group; $X_5$ represents any of a single bond, an ether group, and an ester group; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a hetero atom; $Rf_1$ represents a fluorine atom or a trifluoromethyl group; $Rf_2$ and $Rf_3$ each represent a linear or branched alkyl group having 1 to 4 carbon atoms with one or more fluorine atoms, or a phenyl group substituted with a fluorine atom or a trifluoromethyl group; "n" represents an integer of 1 to 4; and "a", b1, b2, b3, b4, b5, b6, and b7 satisfy $0<a<1.0$, $0 \leq b1<1.0$, $0 \leq b2<1.0$, $0 \leq b3<1.0$, $0 \leq b4<1.0$, $0 \leq b5<1.0$, $0 \leq b6<1.0$, $0 \leq b7<1.0$, and $0<b1+b2+b3+b4+b5+b6+b7<1.0$.

Such a conductive polymer composite has good filterability and favorable film formability on organic and inorganic substrates having high hydrophobicity, and is capable of forming a conductive film having good transparency and flatness, and capable of reducing moisture remained in the film in the film formation process when the film is to be formed.

The repeating unit "a" in the dopant polymer (B) preferably contains one or more selected from repeating units a1 to a5 shown by the following general formulae (4-1) to (4-5):

wherein $R^{16}$, $R^{17}$, $R^{18}$, $R^{19}$, and $R^{20}$ each independently represent a hydrogen atom or a methyl group; R represents a single bond, a methylene group, an ethylidene group, or an isopropylidene group; and Y and "m" are as defined above.

The repeating unit "b" in the dopant polymer (B) preferably contains one or more selected from repeating units b'1 to b'4 shown by the following general formulae (5-1) to (5-4):

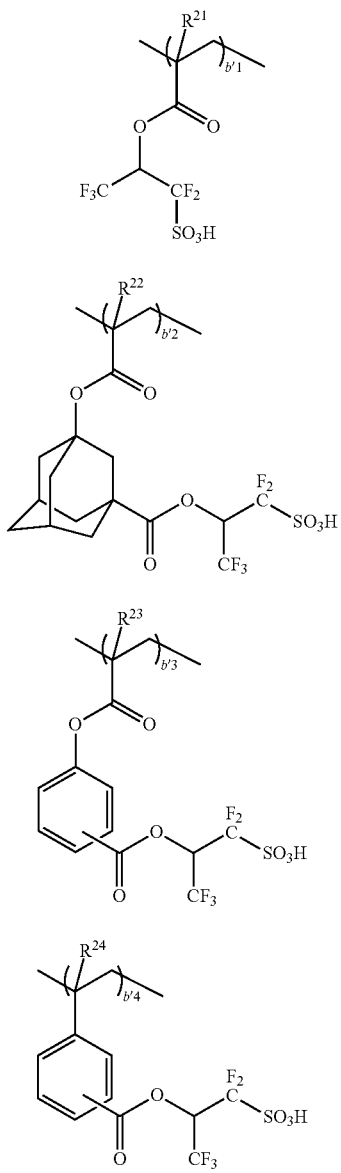

wherein $R^{21}$, $R^{22}$, $R^{23}$, and $R^{24}$ each independently represent a hydrogen atom or a methyl group; and b'1, b'2, b'3, and b'4 satisfy $0 \leq b'1 < 1.0$, $0 \leq b'2 < 1.0$, $0 \leq b'3 < 1.0$, $0 \leq b'4 < 1.0$, and $0 < b'1+b'2+b'3+b'4 < 1.0$.

When the repeating units "a" and "b" in the dopant polymer (B) are particularly as described above, the conductive polymer composite is improved in terms of filterability, film formability, coatability on organic and inorganic substrates, and transmittance after film formation. Additionally, after film formation, the effect of reducing residual moisture in the film is further increased.

The dopant polymer (B) may further contain a repeating unit "c" shown by the following general formula (6):

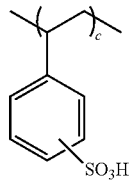

wherein "c" satisfies $0 < c < 1.0$.

By incorporating such a repeating unit "c" into the dopant polymer (B), it is possible to adjust the conductivity of the film appropriately for intended applications and for efficient function demonstration when a device constituent layer is formed.

The dopant polymer (B) preferably has a weight average molecular weight of 1,000 to 500,000.

When the weight average molecular weight of the dopant polymer (B) is within this range, the heat resistance of the polymer composite, the uniformity of the polymer composite in a solution, and the dispersibility of the polymer composite into water and organic solvents are enhanced.

The repeating unit "a" in the dopant polymer (B) preferably has a copolymerization ratio of 10% to 60% relative to all the repeating units.

When the copolymerization ratio of the repeating unit "a" in the dopant polymer (B) relative to all the repeating units is within this range, the effects of the present invention are more sufficiently exhibited.

The dopant polymer (B) is preferably a block copolymer.

In this case, the conductivity of the conductive polymer composite is improved.

The π-conjugated polymer (A) is preferably a material in which one or more precursor monomers selected from the group consisting of pyrrole, thiophene, selenophene, tellurophene, aniline, polycyclic aromatic compounds, and derivatives thereof are polymerized.

When the precursor monomer is a specific monomer(s) as described above, polymerization is easy, and stability in air is good so that the π-conjugated polymer (A) can be easily synthesized.

The conductive polymer composite is preferably used to form a transparent electrode layer or a hole injection layer of an organic EL device.

A conductive film formed from the conductive polymer composite is excellent in conductivity, hole injectability, and transparency, and thus suitably functions as a transparent electrode layer or a hole injection layer of an organic EL device.

Moreover, the present invention provides a conductive polymer composition comprising:
the above-described conductive polymer composite;
water or an organic solvent as a solvent; and
a compound (C) shown by the following general formula (3),

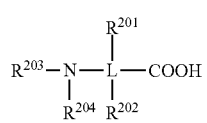

wherein $R^{201}$ and $R^{202}$ each independently represent any of a hydrogen atom, a hetero atom, and a linear, branched, or cyclic monovalent hydrocarbon group having 1 to 20 carbon atoms optionally having a hetero atom; $R^{203}$ and $R^{204}$ each independently represent any of a hydrogen atom and a linear, branched, or cyclic monovalent hydrocarbon group having 1 to 20 carbon atoms optionally having a hetero atom; $R^{201}$ and $R^{203}$, or $R^{201}$ and $R^{204}$ are optionally bonded to each other to form a ring; L represents a linear, branched, or cyclic tetravalent organic group having 1 to 20 carbon atoms optionally having a hetero atom; and when L has a hetero atom, the hetero atom is optionally an ion.

When a film is formed using such a conductive polymer composition as an electrode or a hole injection layer of a thin film-stacked device such as organic EL and solar cell, the acid diffusion to an adjacent layer and another constituent layer of the laminate structure is suppressed, making it possible to relieve the influence of the acid.

In this case, the compound (C) is preferably contained in an amount of 1 to 30 parts by mass based on 100 parts by mass of the conductive polymer composite.

When the content of the compound (C) is within the specific range as described above, the effect of reducing the acid diffusion from an antistatic film formed of the conductive polymer composition to another layer is further improved.

The conductive polymer composition preferably has a pH of 4.0 to 9.0.

When the pH of the conductive polymer composition is within this range, the effects of the present invention are more sufficiently exhibited.

Preferably, the conductive polymer composition further comprises a nonionic surfactant.

When the conductive polymer composition contains a nonionic surfactant, the coatability to a material to be processed such as a substrate is further improved.

In this case, the nonionic surfactant is preferably contained in an amount of 1 to 15 parts by mass based on 100 parts by mass of the conductive polymer composite.

When the content of the nonionic surfactant is within this range, the coatability onto a material to be processed such as a substrate is more favorable, and the surface flatness of the formed film is also further improved.

The conductive polymer composition is preferably used to form a transparent electrode layer or a hole injection layer of an organic EL device.

A conductive film formed from the conductive polymer composition is excellent in conductivity, hole injectability, and transparency, and thus suitably functions as a transparent electrode layer or a hole injection layer of an organic EL device.

Further, the present invention provides a substrate on which an electrode layer or a hole injection layer in an organic EL device is formed from the conductive polymer composite or the conductive polymer composition described above.

The electrode layer or the hole injection layer in an organic EL device is formed from a conductive film excellent in conductivity, hole injectability, and transparency, and is provided to such a substrate.

Advantageous Effects of Invention

As described above, the inventive conductive polymer composite and the inventive composition have low viscosity, good filterability, and favorable coating film formability by spin coating or the like. Residual moisture in the film is efficiently removed during film formation by the influence of fluorine atoms present in the repeating units "a" and "b" in the dopant polymer (B). The inventive conductive polymer composite and the inventive composition are capable of forming a conductive film having good transparency, flatness, and conductivity or hole injection efficiency. Moreover, in the dopant polymer (B), the repeating unit "b" containing a sulfo group is copolymerized with the non-doping fluorinated unit "a" having no sulfonated terminal; the use of this polymer as a dopant to form a composite together with the π-conjugated polymer (A) reduces extra non-doping sulfonated terminals, consequently generating few $H^+$. Thus, when the inventive conductive polymer composite and composition are employed as a constituent film of a thin film-stacked device, it is possible to suppress the influence of $H^+$ on other constituent layers. Furthermore, such conductive polymer composite and composition have good affinity to organic and inorganic substrates having high hydrophobicity, and have good film formability on any of an organic substrate and an inorganic substrate.

In addition, the conductive film formed from such conductive polymer composite or composition is excellent in conductivity, hole injection efficiency, transparency, and so forth, and can reduce moisture volatilization from the film, moisture condensation, and so forth when employed as a constituent film of a thin film-stacked device, too. Accordingly, such a conductive film can effectively function as a transparent electrode layer or a hole injection layer of the thin film-stacked device.

DESCRIPTION OF EMBODIMENTS

As described above, it has been desired to develop a material for forming a conductive film which has good filterability and favorable film formability by spin coating and the like, and is capable of efficiently removing residual moisture in the film and forming a conductive film having high transparency and good flatness in the film formation process.

The present inventors have intensively studied the problems, and consequently found that when a dopant polymer in which a non-doping fluorinated unit "a" is copolymerized with a repeating unit "b" including a repeating unit having a sulfo group fluorinated at the α-position is used in place of polystyrenesulfonic acid homopolymer (PSS) widely used as a dopant for a conductive polymer material, a conductive polymer composite and a conductive polymer composition which uses the dopant polymer have good filterability and favorable film formability by spin coating, while relieving the acidity of the material owing to the molecular structure, and can form a conductive film with high transparency, high flatness, and little residual moisture at the time of the film formation. Furthermore, the conductive polymer composite and the conductive polymer composition were mounted on an organic EL device as a constituent layer thereof, and obtained excellent results in the performance evaluations. Thereby, the present invention has been accomplished.

That is, the present invention provides a conductive polymer composite which comprises a composite comprising:

(A) a π-conjugated polymer; and (B) a dopant polymer comprising a copolymer containing a repeating unit "a" shown by the following general formula (1) and at least one repeating unit "b" selected from repeating units shown by the following general formulae (2-1) to (2-7), (1)
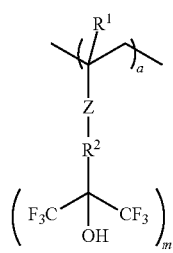

(2-1)
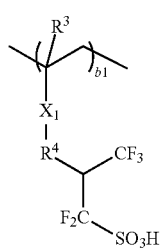

(2-2)
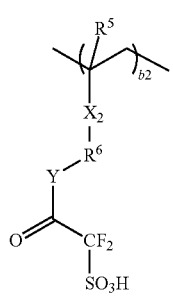

(2-3)
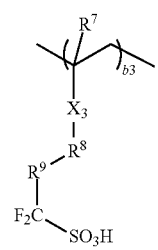

(2-4)
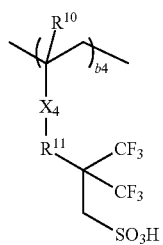

(2-5)
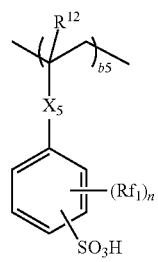

(2-6)
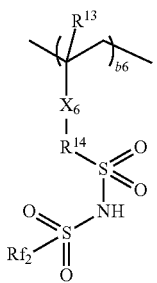

(2-7)
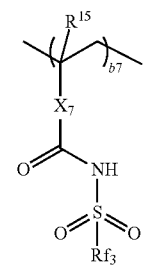

wherein $R^1$ represents a hydrogen atom or a methyl group; Z represents any of a phenylene group, a naphthylene group, and an ester group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, $R^2$ represents a linear, branched, or cyclic hydrocarbon group having 1 to 12 carbon atoms optionally having one or both of a single bond and an ether group; "m" represents any one of 1 to 3; $R^3$, $R^5$, $R^7$, $R^{10}$, $R^{12}$, $R^{13}$, and $R^{15}$ each independently represent a hydrogen atom or a methyl group; $R^4$, $R^6$, $R^8$, $R^{11}$, and $R^{14}$ each independently represent any of a single bond and a linear, branched, or cyclic hydrocarbon group having 1 to 12 carbon atoms optionally having one or both of an ether group and an ester group; $R^9$ represents a linear or branched alkylene group having 1 to 4 carbon atoms, and one or two hydrogen atoms in $R^9$ are optionally substituted with a fluorine atom; $X_1$, $X_2$, $X_3$, $X_4$, $X_6$, and $X_7$ each independently represent any of a single bond, a phenylene group, a naphthylene group, an ether group, an ester group, and an amide group; $X_5$ represents any of a single bond, an ether group, and an ester group; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a hetero atom; $Rf_1$ represents a fluorine atom or a trifluoromethyl group; $Rf_2$ and $Rf_3$ each represent a linear or branched alkyl group having 1 to 4 carbon atoms with one or more fluorine atoms, or a phenyl group substituted with a fluorine atom or a trifluoromethyl group; "n" represents an integer of 1 to 4; and "a", b1, b2, b3, b4, b5, b6, and b7 satisfy $0<a<1.0$, $0≤b1<1.0$, $0≤b2<1.0$, $0≤b3<1.0$, $0≤b4<1.0$, $0≤b5<1.0$, $0≤b6<1.0$, $0≤b7<1.0$, and $0<b1+b2+b3+b4+b5+b6+b7<1.0$.

Moreover, the present invention provides a conductive polymer composition comprising:

the above-described conductive polymer composite;

water or an organic solvent as a solvent; and a compound (C) shown by the following general formula (3),

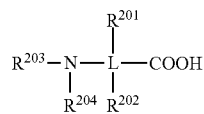
(3)

wherein $R^{201}$ and $R^{202}$ each independently represent any of a hydrogen atom, a hetero atom, and a linear, branched, or cyclic monovalent hydrocarbon group having 1 to 20 carbon atoms optionally having a hetero atom; $R^{203}$ and $R^{204}$ each independently represent any of a hydrogen atom and a linear, branched, or cyclic monovalent hydrocarbon group having 1 to 20 carbon atoms optionally having a hetero atom; $R^{201}$ and $R^{203}$, or $R^{201}$ and $R^{204}$, are optionally bonded to each other to form a ring; L represents a linear, branched, or cyclic tetravalent organic group having 1 to 20 carbon atoms optionally having a hetero atom; and when L has a hetero atom, the hetero atom is optionally an ion.

Further, the present invention provides a substrate on which an electrode layer or a hole injection layer in an organic EL device is formed from the above-described conductive polymer composite or conductive polymer composition.

Hereinafter, the present invention will be described in detail, but the present invention is not limited thereto.

[(A) π-Conjugated Polymer]

The inventive conductive polymer composite contains (A) a π-conjugated polymer. The π-conjugated polymer (A) may be a material in which a precursor monomer (an organic monomer molecule) forming a π-conjugated chain (a structure in which a single bond and a double bond are alternately continued) is polymerized.

Examples of such a precursor monomer include monocyclic aromatics such as pyrroles, thiophenes, thiophene vinylenes, selenophenes, tellurophenes, phenylenes, phenylene vinylenes, and anilines; polycyclic aromatics such as acenes; acetylenes; and the like. A homopolymer or a copolymer of these monomers can be used as the π-conjugated polymer (A).

Among the monomers, from the viewpoints of easiness in polymerization and stability in air, pyrrole, thiophene, selenophene, tellurophene, aniline, polycyclic aromatic compounds, and derivatives thereof are preferable, and pyrrole, thiophene, aniline, and derivatives thereof are particularly preferable.

In addition, the π-conjugated polymer (A) can give sufficient conductivity even when the monomer constituting the π-conjugated polymer (A) is not substituted, but for higher conductivity, a monomer substituted by an alkyl group, a carboxyl group, a sulfo group, an alkoxy group, a hydroxyl group, a cyano group, a halogen atom, or the like may be used.

Specific examples of the monomers of pyrroles, thiophenes, and anilines include pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole; thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene; aniline, 2-methylaniline, 3-isobutylaniline, 2-methoxyaniline, 2-ethoxyaniline, 2-anilinesulfonic acid, 3-anilinesulfonic acid; and the like.

Particularly, a (co)polymer containing one or more selected from pyrrole, thiophene, N-methylpyrrole, 3-methylthiophene, 3-methoxythiophene, and 3,4-ethylenedioxythiophene is suitably used from the viewpoints of a resistance value and reactivity. Moreover, a homopolymer of pyrrole or 3,4-ethylenedioxythiophene is more preferable because the conductivity is high.

[(B) Dopant Polymer]

The inventive conductive polymer composite contains a dopant polymer (B). The dopant polymer (B) is a strongly acidic polyanion which is a copolymer containing a repeating unit "a" shown by the following general formula (1) and at least one repeating unit "b" selected from repeating units shown by the following general formulae (2-1) to (2-7).

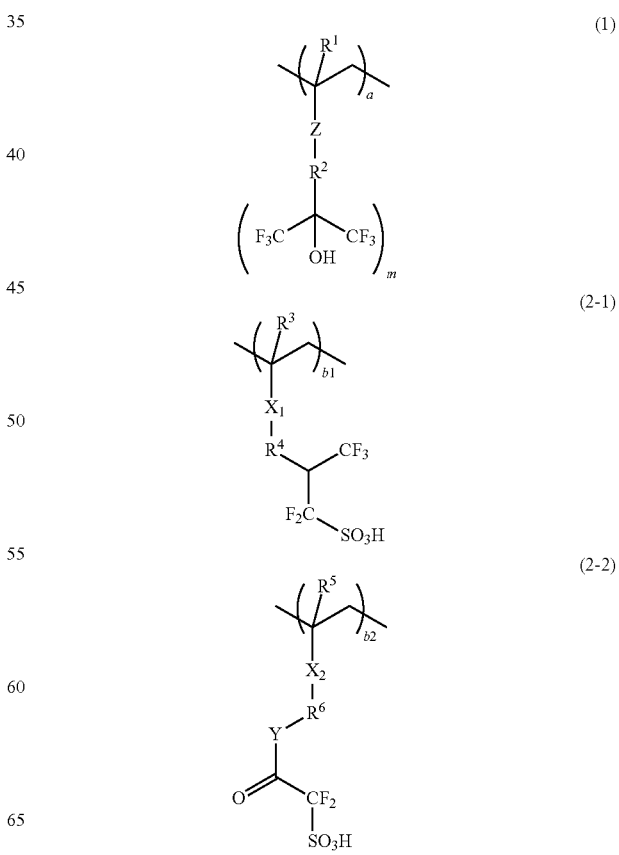

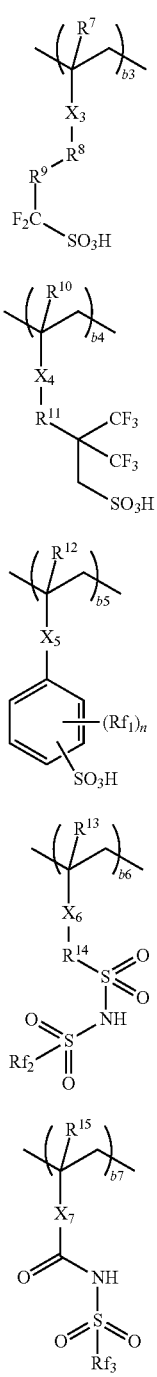

(2-3)

(2-4)

(2-5)

(2-6)

(2-7)

In the formulae, $R^1$ represents a hydrogen atom or a methyl group. Z represents any of a phenylene group, a naphthylene group, and an ester group. When Z is a phenylene group or a naphthylene group, $R^2$ represents any of a single bond and a linear, branched, or cyclic hydrocarbon group having 1 to 12 carbon atoms optionally having one or both of an ester group and an ether group. When Z is an ester group, $R^2$ represents a linear, branched, or cyclic hydrocarbon group having 1 to 12 carbon atoms optionally having one or both of a single bond and an ether group. "m" represents any one of 1 to 3. $R^3$, $R^5$, $R^7$, $R^{10}$, $R^{12}$, $R^{13}$, and $R^{15}$ each independently represent a hydrogen atom or a methyl group. $R^4$, $R^6$, $R^8$, $R^{11}$, and $R^{14}$ each independently represent any of a single bond and a linear, branched, or cyclic hydrocarbon group having 1 to 12 carbon atoms optionally having one or both of an ether group and an ester group. $R^9$ represents a linear or branched alkylene group having 1 to 4 carbon atoms, and one or two hydrogen atoms in $R^9$ are optionally substituted with a fluorine atom. $X_1$, $X_2$, $X_3$, $X_4$, $X_6$, and $X_7$ each independently represent any of a single bond, a phenylene group, a naphthylene group, an ether group, an ester group, and an amide group. $X_5$ represents any of a single bond, an ether group, and an ester group. Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a hetero atom. $Rf_1$ represents a fluorine atom or a trifluoromethyl group. $Rf_2$ and $Rf_3$ each represent a linear or branched alkyl group having 1 to 4 carbon atoms with one or more fluorine atoms, or a phenyl group substituted with a fluorine atom or a trifluoromethyl group. "n" represents an integer of 1 to 4. "a", b1, b2, b3, b4, b5, b6, and b7 satisfy $0<a<1.0$, $0 \leq b1<1.0$, $0 \leq b2<1.0$, $0 \leq b3<1.0$, $0 \leq b4<1.0$, $0 \leq b5<1.0$, $0 \leq b6<1.0$, $0 \leq b7<1.0$, and $0<b1+b2+b3+b4+b5+b6+b7<1.0$.

A monomer for providing the repeating unit "a" can be specifically exemplified by the following.

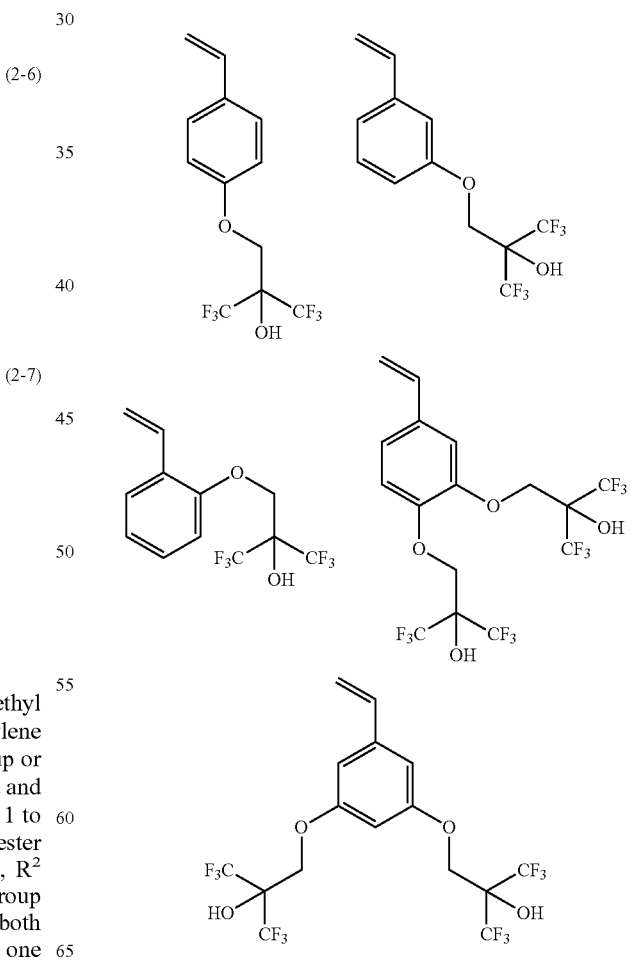

-continued
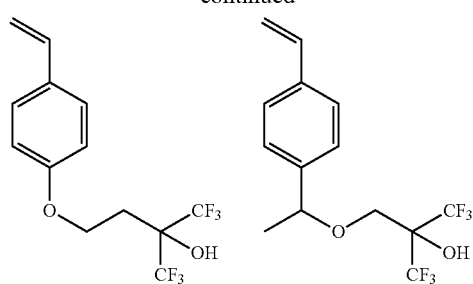
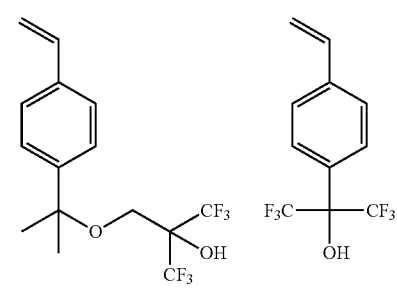
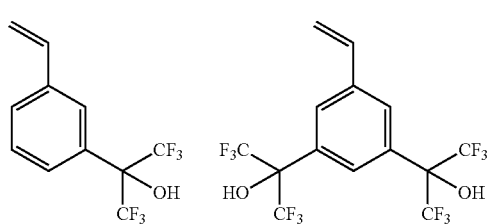
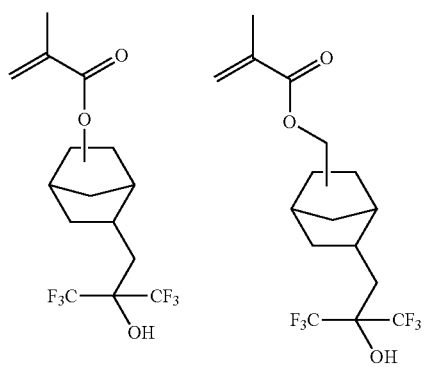
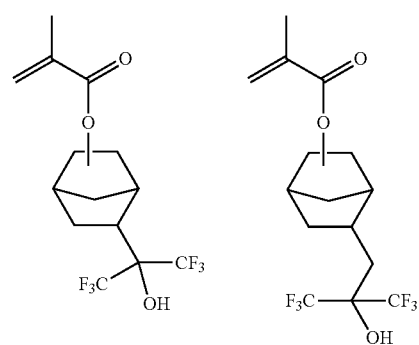
-continued
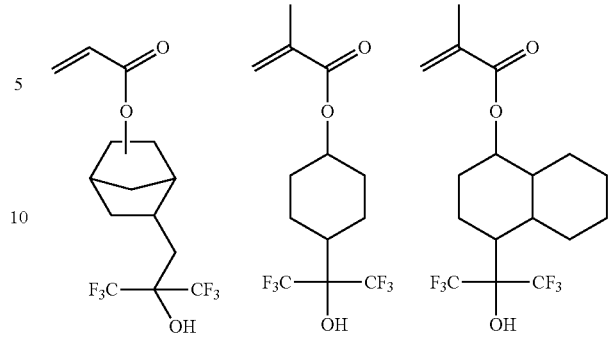
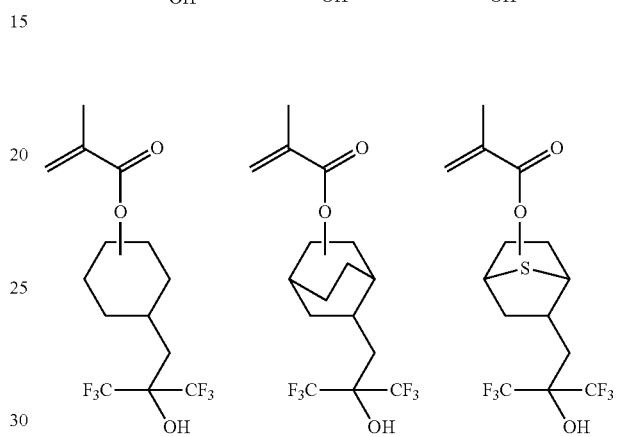
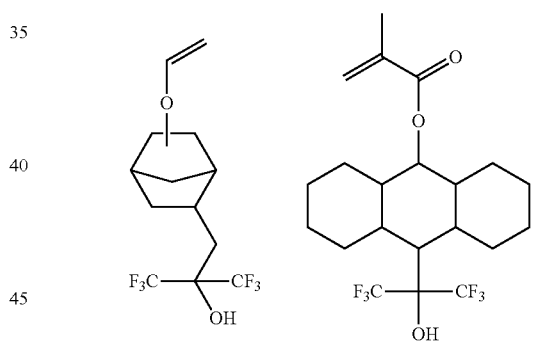
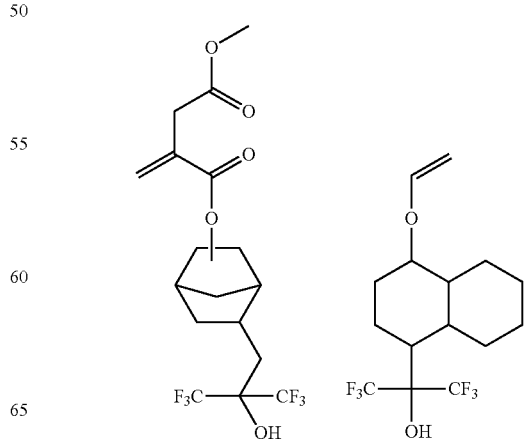

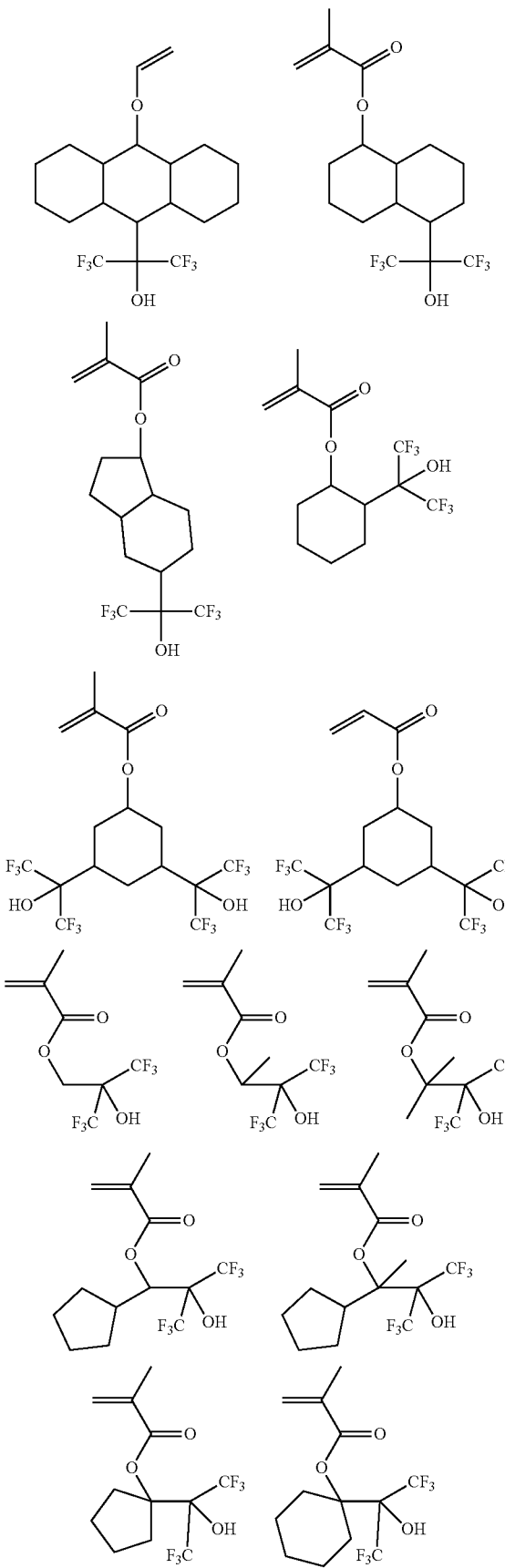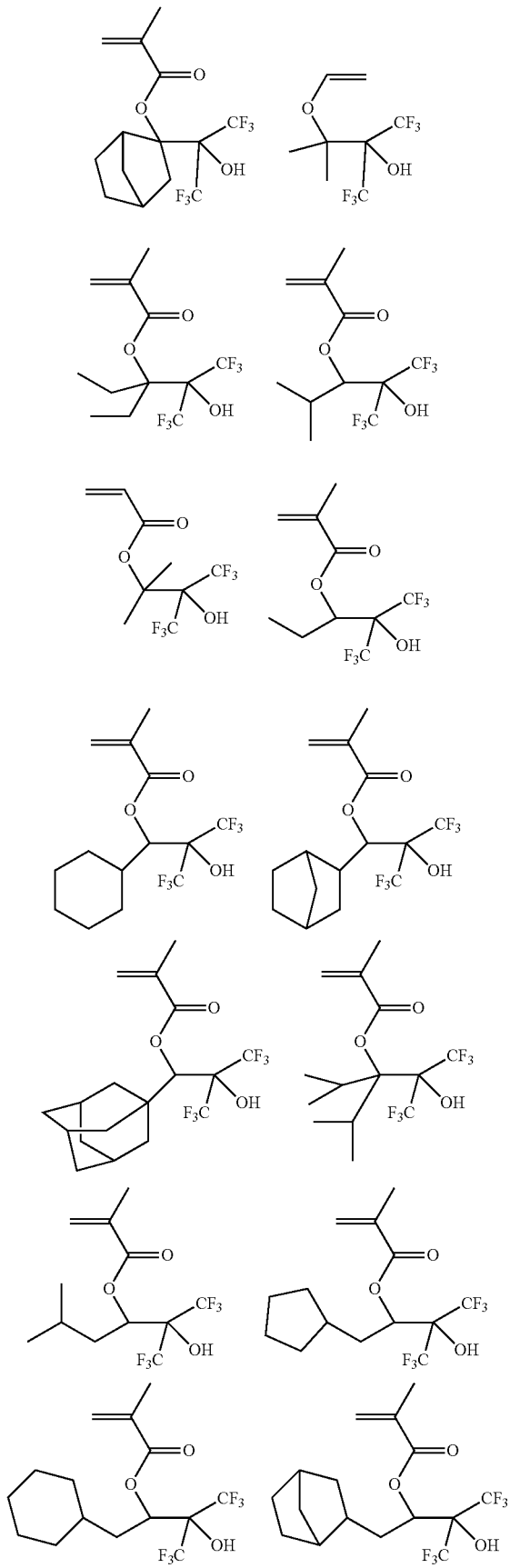

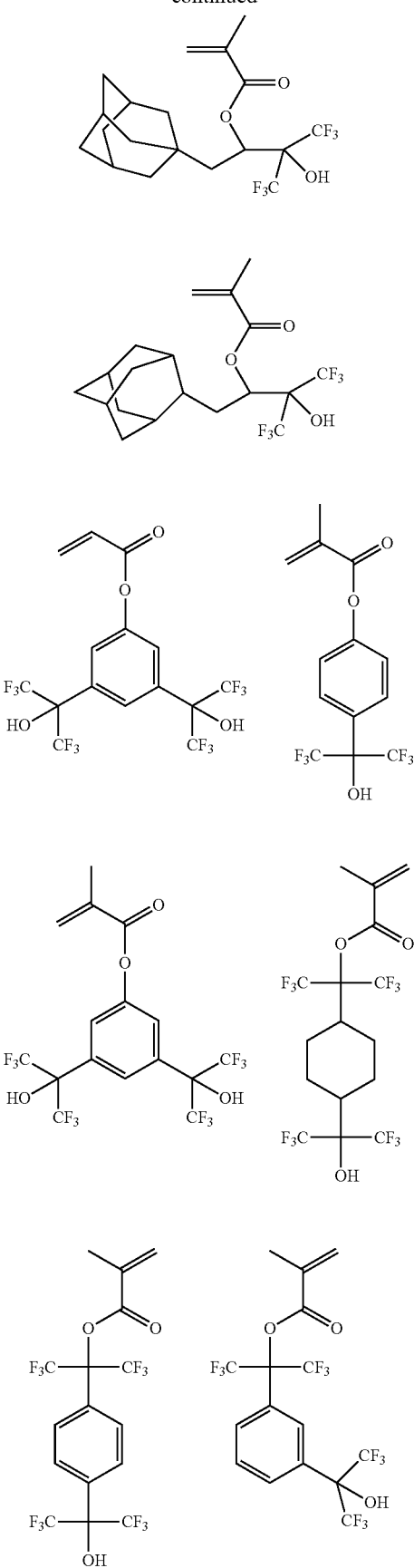

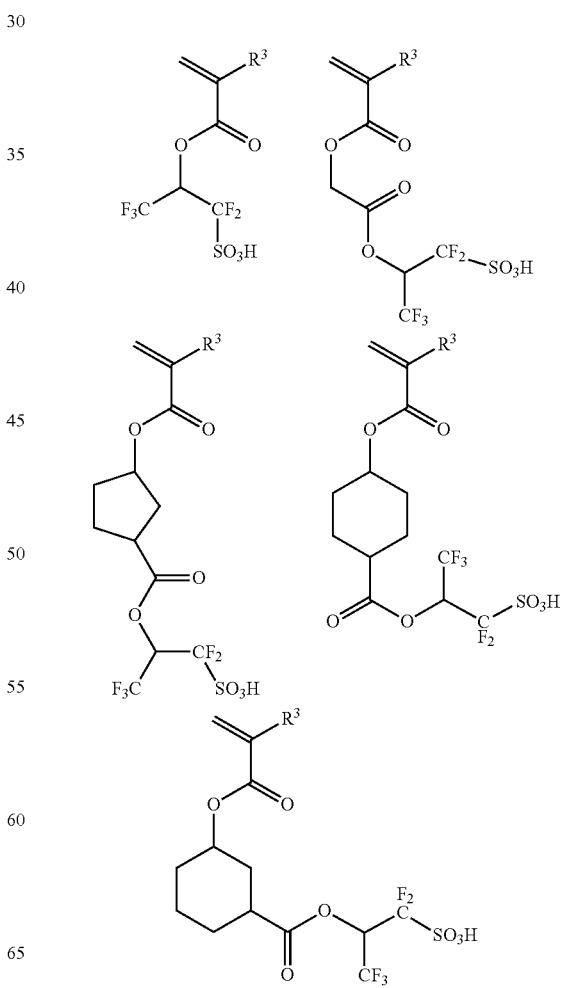

The repeating unit "a" in the dopant polymer (B) preferably has a copolymerization ratio of 10% to 60% relative to all the repeating units. From the viewpoint of the stability of the conductive polymer composite, the repeating unit "a" further preferably has a copolymerization ratio of 10 to 40% relative to all the repeating units. When the repeating unit "a" has a copolymerization ratio within this range relative to all the repeating units, the conductive polymer composite employed as an electrode is likely to sufficiently function and exhibit conductivity; additionally, the conductive polymer composite employed as a hole injection layer is likely to sufficiently function and exhibit hole injection efficiency.

A monomer for providing the repeating unit b1 can be specifically exemplified by the following.

-continued
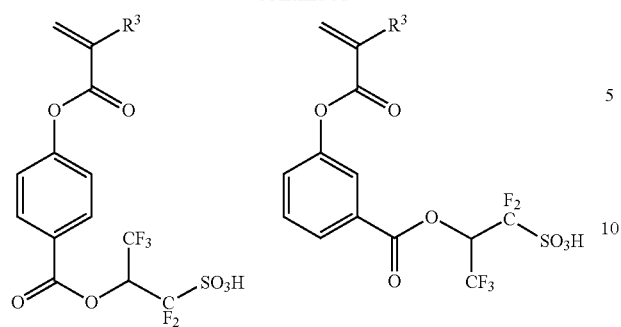
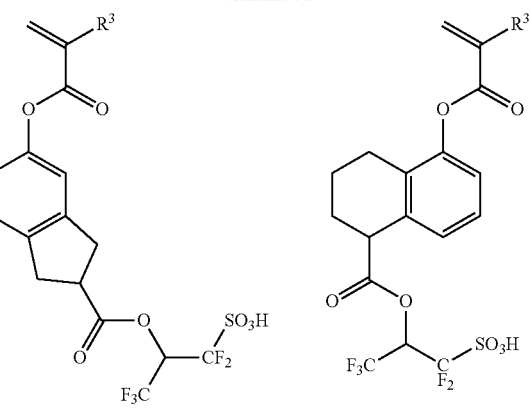
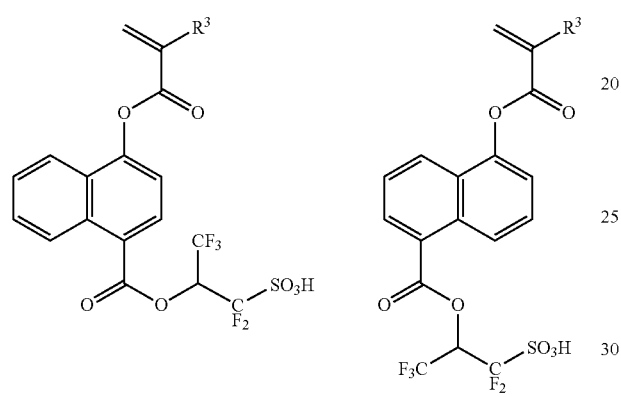
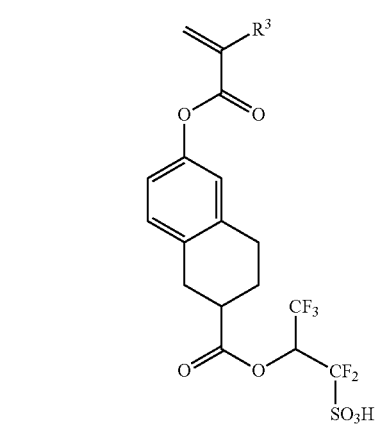
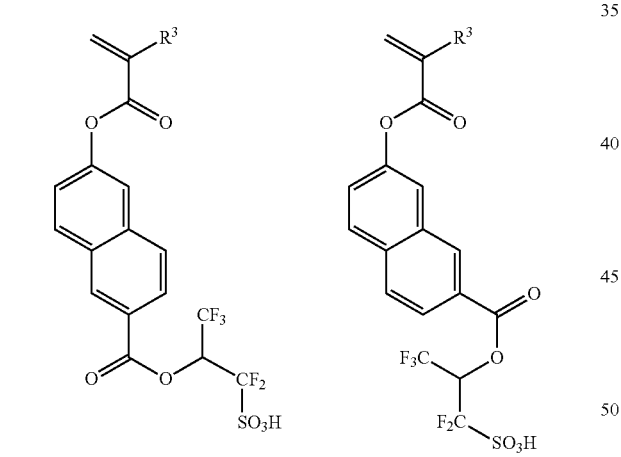
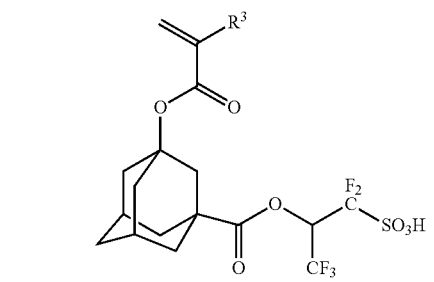
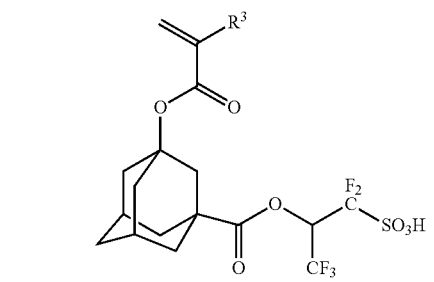
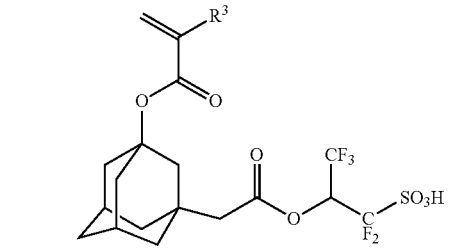
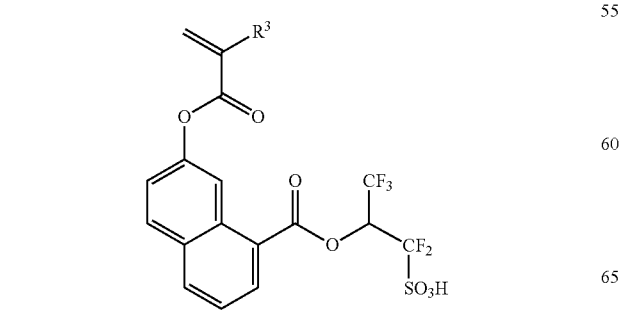
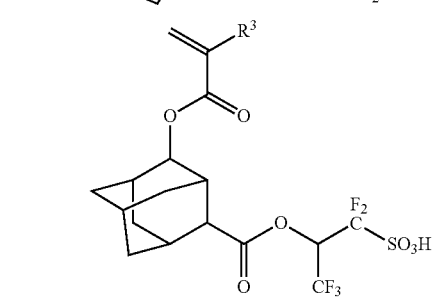

-continued
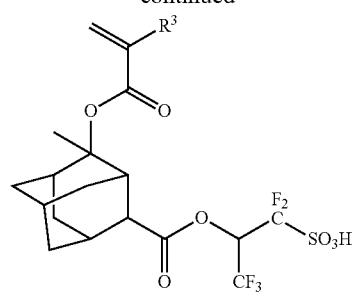
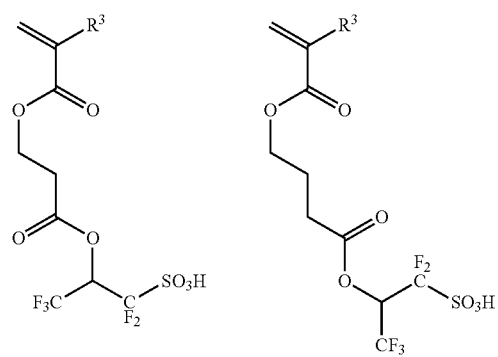
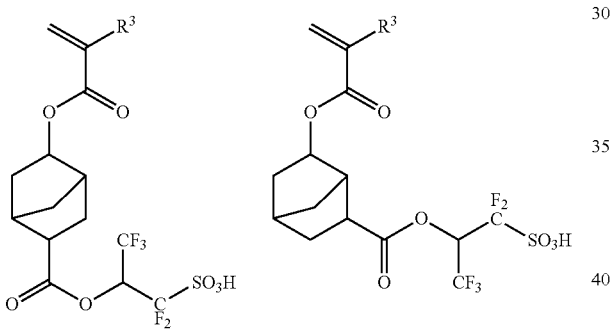
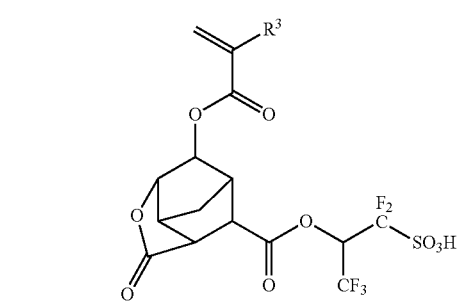
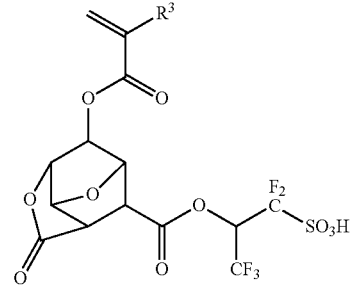
-continued
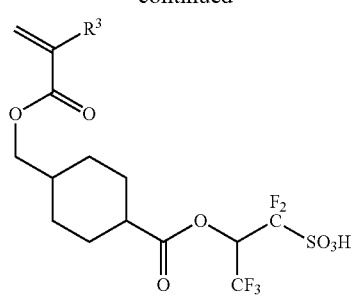
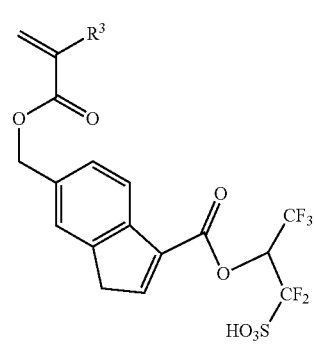
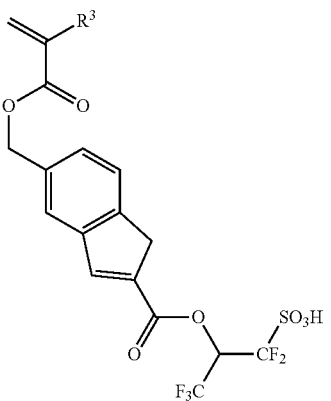
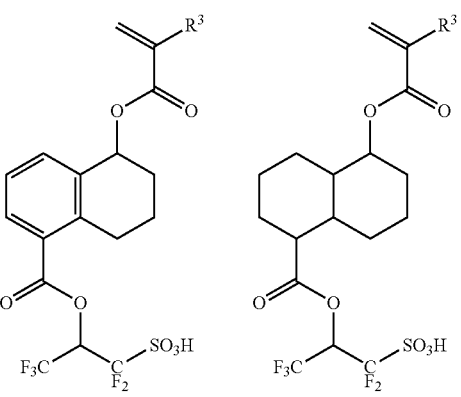

-continued
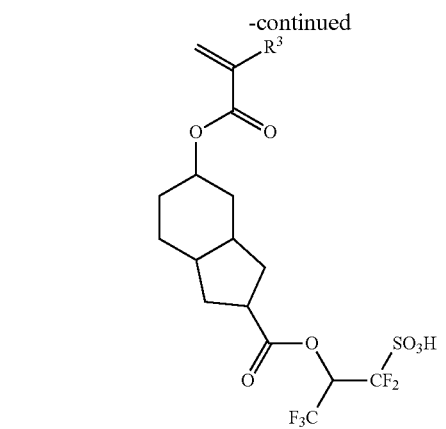
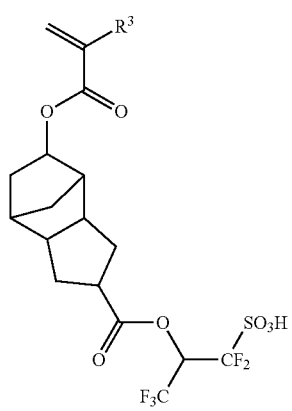
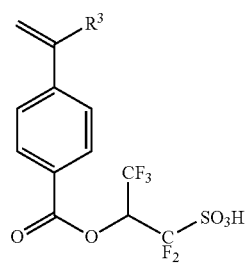 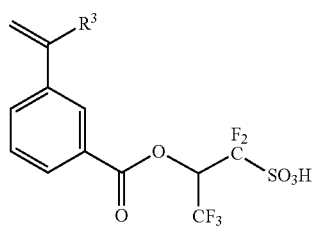
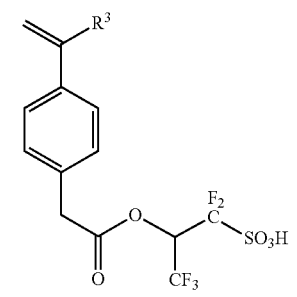
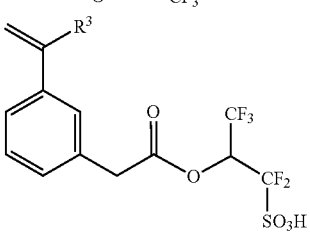
-continued
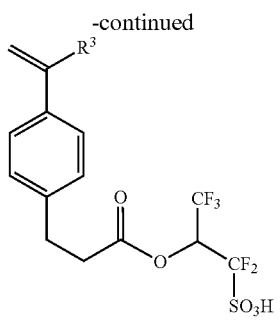
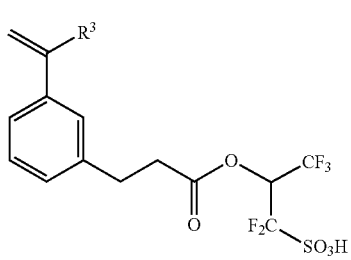
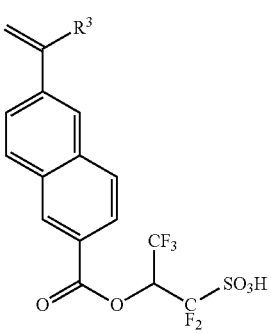
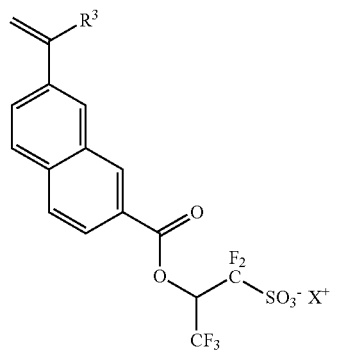
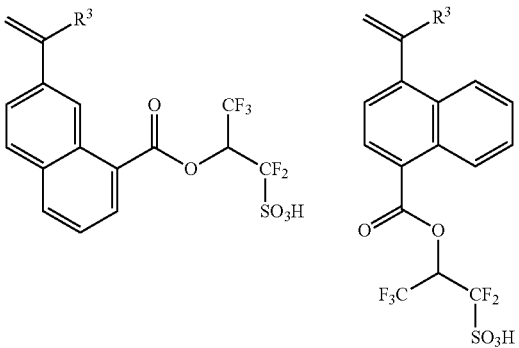

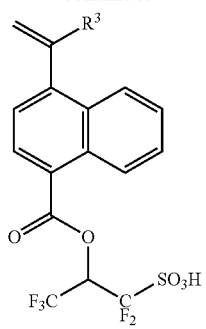
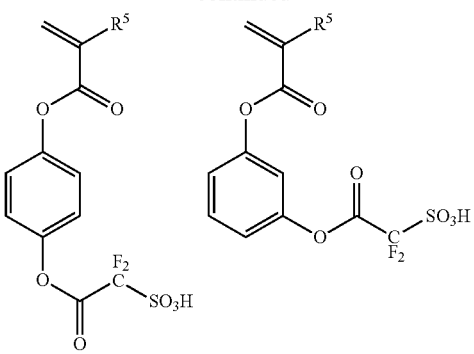
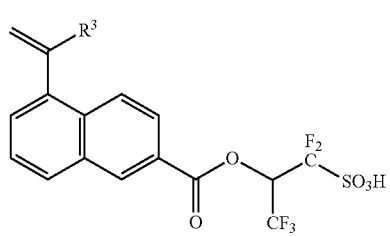
In each formula, R³ is as defined above.
A monomer for obtaining the repeating unit b2 can be specifically exemplified as follows.
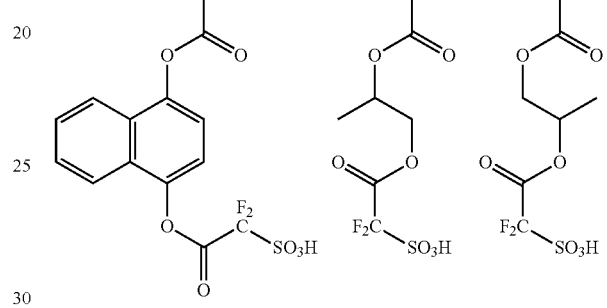
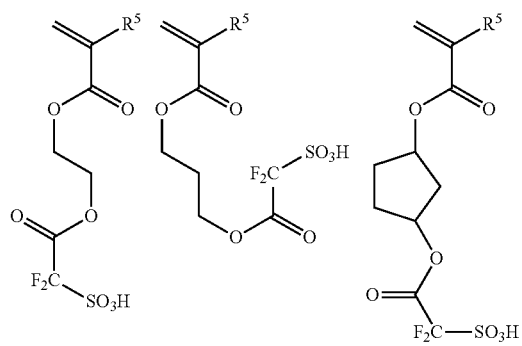
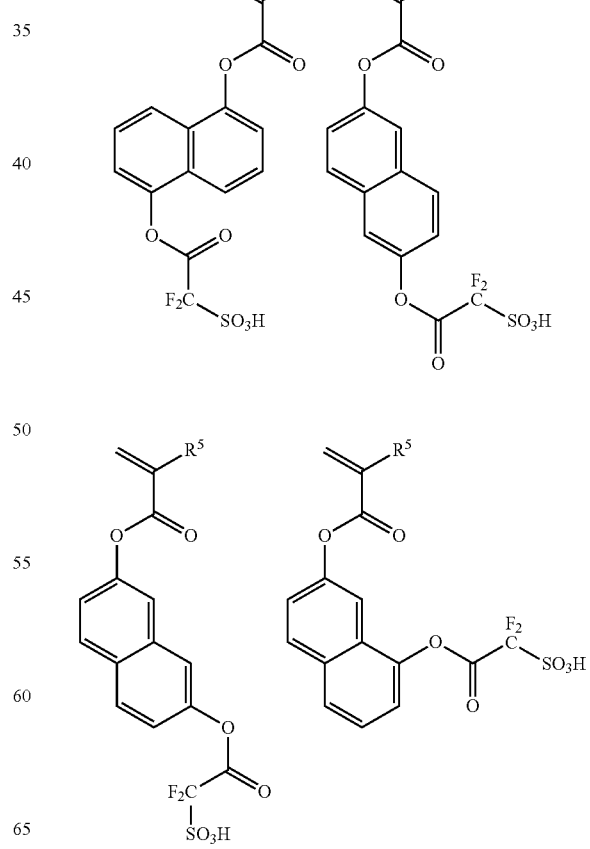
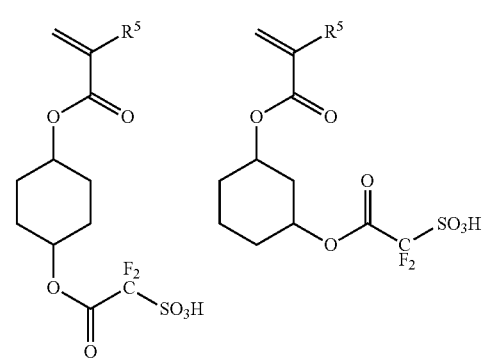

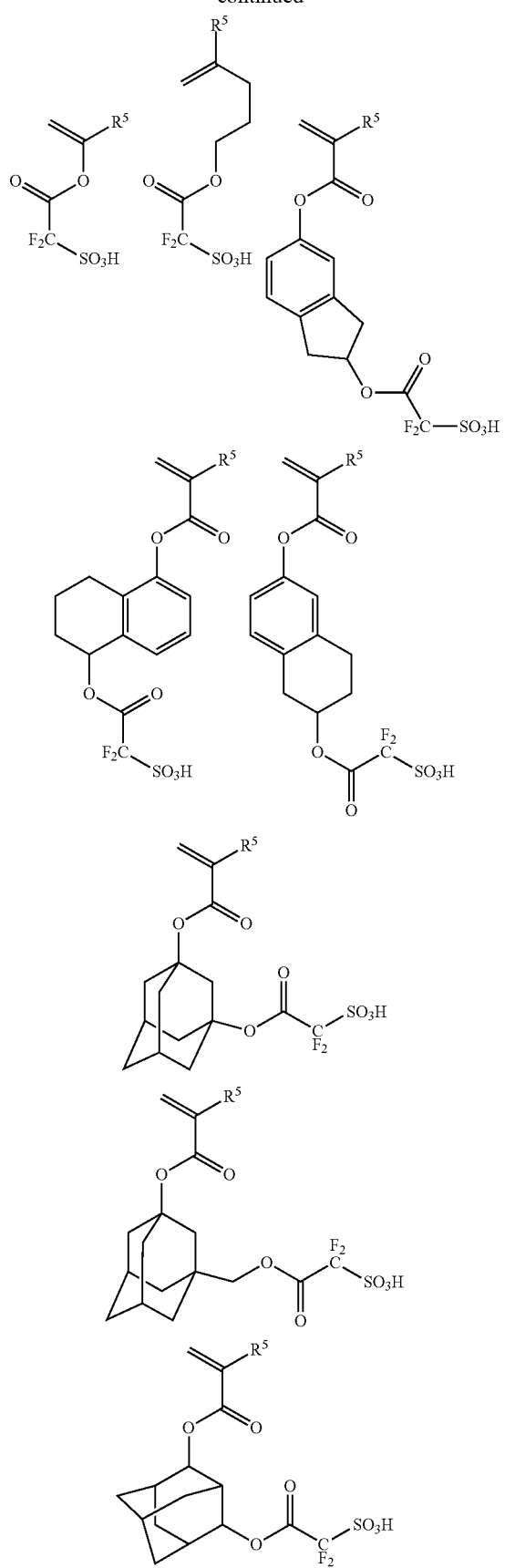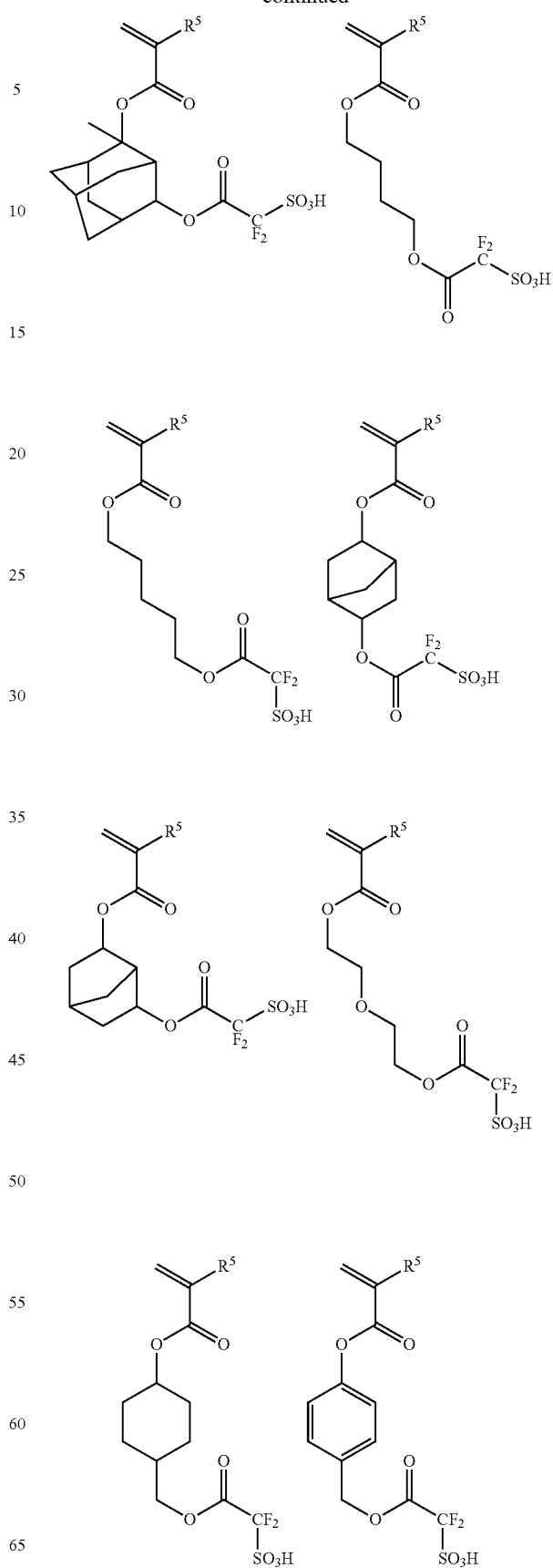

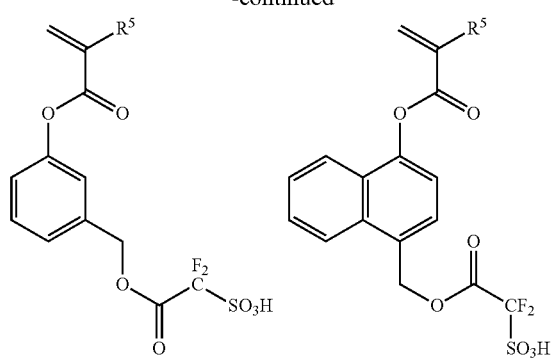
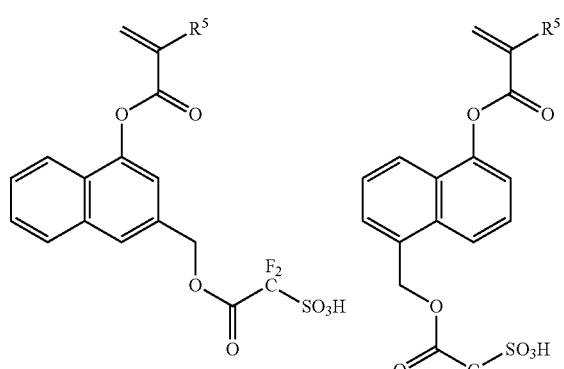
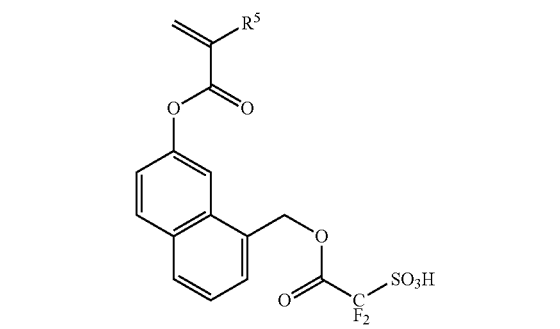
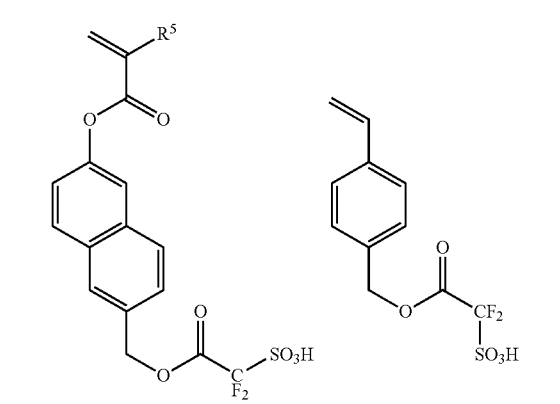
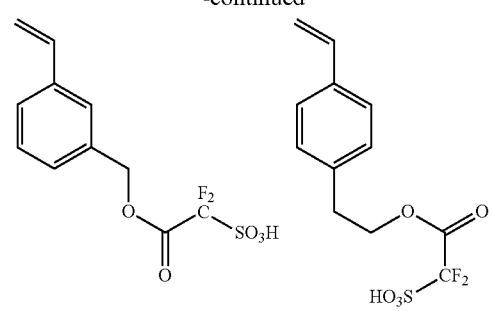
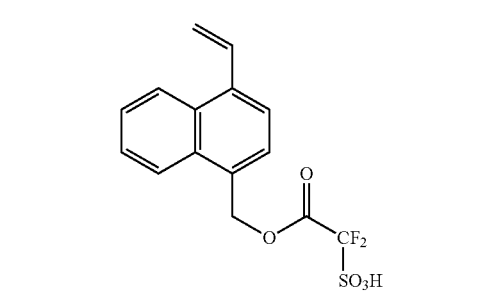
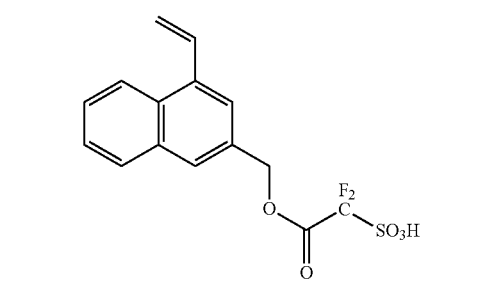

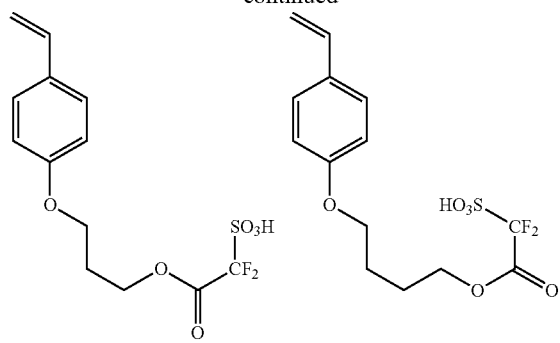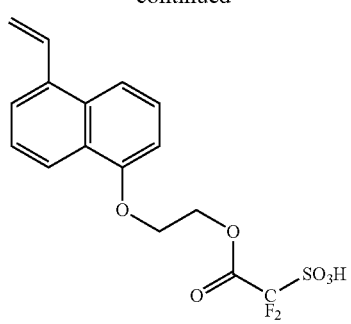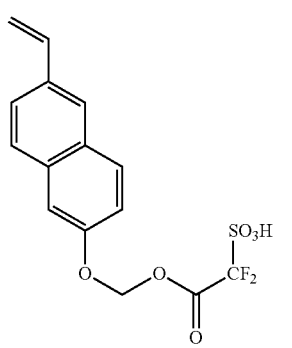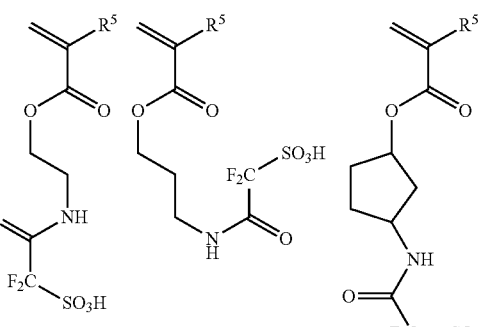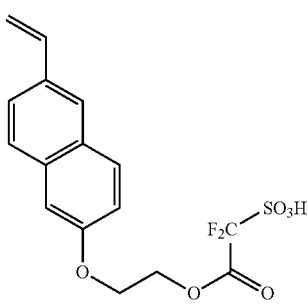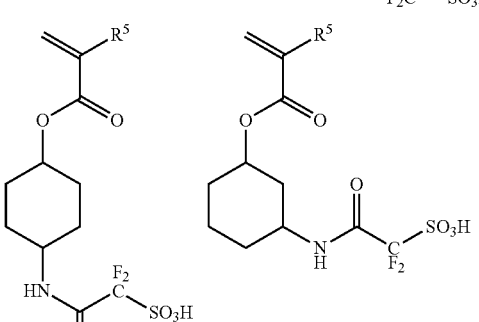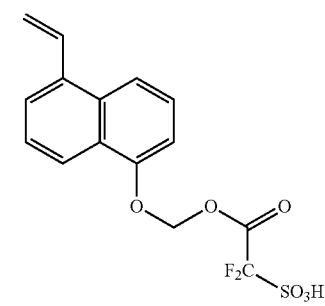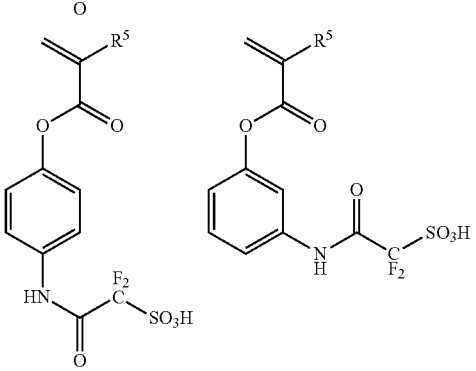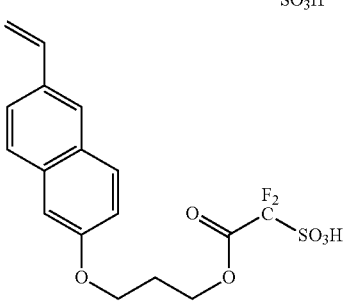

-continued
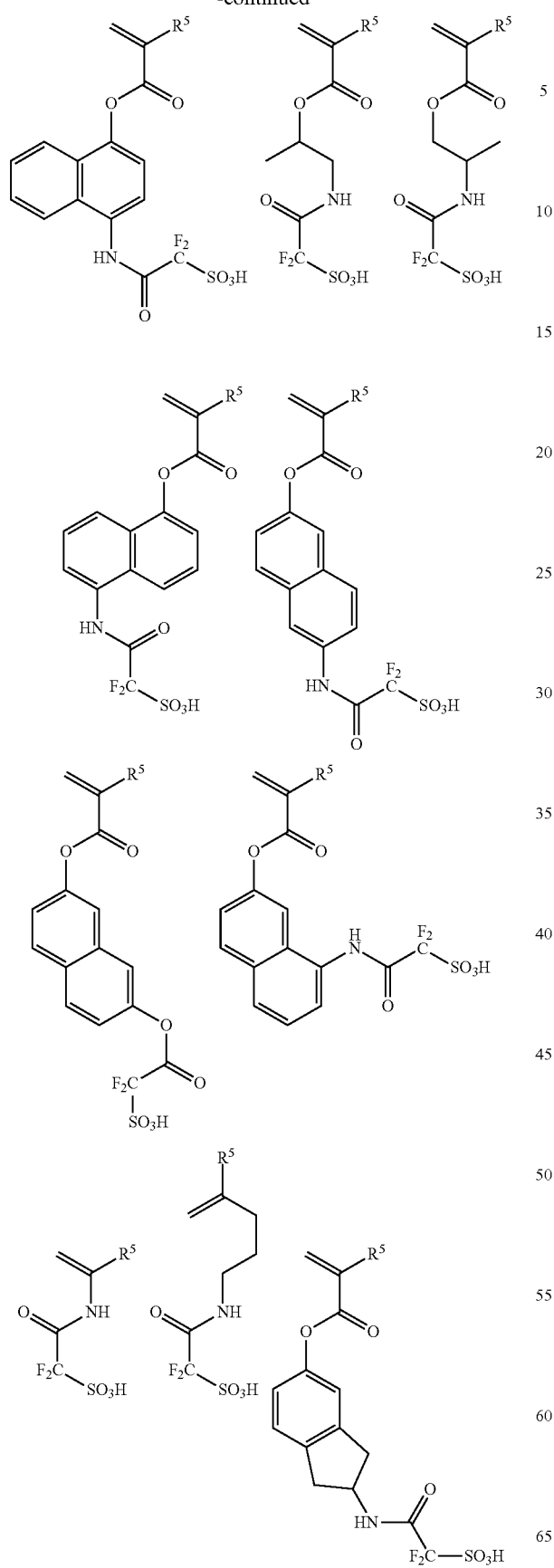
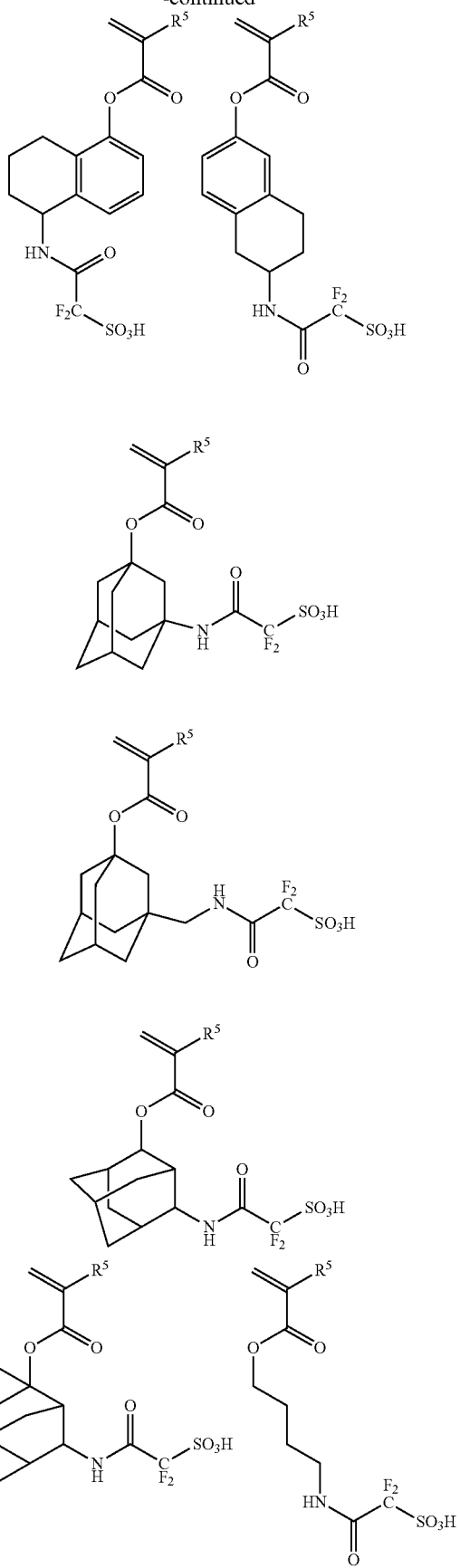

-continued
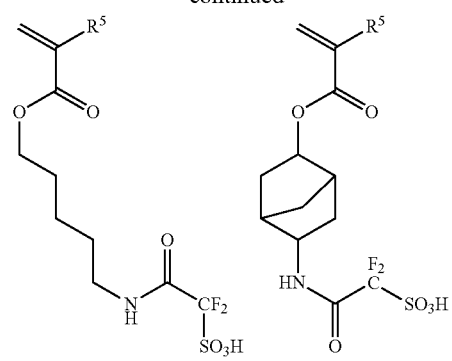
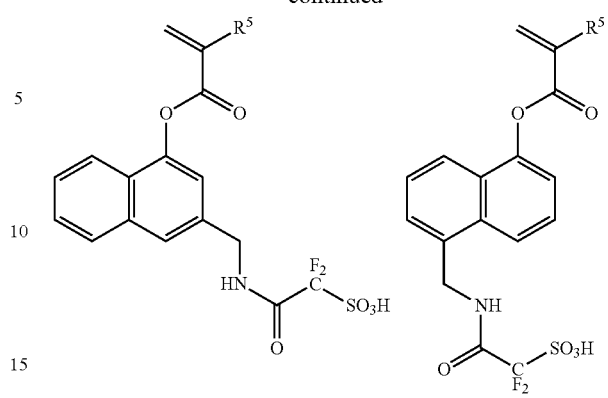
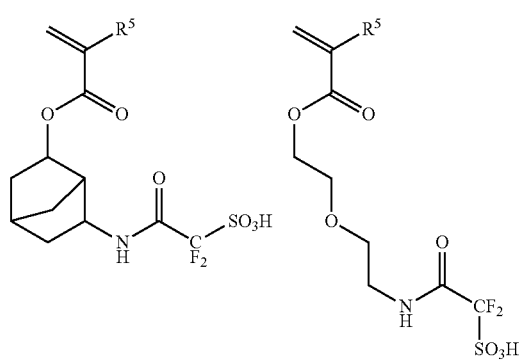
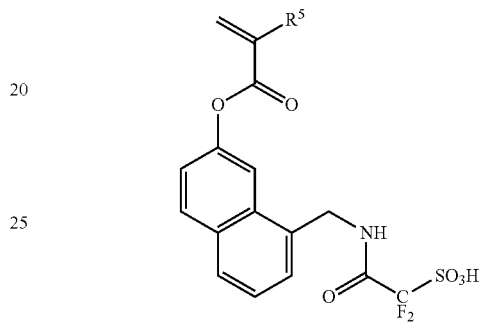
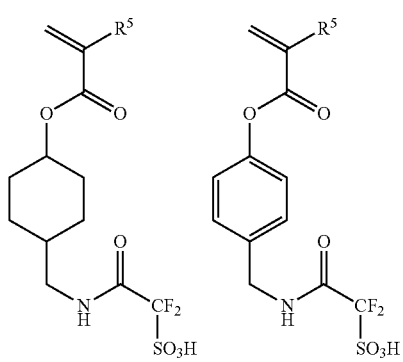
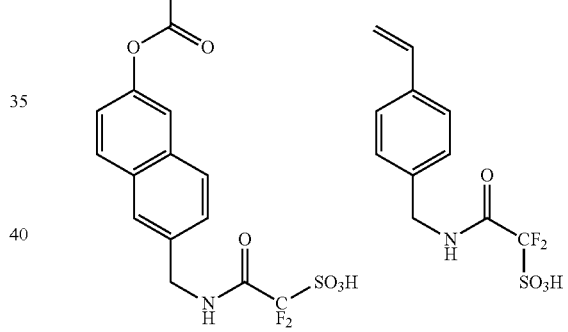
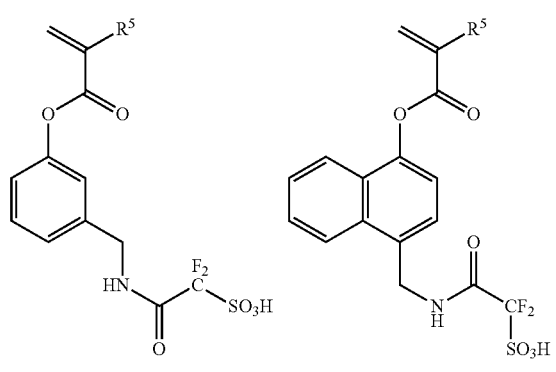
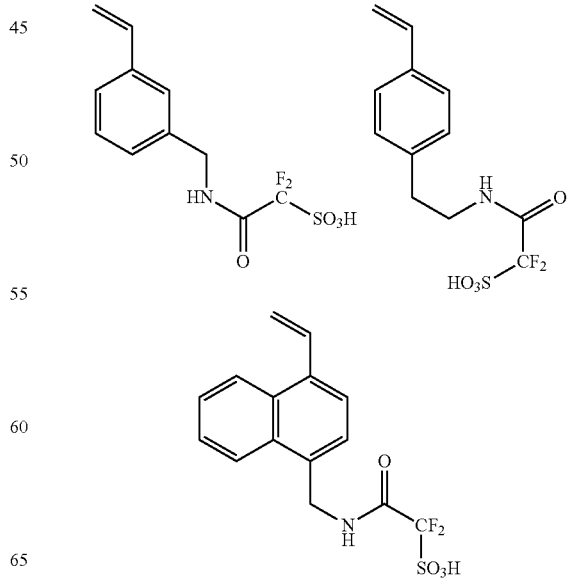

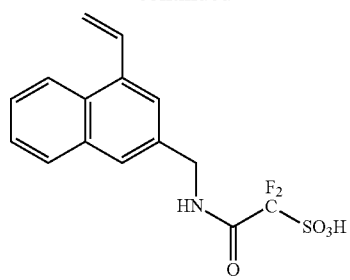
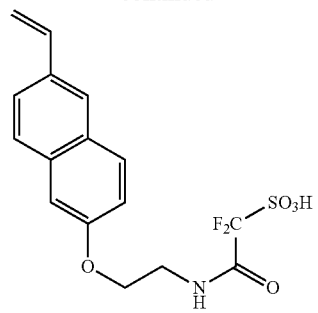
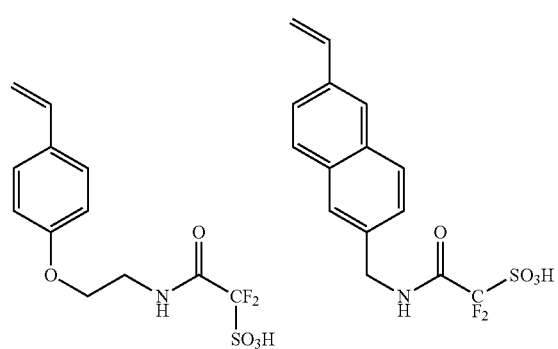
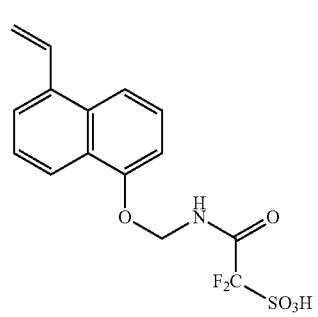
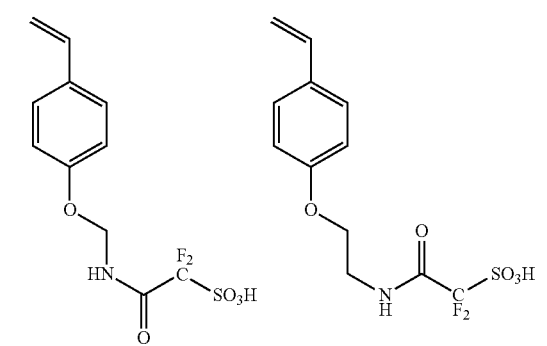
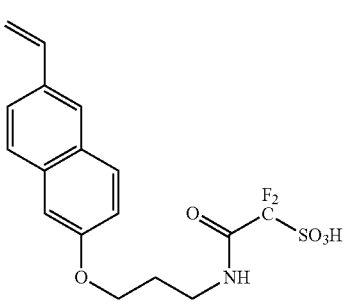
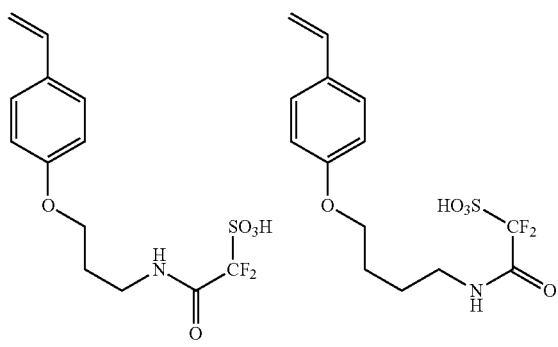
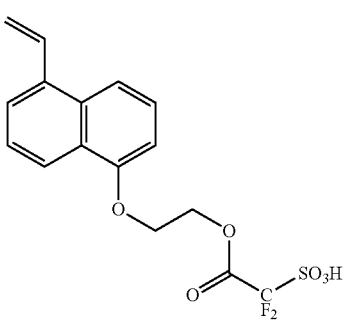
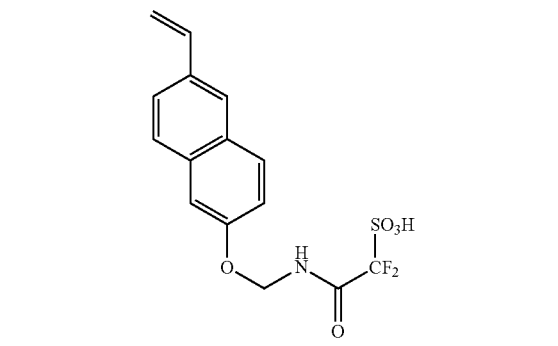
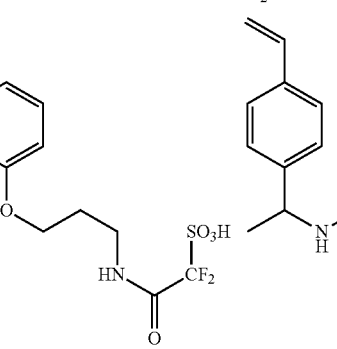

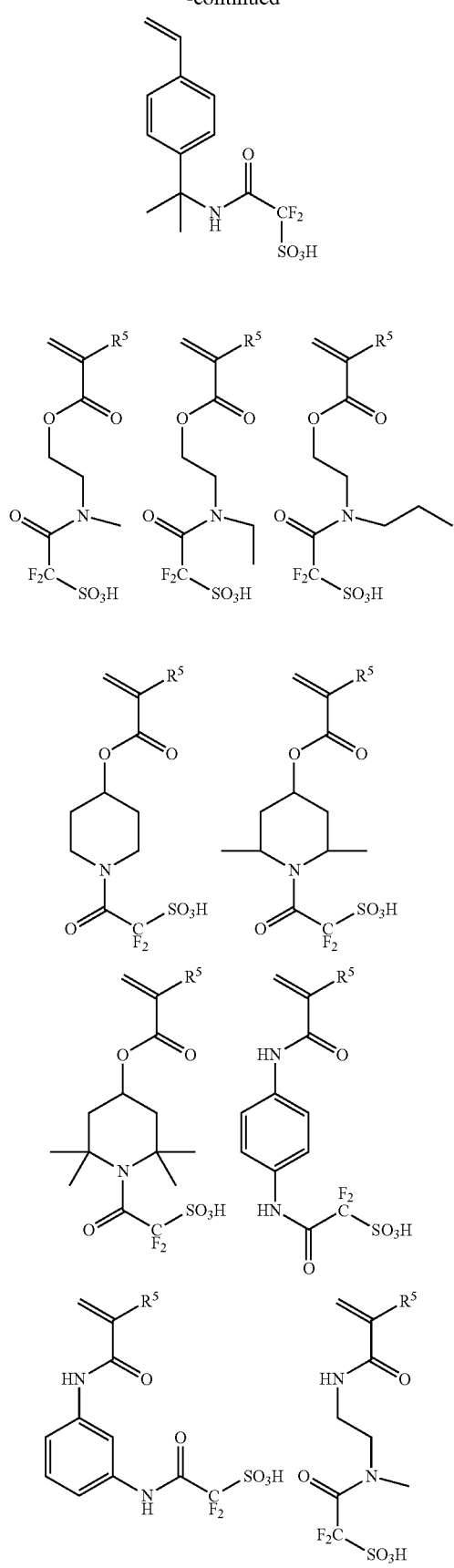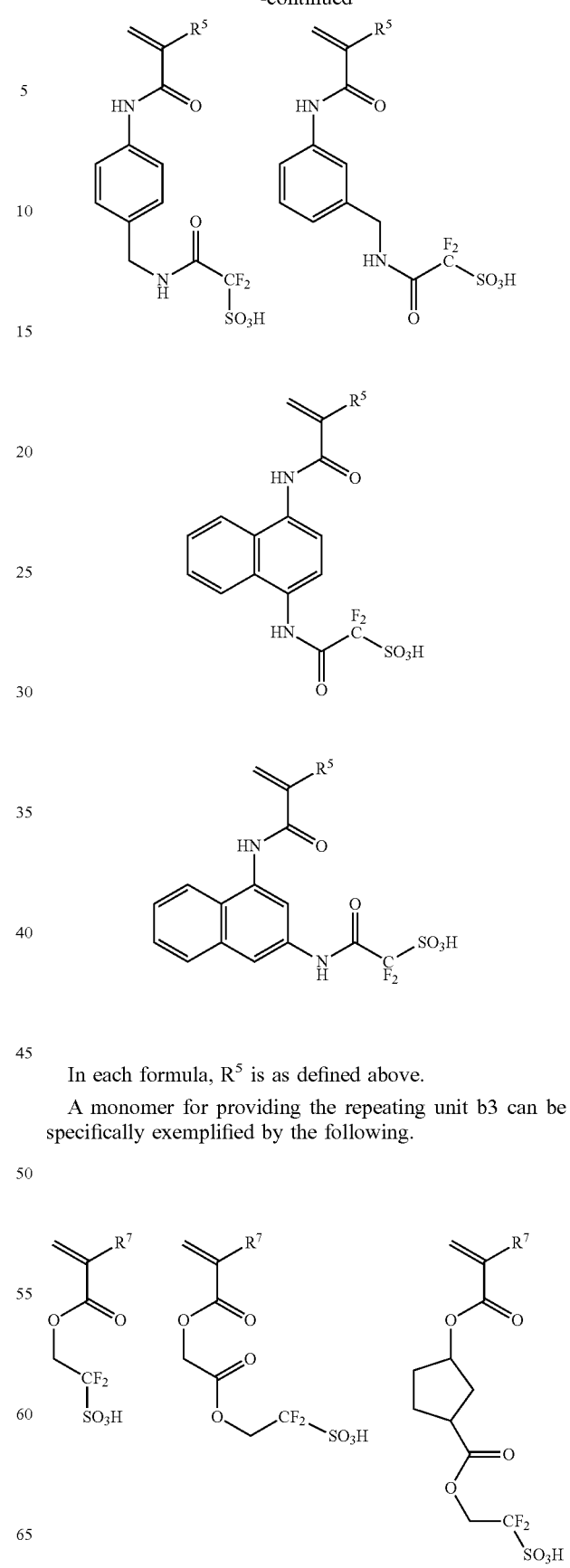
In each formula, $R^5$ is as defined above.
A monomer for providing the repeating unit b3 can be specifically exemplified by the following.

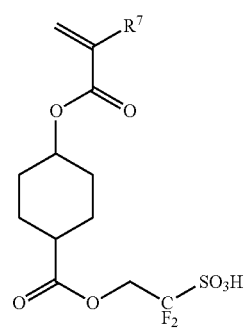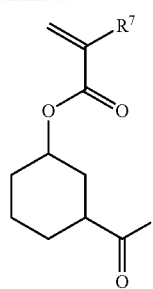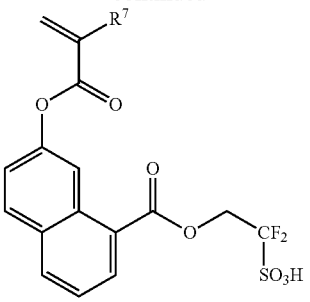
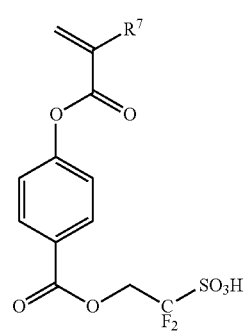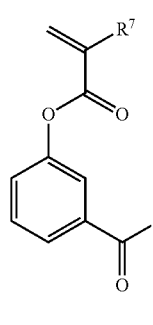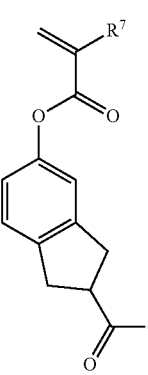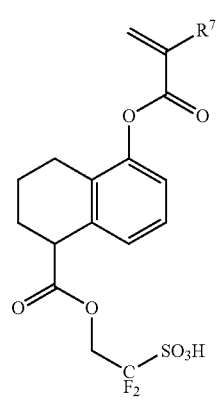
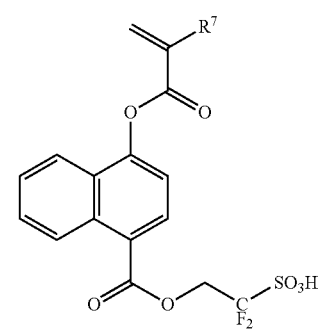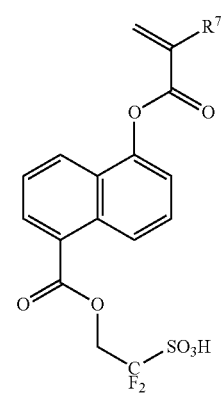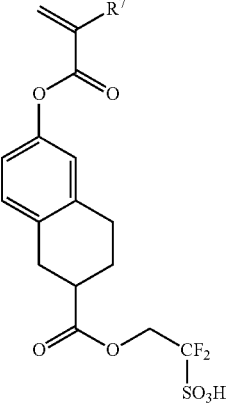
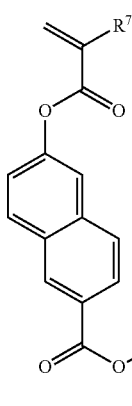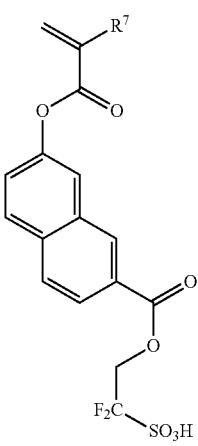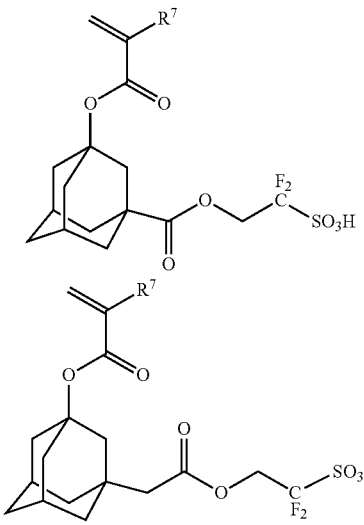

-continued
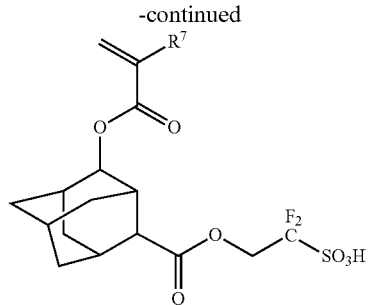
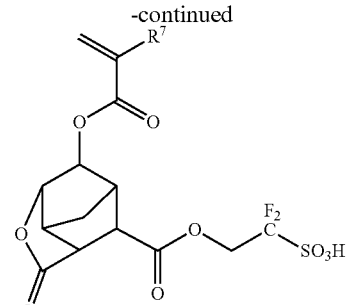
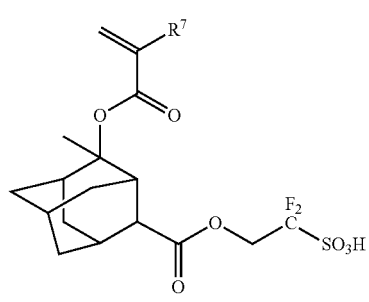
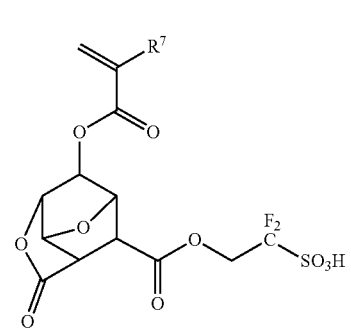
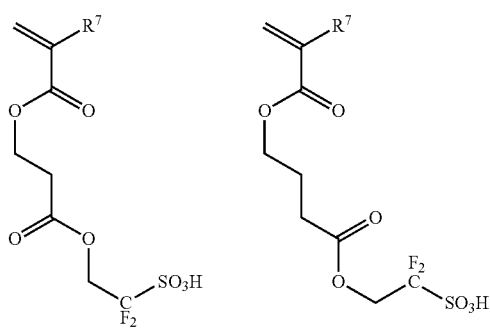
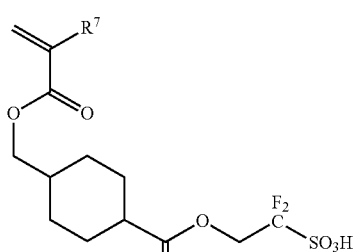
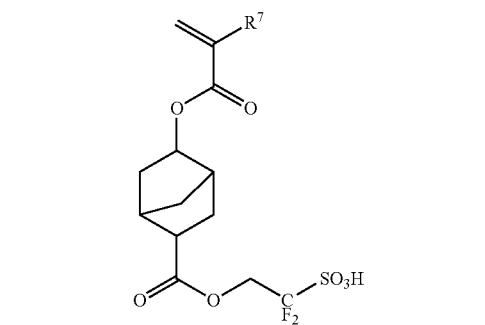
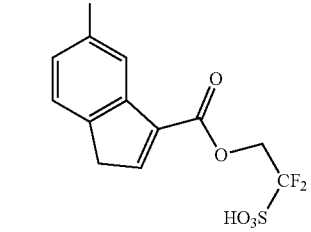
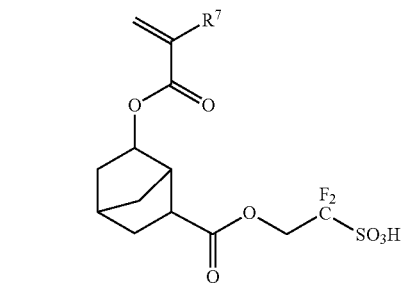
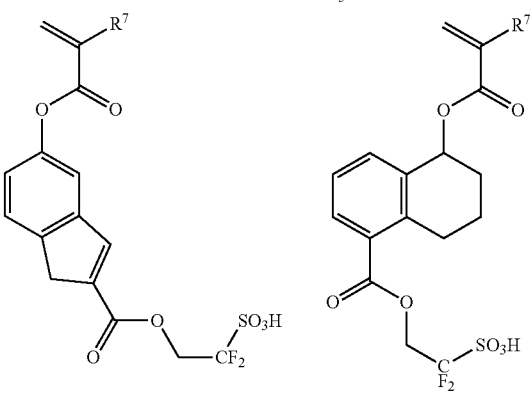

-continued
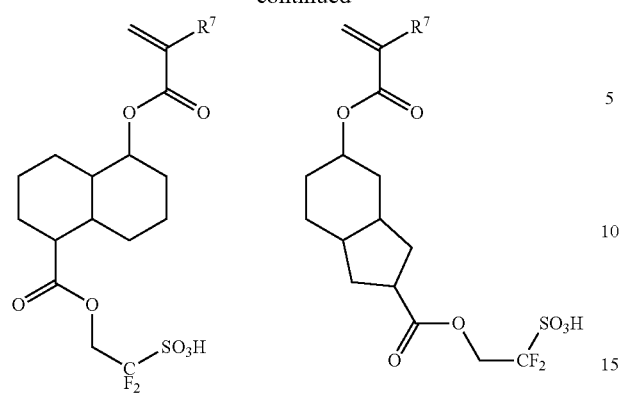
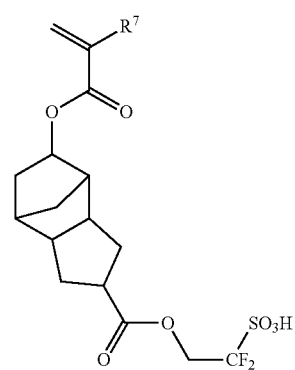
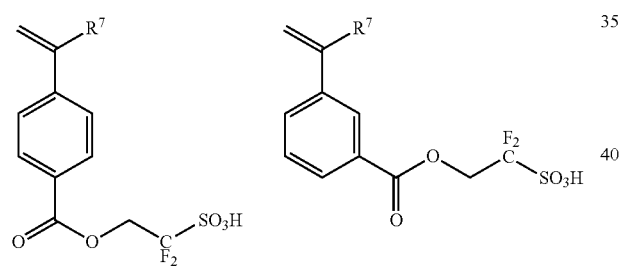
-continued
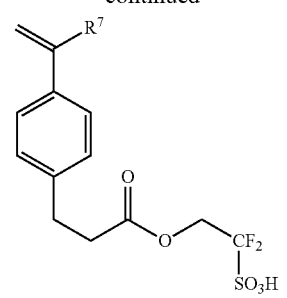
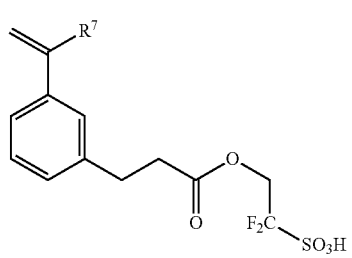
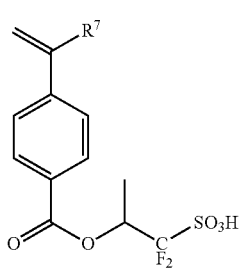
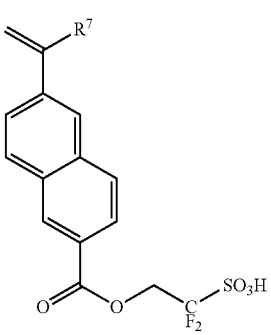
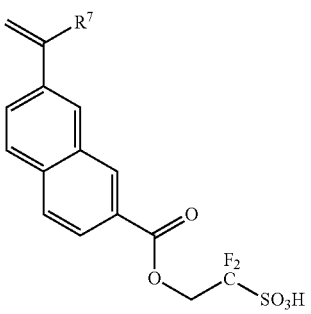
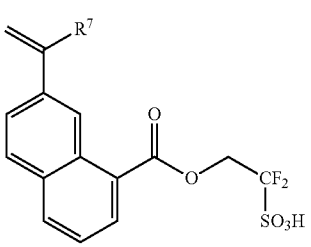

51
-continued
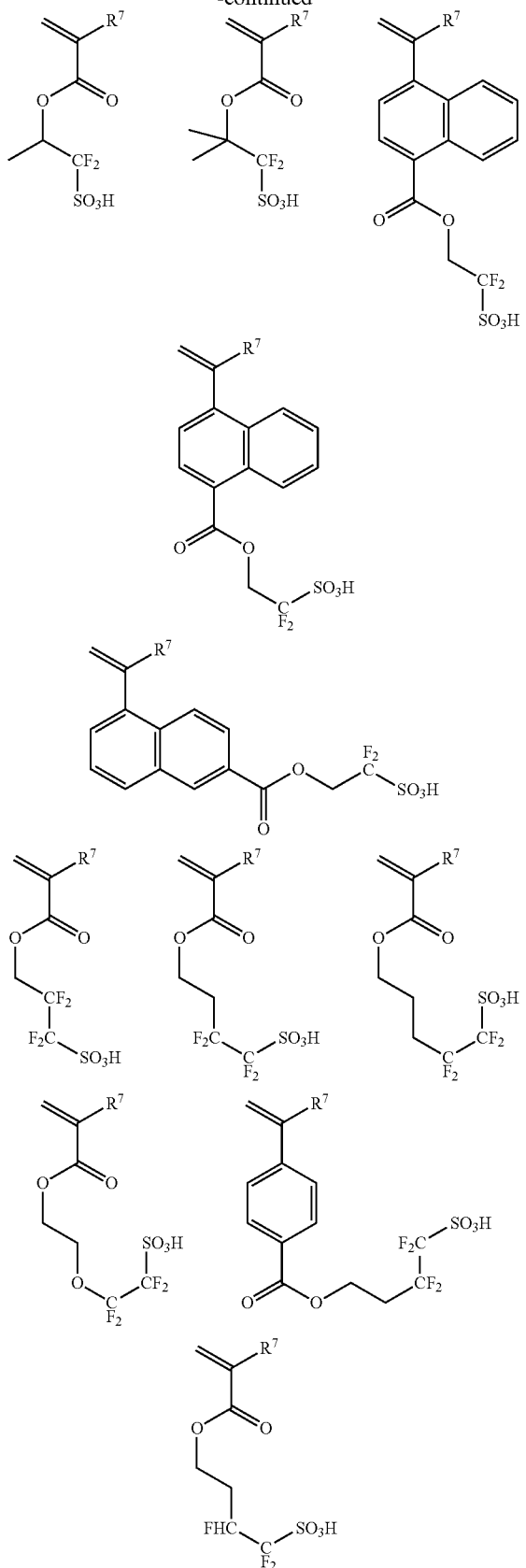
In each formula, R⁷ is as defined above.
52
A monomer for providing the repeating unit b4 can be specifically exemplified by the following.
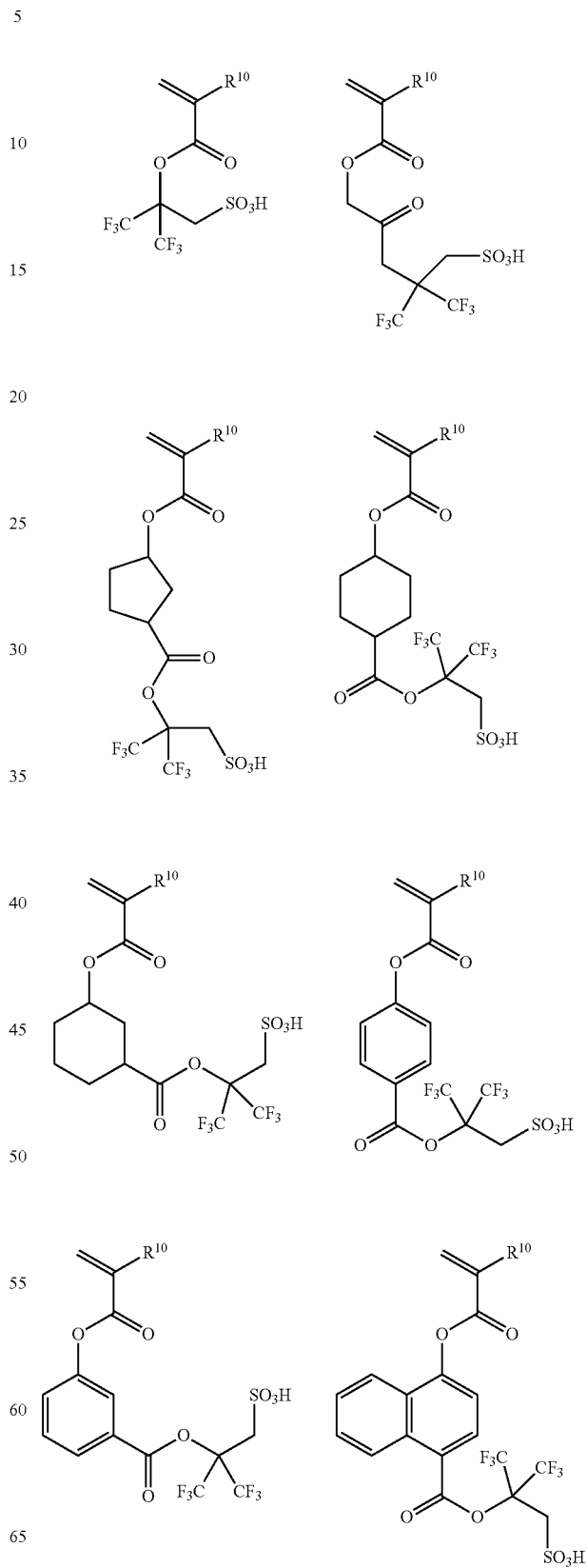

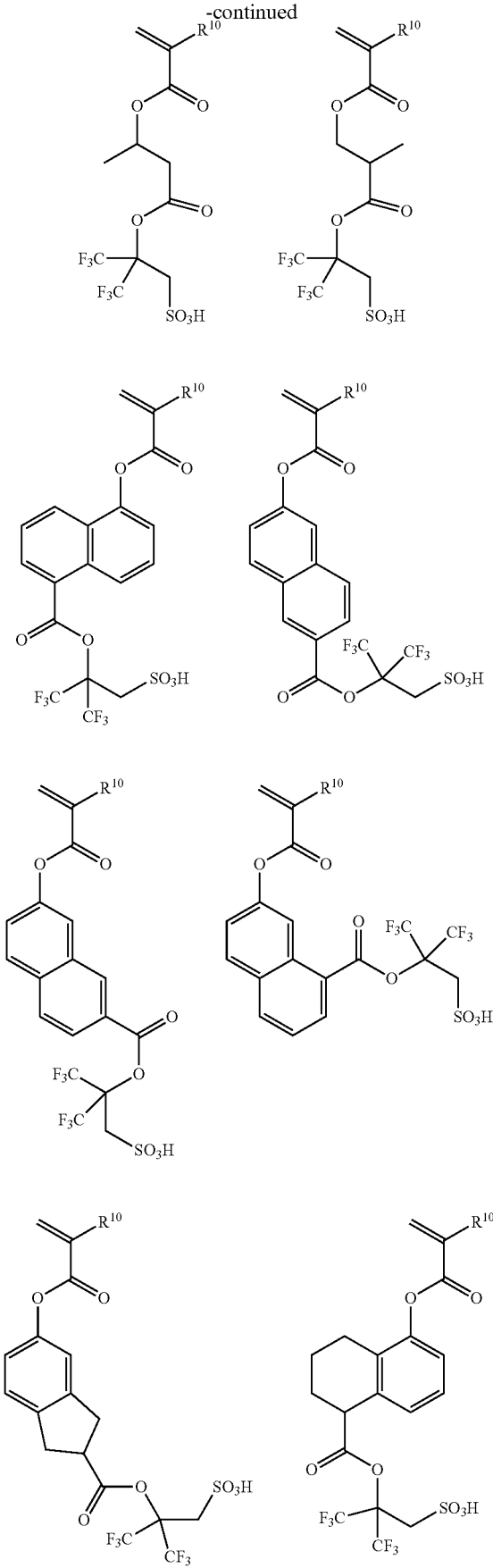
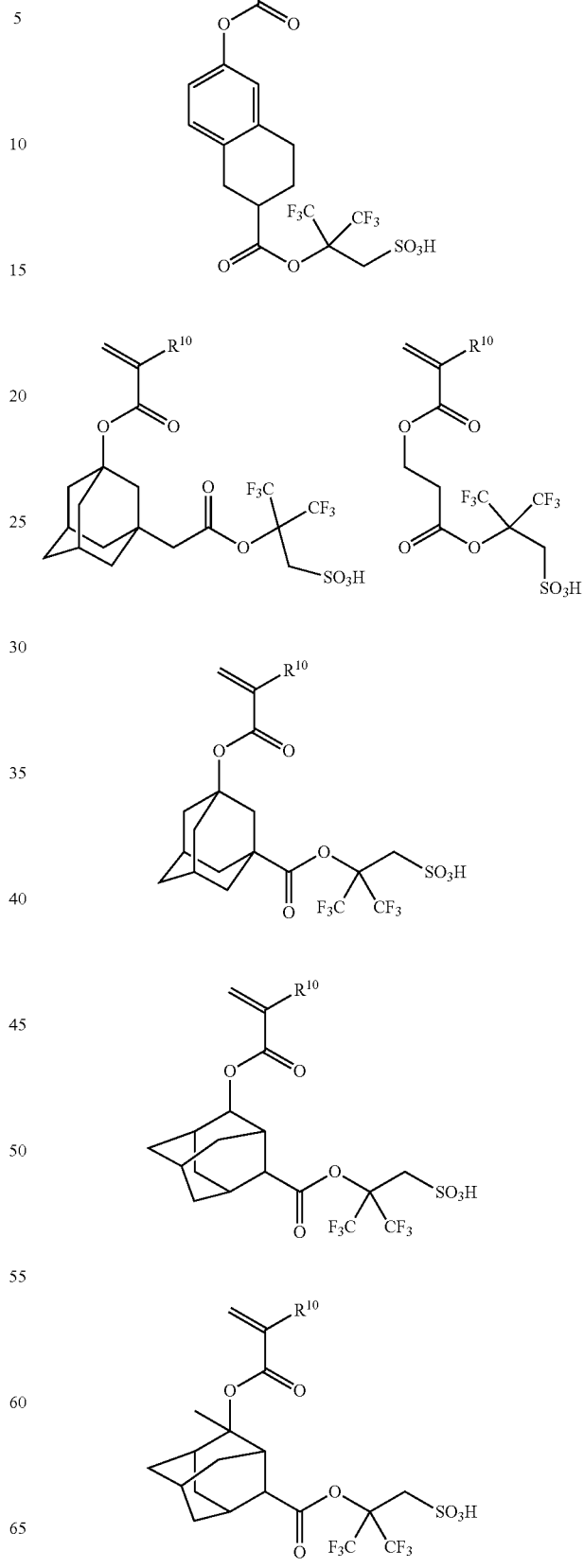

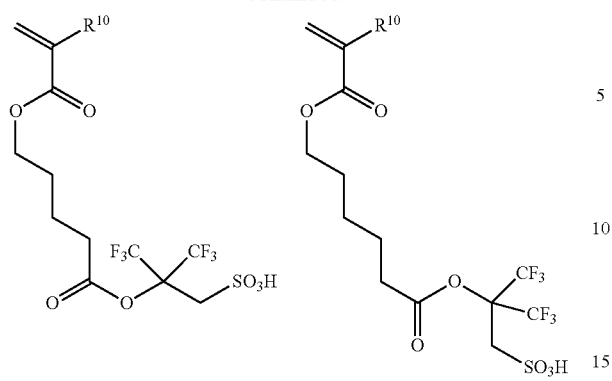
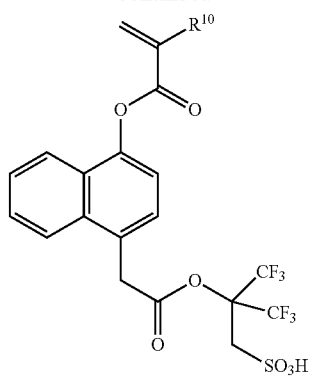
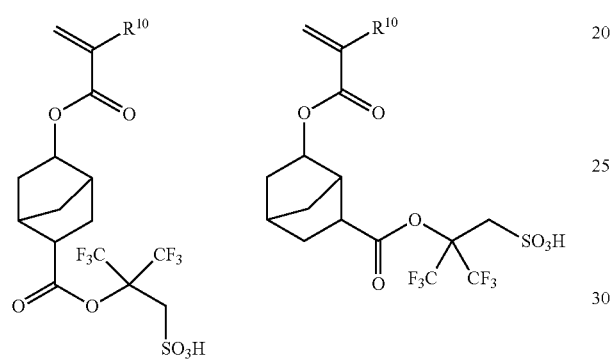
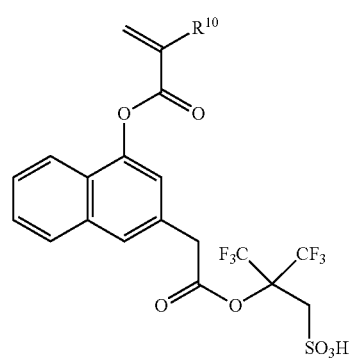
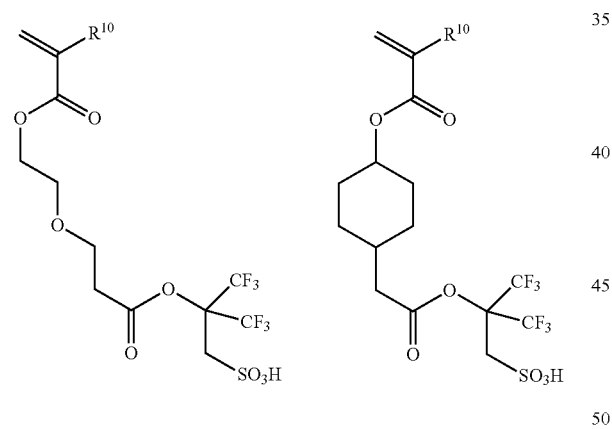
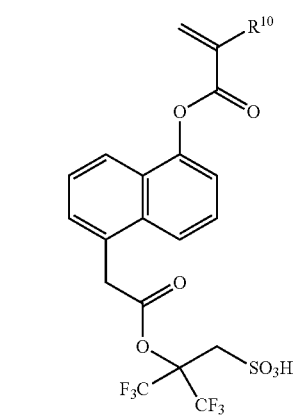
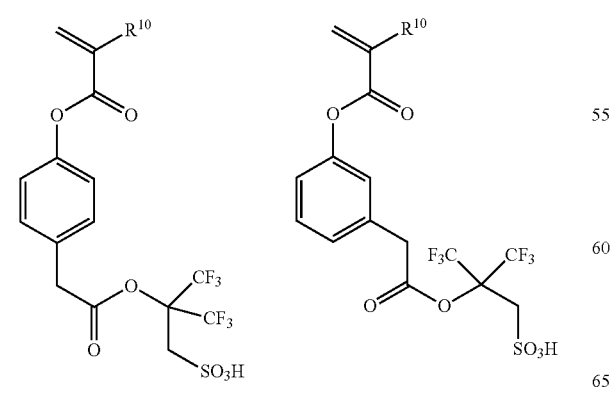
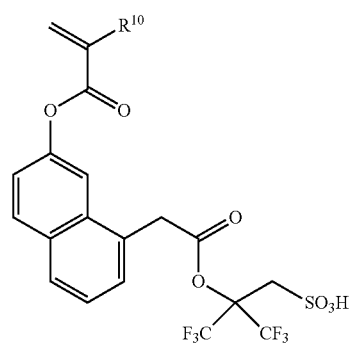

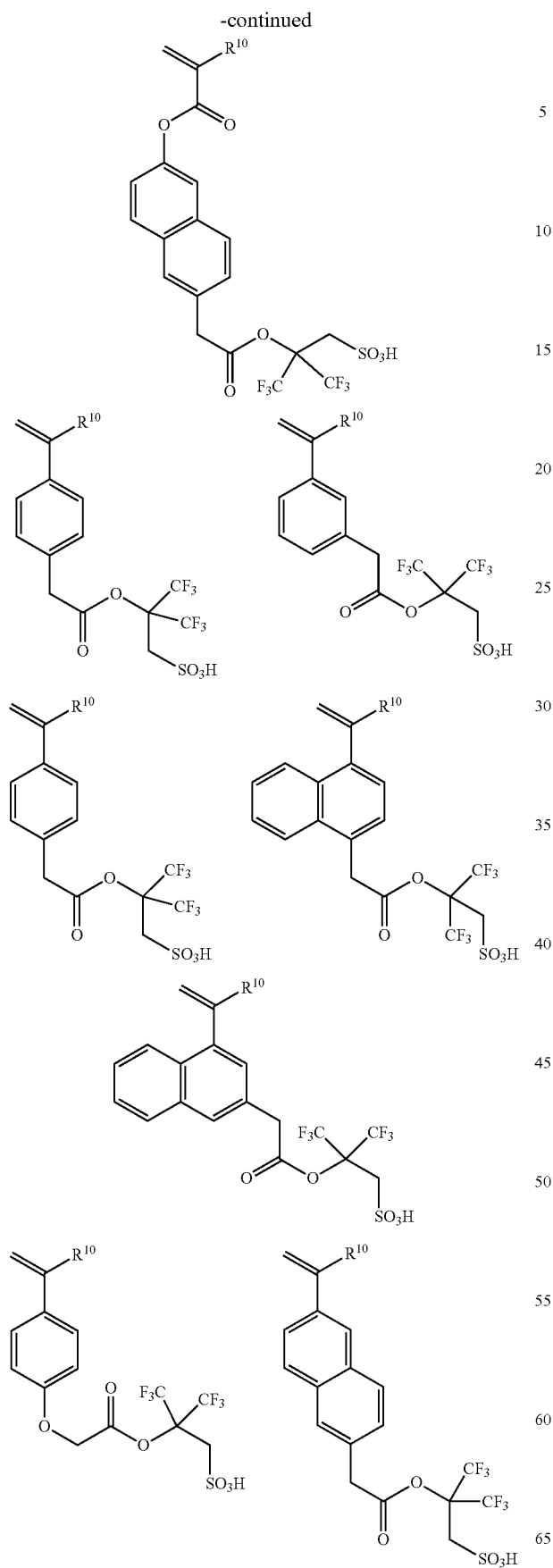
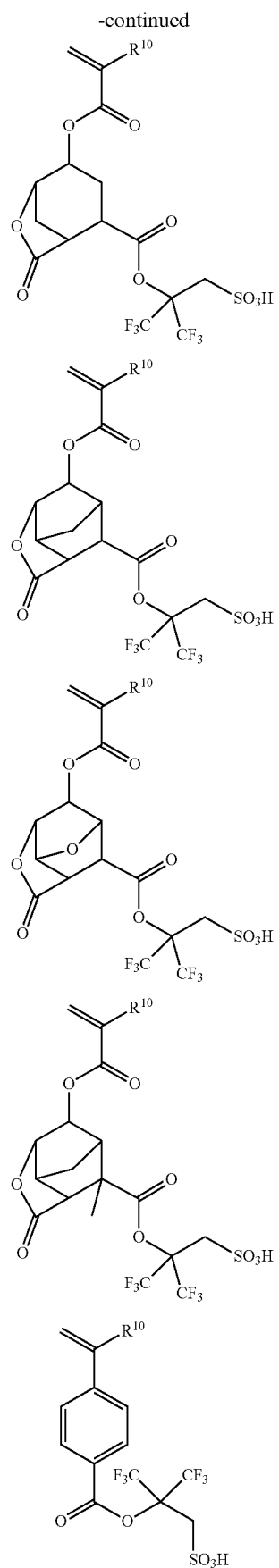

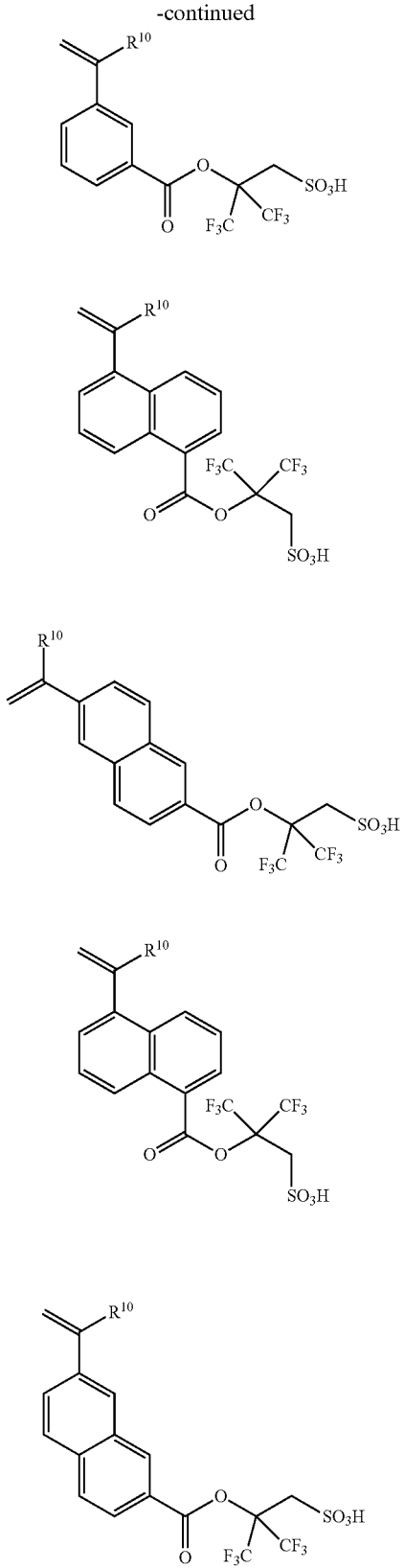
In each formula, $R^{10}$ is as defined above.
A monomer for providing the repeating unit b5 can be specifically exemplified by the following.
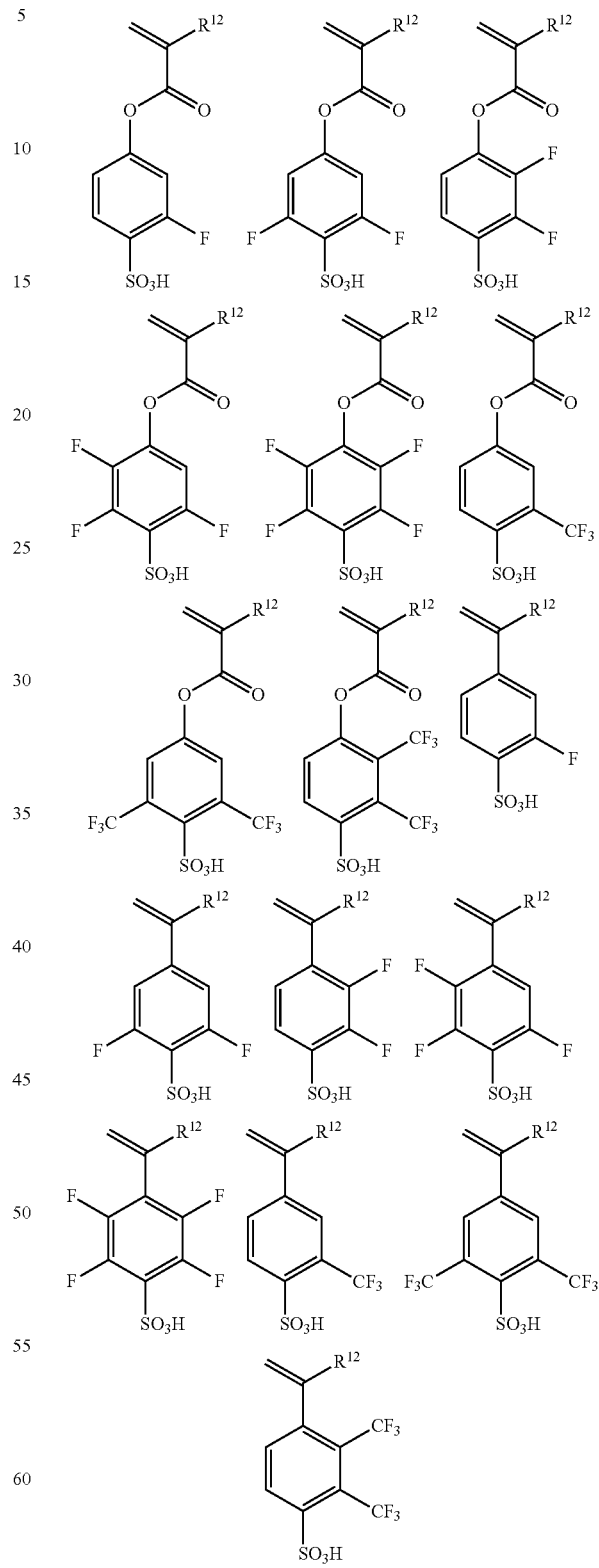
In each formula, $R^{12}$ is as defined above.

A monomer for providing the repeating unit b6 can be specifically exemplified by the following.
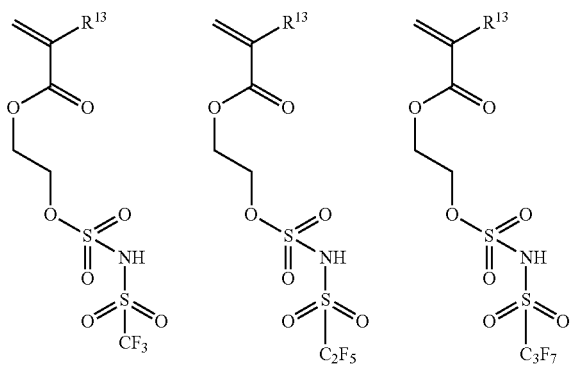
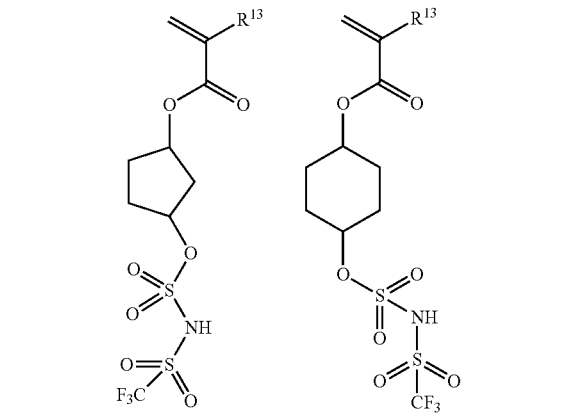
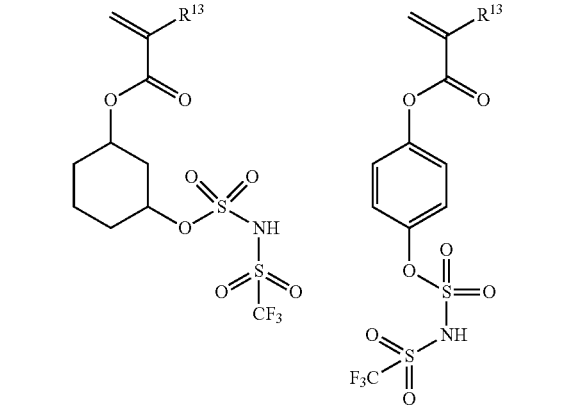
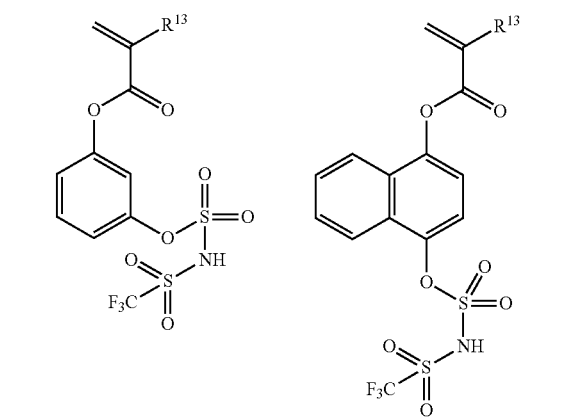
-continued
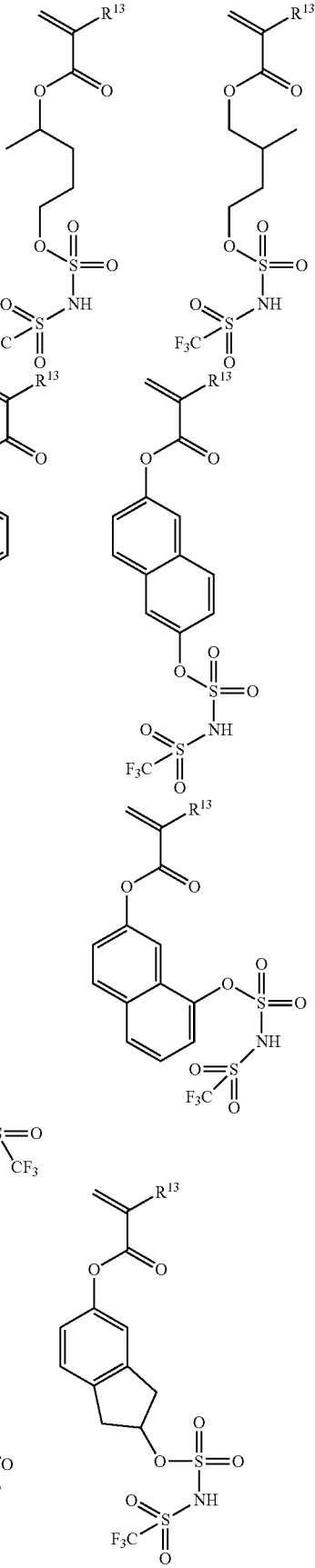

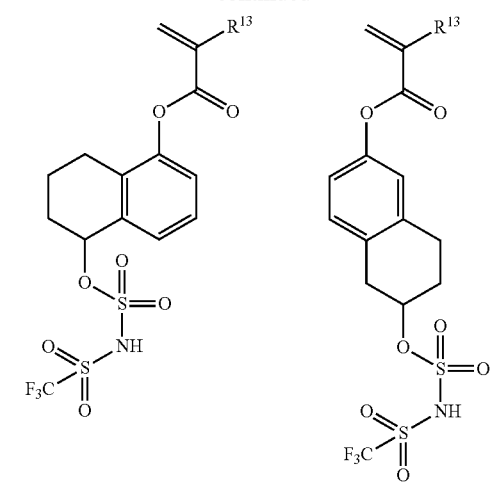
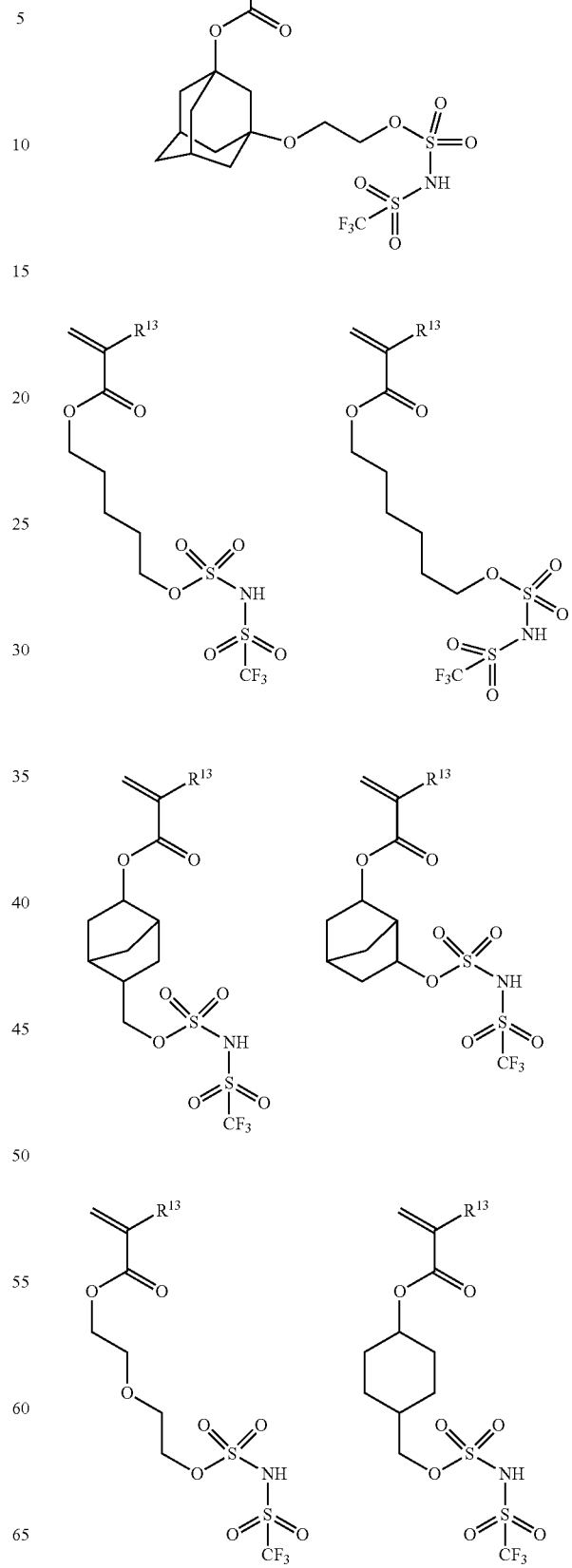

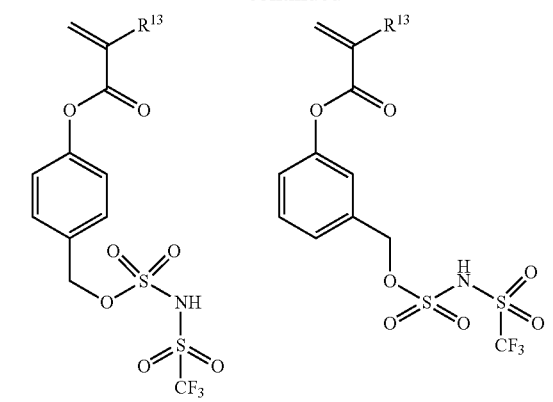
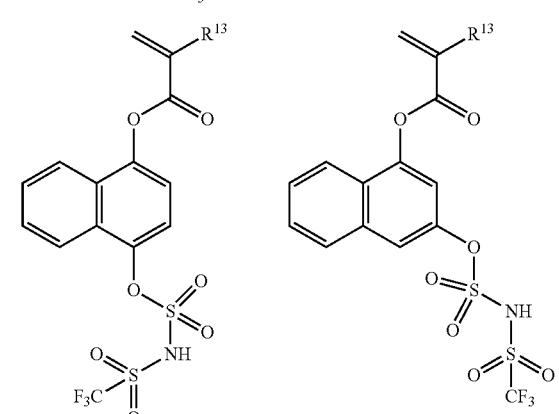
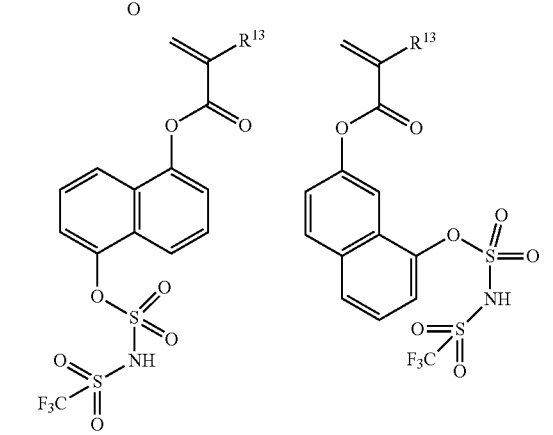
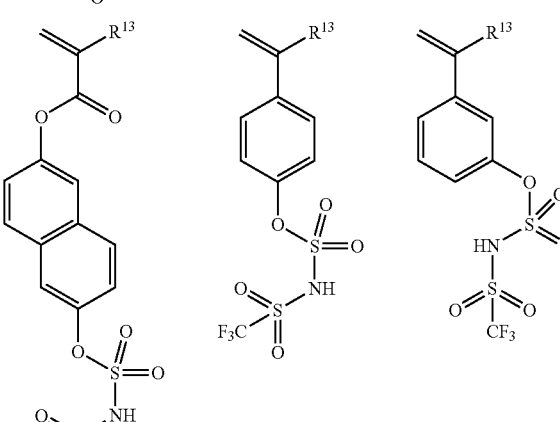
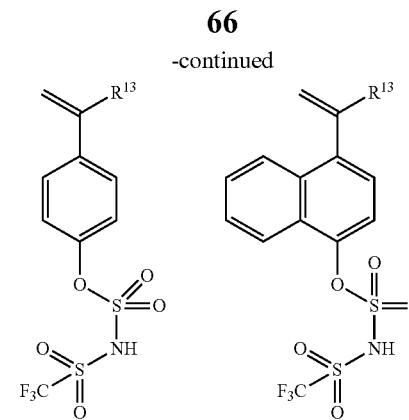
In each formula, R$^{13}$ is as defined above.
A monomer for providing the repeating unit b7 can be specifically exemplified by the following.

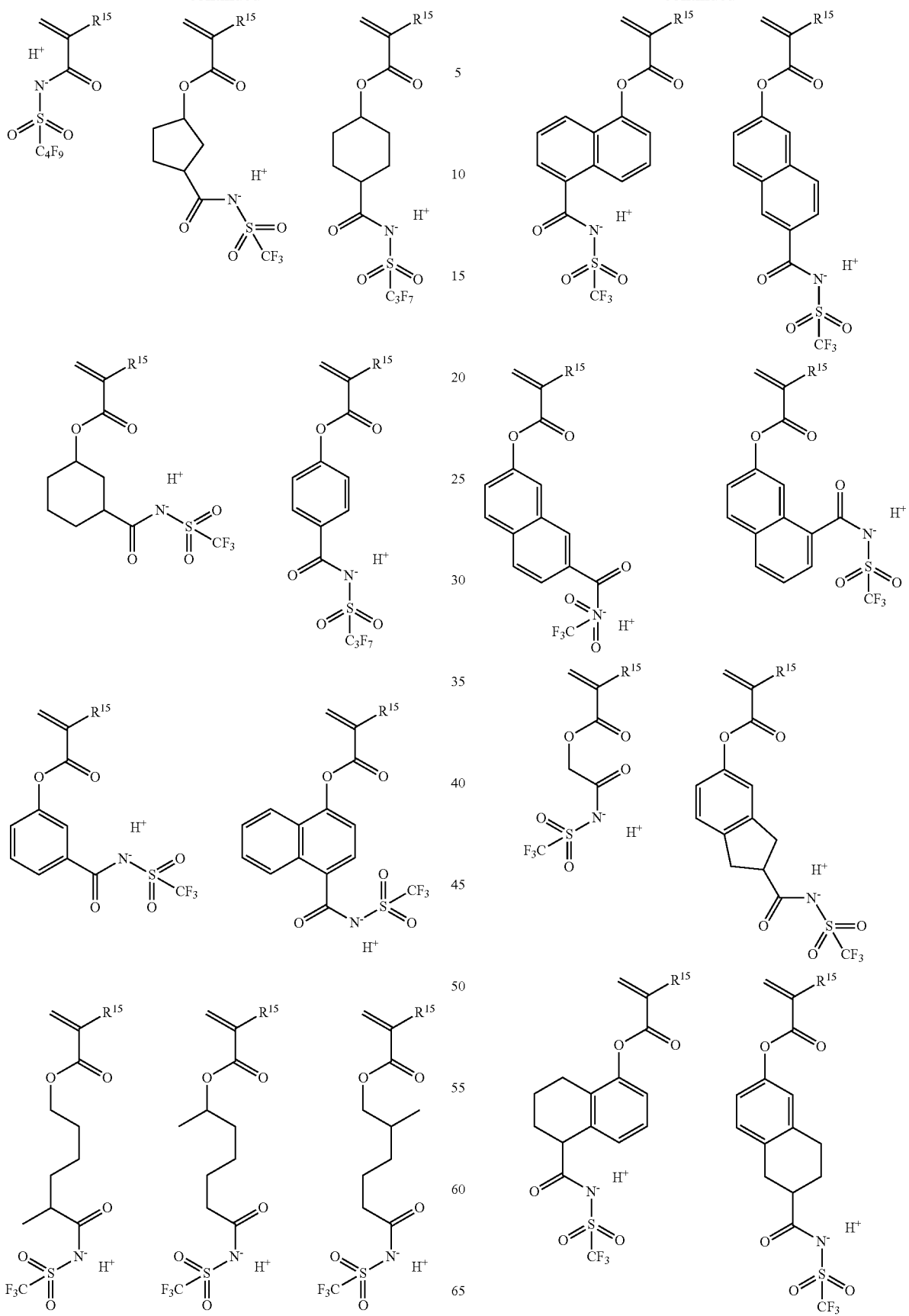

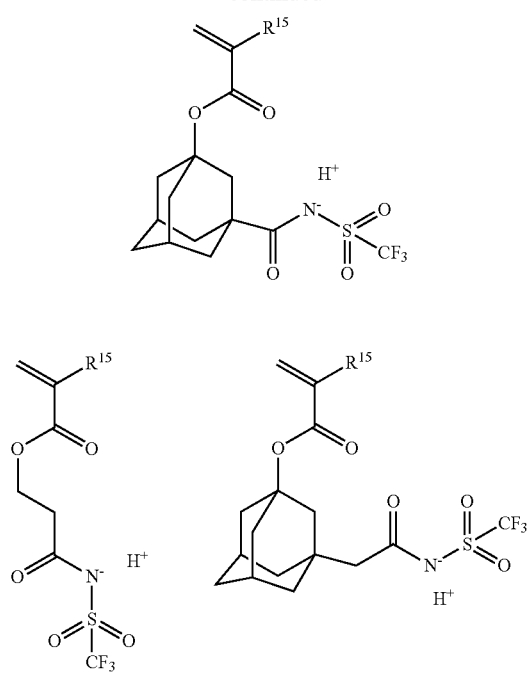
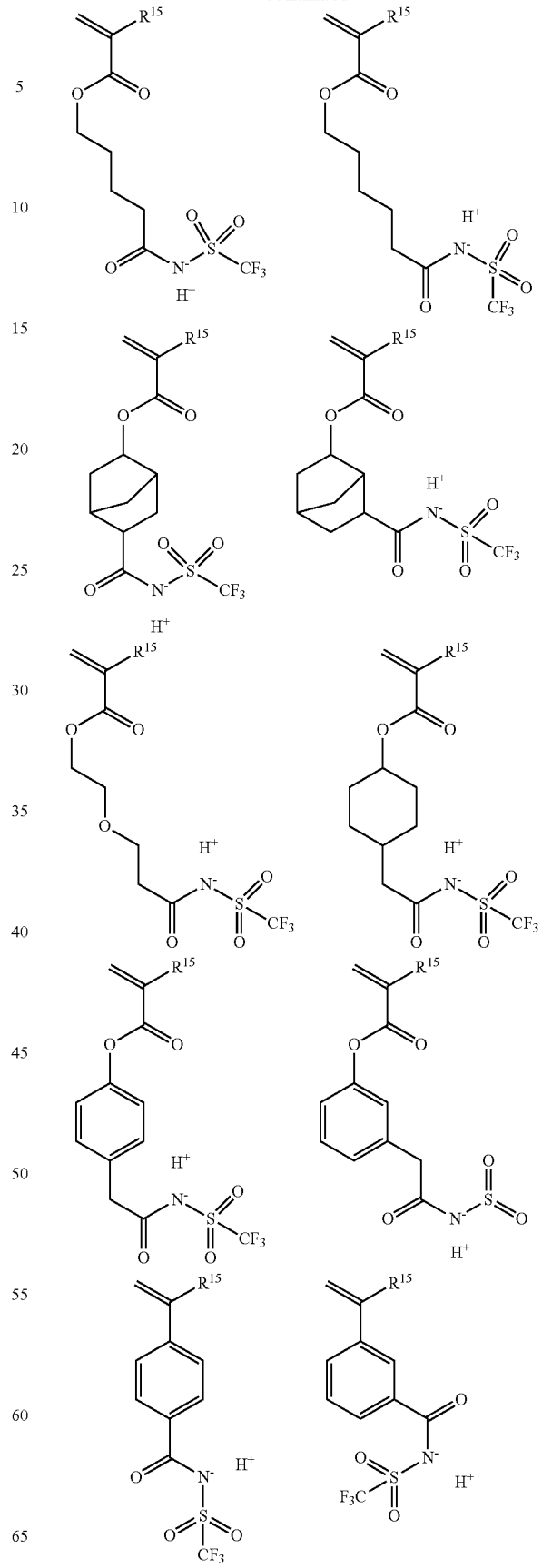

-continued

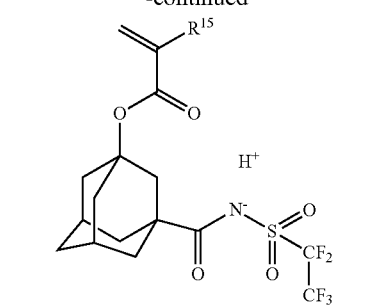
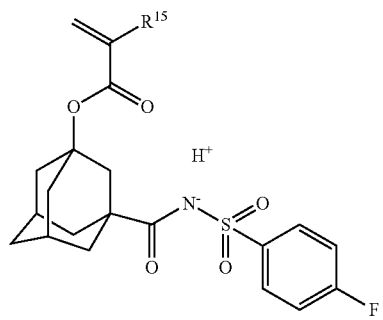
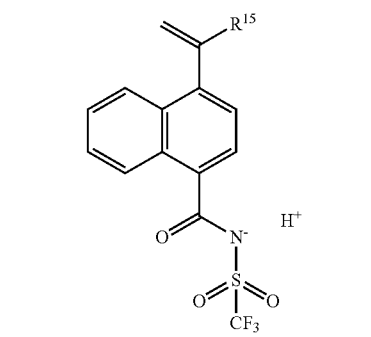
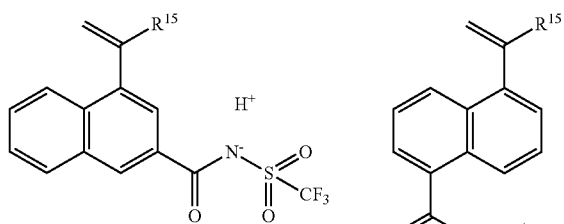
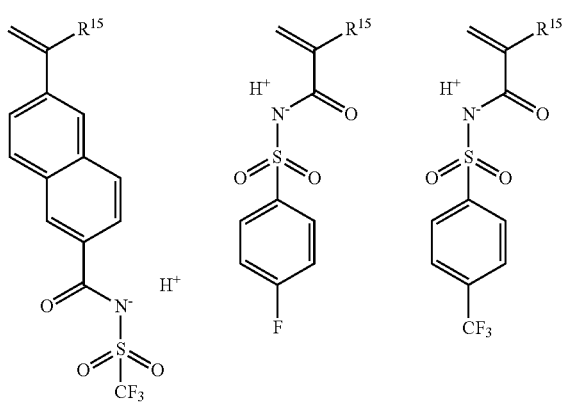

-continued

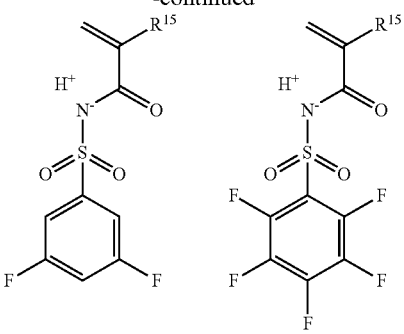

In each formula, $R^{15}$ is as defined above.

The component (B) may further contain a repeating unit "c" shown by the following general formula (6).

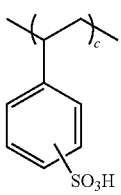

(6)

A monomer for providing the repeating unit "c" can be specifically exemplified by the following.

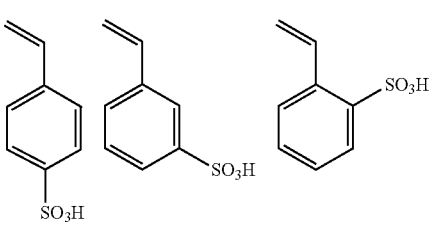

From the viewpoints that the conductive polymer composite employed as an electrode is likely to sufficiently function and exhibit conductivity and the conductive polymer composite employed as a hole injection layer is likely to sufficiently function and exhibit hole injection efficiency, the repeating unit "b" preferably has a copolymerization ratio of 60 to 90% relative to all the repeating units. In the case where the repeating unit "c" is contained, 60%≤b+c≤90%. In this case, the repeating unit "c" preferably has a copolymerization ratio of 40% or less relative to all the repeating units.

Further, the dopant polymer (B) may contain a repeating unit "d" other than the repeating units "b" and the repeating unit "c". Examples of the repeating unit "d" include repeating units based on styrene, vinylnaphthalene, vinylsilane, acenaphthylene, indene, vinylcarbazole, and the like.

A monomer for providing the repeating unit "d" can be specifically exemplified by the following.
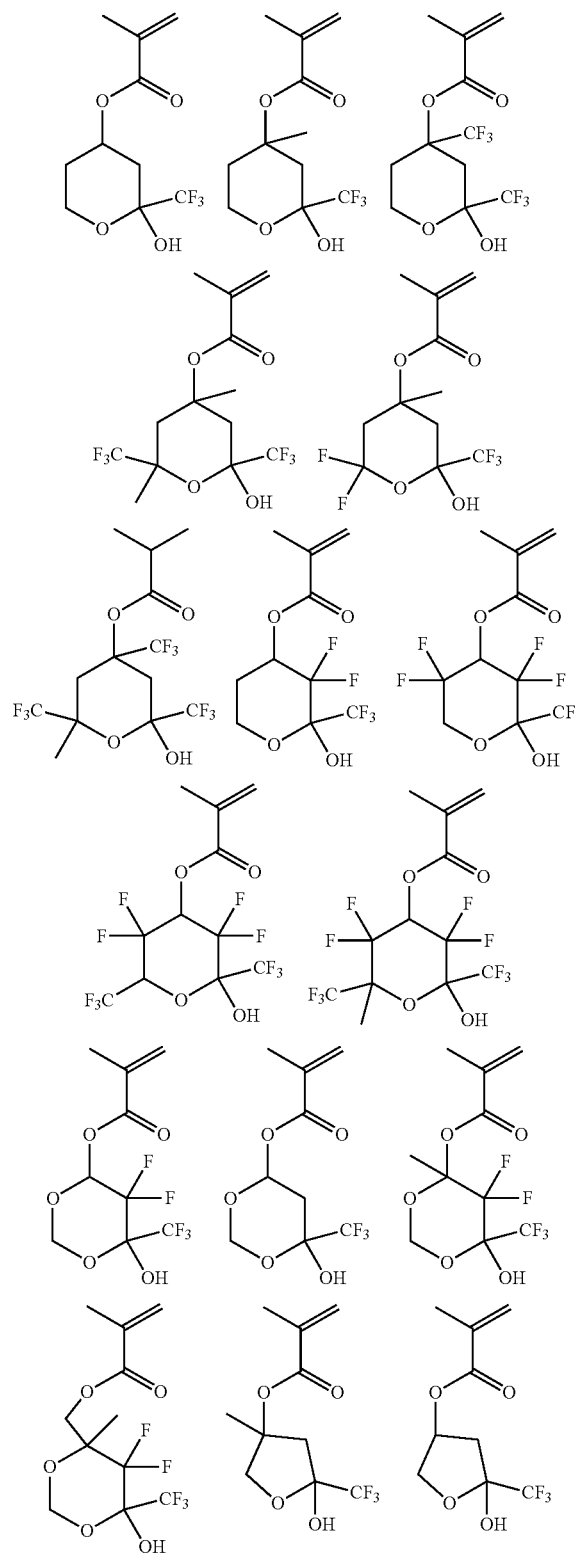
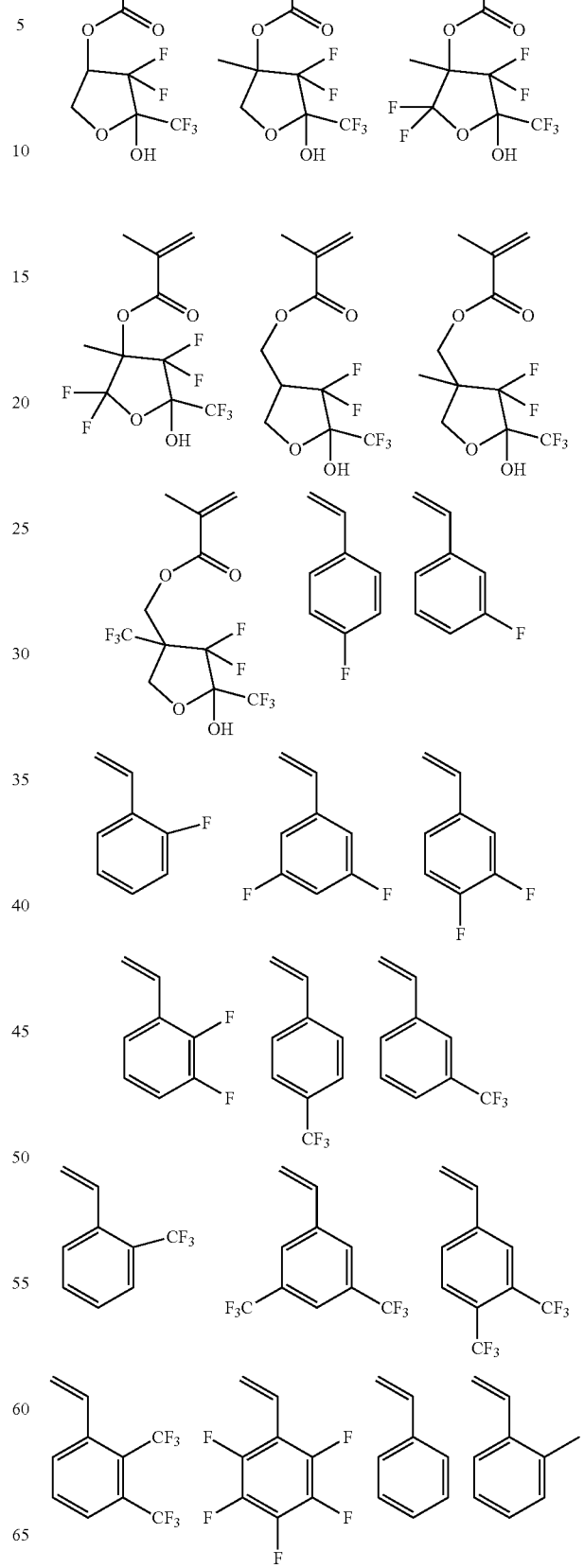

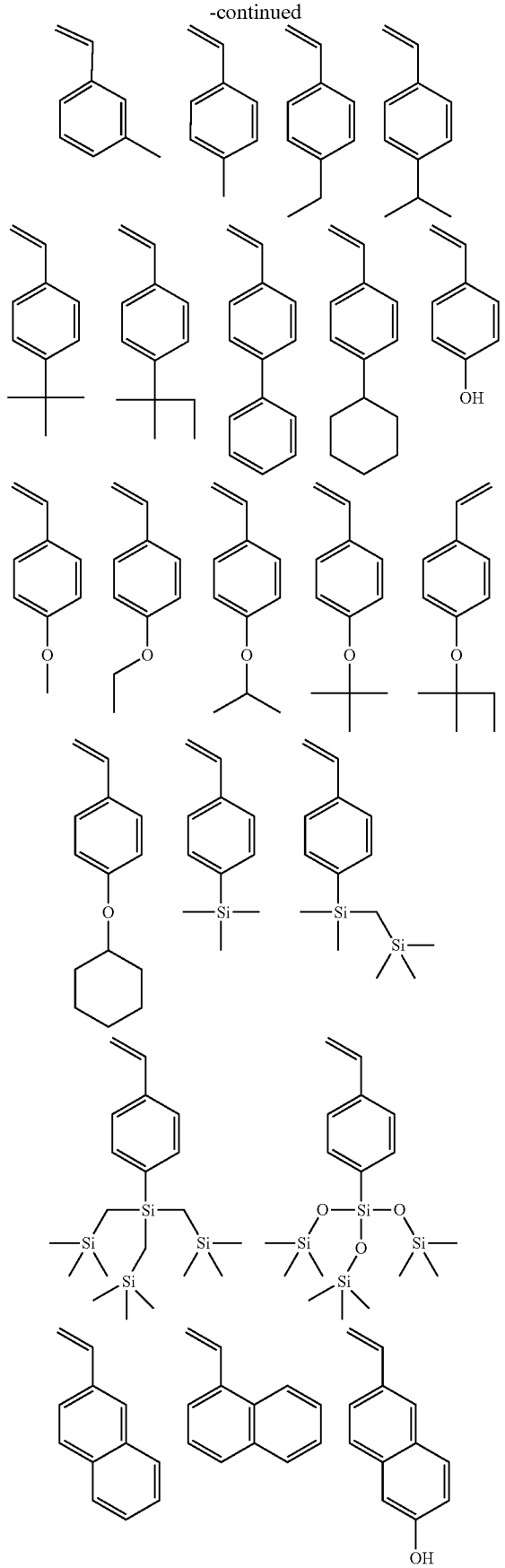
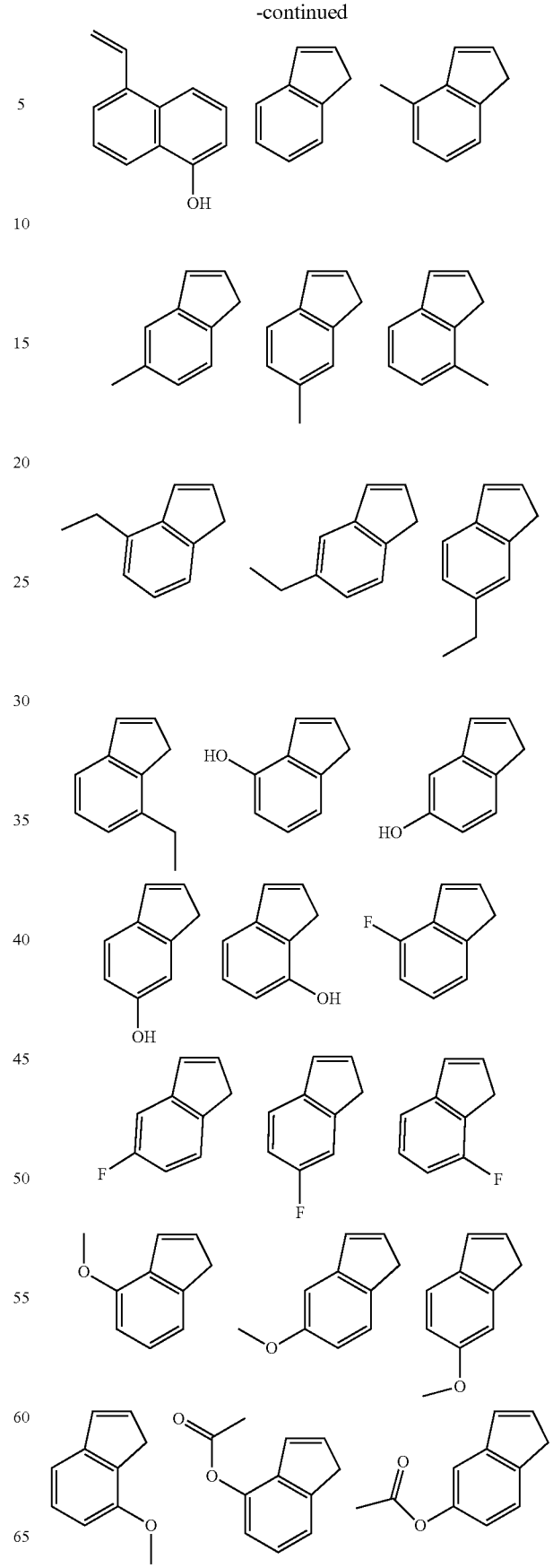

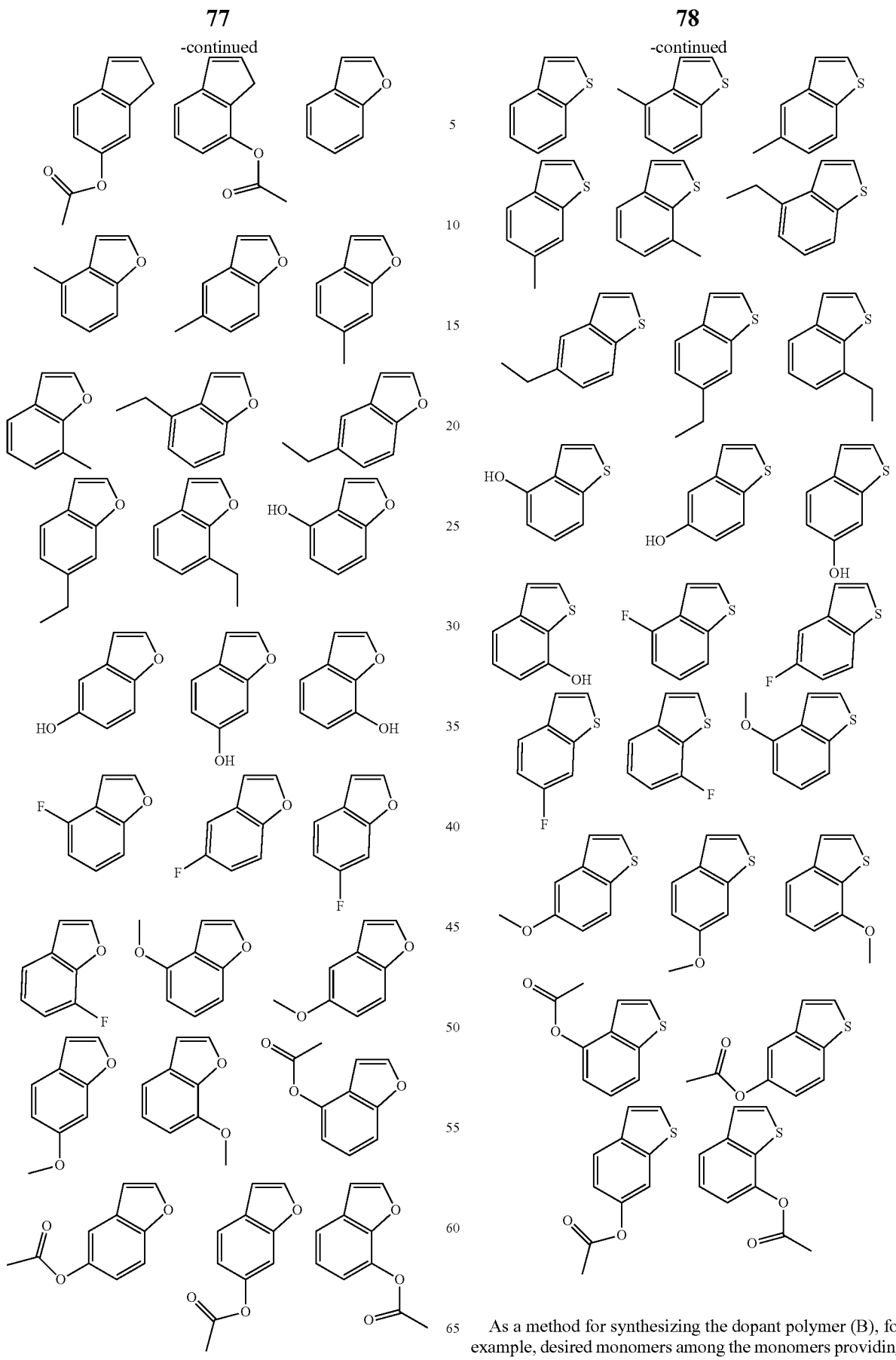
As a method for synthesizing the dopant polymer (B), for example, desired monomers among the monomers providing the repeating units "a" to "d" may be subjected to polymerization under heating in an organic solvent by adding a radical polymerization initiator to obtain a dopant polymer which is a (co)polymer.

The organic solvent to be used at the time of the polymerization may be exemplified by toluene, benzene, tetrahydrofuran, diethyl ether, dioxane, cyclohexane, cyclopentane, methyl ethyl ketone, γ-butyrolactone, and the like.

The radical polymerization initiator may be exemplified by 2,2'-azobisisobutyronitrile (AIBN), 2,2'-azobis(2,4-dimethylvaleronitrile), dimethyl 2,2'-azobis(2-methylpropionate), benzoyl peroxide, lauroyl peroxide, and the like.

The reaction temperature is preferably 50 to 80° C., and the reaction time is preferably 2 to 100 hours, more preferably 5 to 20 hours.

In the dopant polymer (B), the monomer for providing the repeating unit "a" may be either one kind or two or more kinds. It is preferable to use a methacrylic type monomer and a styrene type monomer in combination to heighten polymerizability.

When two or more kinds of the monomers for providing the repeating unit "a" are used, each monomer may be randomly copolymerized, or may be copolymerized in block. When the block copolymerized polymer (block copolymer) is made, the repeating unit portions of two or more kinds of the repeating unit "a" aggregate to form a sea-island structure, whereby a specific structure is generated around the dopant polymer, and as a result, a merit of improving electric conductivity can be expected.

In addition, the monomers providing the repeating units "a" to "c" may be randomly copolymerized, or may be copolymerized in block. In this case also, as in the case of the repeating unit "a", a merit of improving conductivity can be expected by forming a block copolymer.

When the random copolymerization is carried out by the radical polymerization, it is a general method that monomers to be copolymerized and a radical polymerization initiator are mixed and polymerized under heating. Polymerization is started in the presence of a first monomer and a radical polymerization initiator, and a second monomer is added later. Thereby, one side of the polymer molecule has a structure in which the first monomer is polymerized, and the other side has a structure in which the second monomer is polymerized. In this case, however, the repeating units of the first and second monomers are mixedly present in the intermediate portion, and the form is different from that of the block copolymer. For forming the block copolymer by the radical polymerization, living radical polymerization is preferably used.

In the living radical polymerization method called as the RAFT polymerization (Reversible Addition Fragmentation chain Transfer polymerization), the radical at the end of the polymer is always living, so that polymerization is started with the first monomer, and at the stage when it is consumed, by adding the second monomer, it is possible to form a di-block copolymer with a block of the repeating unit of the first monomer and a block of the repeating unit of the second monomer. Further, when polymerization is started with the first monomer, and at the stage when it is consumed, the second monomer is added, and then, a third monomer is added, thus, a tri-block copolymer can be formed.

When the RAFT polymerization is carried out, there is a characteristic that a narrow dispersion polymer in which a molecular weight distribution (dispersity) is narrow is formed. In particular, when the RAFT polymerization is carried out by adding the monomers at a time, a polymer having a narrower molecular weight distribution can be formed.

The dopant polymer (B) preferably has a molecular weight distribution (Mw/Mn) of preferably 1.0 to 2.0, particularly preferably a narrow dispersion of 1.0 to 1.5. With a narrow dispersion, the effect of preventing a decrease in the transmittance of a conductive film formed of the conductive polymer composite using such dopant polymer (B) is likely to improve.

For carrying out the RAFT polymerization, a chain transfer agent is necessary. Specific examples thereof include 2-cyano-2-propylbenzothioate, 4-cyano-4-phenylcarbonothioylthiopentanoic acid, 2-cyano-2-propyl dodecyl trithiocarbonate, 4-cyano-4-[(dodecylsulfanylthiocarbonyl)sulfanyl] pentanoic acid, 2-(dodecylthiocarbonothioylthio)-2-methylpropanoic acid, cyanomethyl dodecyl thiocarbonate, cyanomethyl methyl(phenyl)carbamothioate, bis(thiobenzoyl)disulfide, and bis(dodecylsulfanylthiocarbonyl)disulfide. Among these, 2-cyano-2-propylbenzothioate is particularly preferable.

The dopant polymer (B) preferably has a weight average molecular weight in a range of 1,000 to 500,000, preferably 2,000 to 200,000, from the viewpoints of heat resistance and viscosity.

Incidentally, the weight average molecular weight (Mw) is a measured value in terms of polyethylene oxide, polyethylene glycol, or polystyrene, by gel permeation chromatography (GPC) using water, dimethylformamide (DMF), or tetrahydrofuran (THF) as a solvent.

Note that, as the monomer constituting the dopant polymer (B), a monomer having a sulfo group may be used. Alternatively, the polymerization reaction may be carried out using a monomer which is a lithium salt, a sodium salt, a potassium salt, an ammonium salt, or a sulfonium salt of a sulfo group, and then the resultant after the polymerization is changed to a sulfo group by using an ion exchange resin.

[Conductive Polymer Composite]

The inventive conductive polymer composite contains the π-conjugated polymer (A) and the dopant polymer (B). The dopant polymer (B) is coordinated to the π-conjugated polymer (A) to form the composite.

The inventive conductive polymer composite preferably has affinity to both water and an organic solvent and thus can further improve the film formability by spin coating on a highly hydrophobic inorganic or organic substrate and the film flatness.

[Method for Producing Conductive Polymer Composite]

The conductive polymer composite containing the π-conjugated polymer (A) and the dopant polymer (B) can be obtained, for example, by adding a raw-material monomer of the π-conjugated polymer (A) (preferably, pyrrole, thiophene, aniline, or a derivative monomer thereof) into an aqueous solution of the dopant polymer (B) or a mixture solution of water and an organic solvent with the dopant polymer (B), and adding an oxidizing agent and, if necessary, an oxidizing catalyst thereto, to carry out oxidative polymerization.

The oxidizing agent and the oxidizing catalyst which can be used may be: a peroxodisulfate (persulfate) such as ammonium peroxodisulfate (ammonium persulfate), sodium peroxodisulfate (sodium persulfate), and potassium peroxodisulfate (potassium persulfate); a transition metal compound such as ferric chloride, ferric sulfate, and cupric chloride; a metal oxide such as silver oxide and cesium oxide; a peroxide such as hydrogen peroxide and ozone; an organic peroxide such as benzoyl peroxide; oxygen, and the like.

As the reaction solvent to be used for carrying out the oxidative polymerization, water or a mixed solvent of water and a solvent may be used. The solvent herein used is preferably a solvent which is miscible with water, and can dissolve or disperse the π-conjugated polymer (A) and the dopant polymer (B). Examples of the solvent include polar solvents such as N-methyl-2-pyrrolidone, N,N'-dimethylformamide, N,N'-dimethylacetamide, dimethylsulfoxide, and hexamethylene phosphotriamide; alcohols such as methanol, ethanol, propanol, and butanol; polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonate compounds such as ethylene carbonate and propylene carbonate; cyclic ether compounds such as dioxane and tetrahydrofuran; linear ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; heterocyclic compounds such as 3-methyl-2-oxazolidinone; nitrile compounds such as acetonitrile, glutaronitrile, methoxyacetonitrile, propionitrile, and benzonitrile; and the like. These solvents may be used alone or in mixture of two or more kinds. A formulation ratio of the solvents miscible with water is preferably 50 mass % or less based on the whole reaction solvent.

In addition, an anion which is capable of doping the π-conjugated polymer (A) may be used in combination other than the dopant polymer (B). Such an anion is preferably an organic acid from the viewpoints of adjusting dedoping characteristics from the π-conjugated polymer, dispersibility of the conductive polymer composite, heat resistance, and environmental resistance characteristics. Examples of the organic acid include an organic carboxylic acid, phenols, an organic sulfonic acid, and the like.

As the organic carboxylic acid, a material in which one or two or more carboxyl groups are contained in an aliphatic, an aromatic, a cycloaliphatic, or the like may be used. Examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, triphenylacetic acid, and the like.

Examples of the phenols include phenols such as cresol, phenol, and xylenol.

As the organic sulfonic acid, a material in which one or two or more sulfonic acid groups are contained in an aliphatic, an aromatic, a cycloaliphatic, or the like may be used. Examples of ones containing one sulfonic acid group include sulfonic acid compounds containing a sulfonic acid group such as methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamido-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, butylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-amino-3-methylbenzene-1-sulfonic acid, 4-acetamido-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, naphthalenesulfonic acid formalin polycondensate, and melaminesulfonic acid formalin polycondensate.

Examples of ones containing two or more sulfonic acid groups include ethanedisulfonic acid, butanedisulfonic acid, pentanedisulfonic acid, decanedisulfonic acid, m-benzenedisulfonic acid, o-benzenedisulfonic acid, p-benzenedisulfonic acid, toluenedisulfonic acid, xylenedisulfonic acid, chlorobenzenedisulfonic acid, fluorobenzenedisulfonic acid, aniline-2,4-disulfonic acid, aniline-2,5-disulfonic acid, dimethylbenzenedisulfonic acid, diethylbenzenedisulfonic acid, dibutylbenzenedisulfonic acid, naphthalenedisulfonic acid, methylnaphthalenedisulfonic acid, ethylnaphthalenedisulfonic acid, dodecylnaphthalenedisulfonic acid, pentadecylnaphthalenedisulfonic acid, butylnaphthalenedisulfonic acid, 2-amino-1,4-benzenedisulfonic acid, 1-amino-3,8-naphthalenedisulfonic acid, 3-amino-1,5-naphthalenedisulfonic acid, 8-amino-1-naphthol-3,6-disulfonic acid, 4-amino-5-naphthol-2,7-disulfonic acid, anthracenedisulfonic acid, butylanthracenedisulfonic acid, 4-acetamido-4'-isothio-cyanatostilbene-2,2'-disulfonic acid, 4-acetamido-4'-isothiocyanatostilbene-2,2'-disulfonic acid, 4-acetamido-4'-maleimidylstilbene-2,2'-disulfonic acid, 1-acetoxypyrene-3,6,8-trisulfonic acid, 7-amino-1,3,6-naphthalenetrisulfonic acid, 8-aminonaphthalene-1,3,6-trisulfonic acid, 3-amino-1,5,7-naphthalenetrisulfonic acid, and the like.

These anions other than the dopant polymer (B) may be added to the solution containing the raw-material monomer of the π-conjugated polymer (A), the dopant polymer (B), an oxidizing agent and/or an oxidative polymerization catalyst before polymerization of the π-conjugated polymer (A), or may be added to the conductive polymer composite containing the π-conjugated polymer (A) and the dopant polymer (B) after the polymerization.

The thus obtained conductive polymer composite of the π-conjugated polymer (A) and the dopant polymer (B) can be used, if necessary, by finely pulverizing with a homogenizer, a ball mill, or the like.

For fine pulverization, a mixing-dispersing machine which can provide high shearing force is preferably used. Examples of the mixing-dispersing machine include a homogenizer, a high-pressure homogenizer, a bead mill, and the like. Among these, a high-pressure homogenizer is preferable.

Specific examples of the high-pressure homogenizer include Nanovater manufactured by Yoshida Kikai Co., Ltd., Microfluidizer manufactured by Powrex Corp., Artimizer manufactured by Sugino Machine Limited, and the like.

Examples of a dispersing treatment using the high-pressure homogenizer include a treatment in which the solution of the composite before subjecting to the dispersing treatment is subjected to counter-collision with high pressure, a treatment in which it is passed through an orifice or slit with high pressure, and the like.

Before or after fine pulverization, impurities may be removed by a method such as filtration, ultrafiltration, and dialysis, followed by purification with a cation-exchange resin, an anion-exchange resin, a chelate resin, or the like.

Examples of the organic solvent which can be added to the aqueous solution for the polymerization reaction, or which can dilute the raw-material monomer of the π-conjugated polymer (A), include methanol, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Note that the amount of the organic solvent to be used is preferably 0 to 1,000 mL based on 1 mol of the monomer, particularly preferably 0 to 500 mL. If the amount of the organic solvent is 1,000 mL or less, the reaction vessel does not become too large so that it is economical.

[Conductive Polymer Composition]

The total content ratio of the π-conjugated polymer (A) and the dopant polymer (B) in a conductive polymer composition is preferably 0.05 to 5.0 mass %. When the total content ratio of the π-conjugated polymer (A) and the dopant polymer (B) is within this range, a uniform conductive coating film having sufficient conductivity or hole injection function is easily obtained.

((C) Compound)

A compound (C) shown by the following general formula (3) may be added to a solution or dispersion of the composite containing the π-conjugated polymer (A) and the dopant polymer (B) in water or an organic solvent to form the composition.

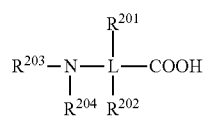

(3)

In the formula (3), $R^{201}$ and $R^{202}$ each independently represent any of a hydrogen atom, a hetero atom, and a linear, branched, or cyclic monovalent hydrocarbon group having 1 to 20 carbon atoms optionally having a hetero atom. $R^{203}$ and $R^{204}$ each independently represent any of a hydrogen atom and a linear, branched, or cyclic monovalent hydrocarbon group having 1 to 20 carbon atoms optionally having a hetero atom. $R^{201}$ and $R^{203}$, or $R^{201}$ and $R^{204}$, are optionally bonded to each other to form a ring. L represents a linear, branched, or cyclic tetravalent organic group having 1 to 20 carbon atoms optionally having a hetero atom. When L has a hetero atom, the hetero atom is optionally an ion.

The conductive polymer composite and the composition described above have good filterability and favorable film formability on organic and inorganic substrates having high hydrophobicity, are capable of forming a conductive film having good transparency, and capable of reducing moisture remained in the film in the film formation process when the film is to be formed.

In the present invention, only one kind of the compound (C) shown by the general formula (3) may be used, or two or more kinds thereof may be used in mixture. Moreover, any known compound can also be used.

The structure of the compound shown by the general formula (3) can be specifically exemplified by the following.

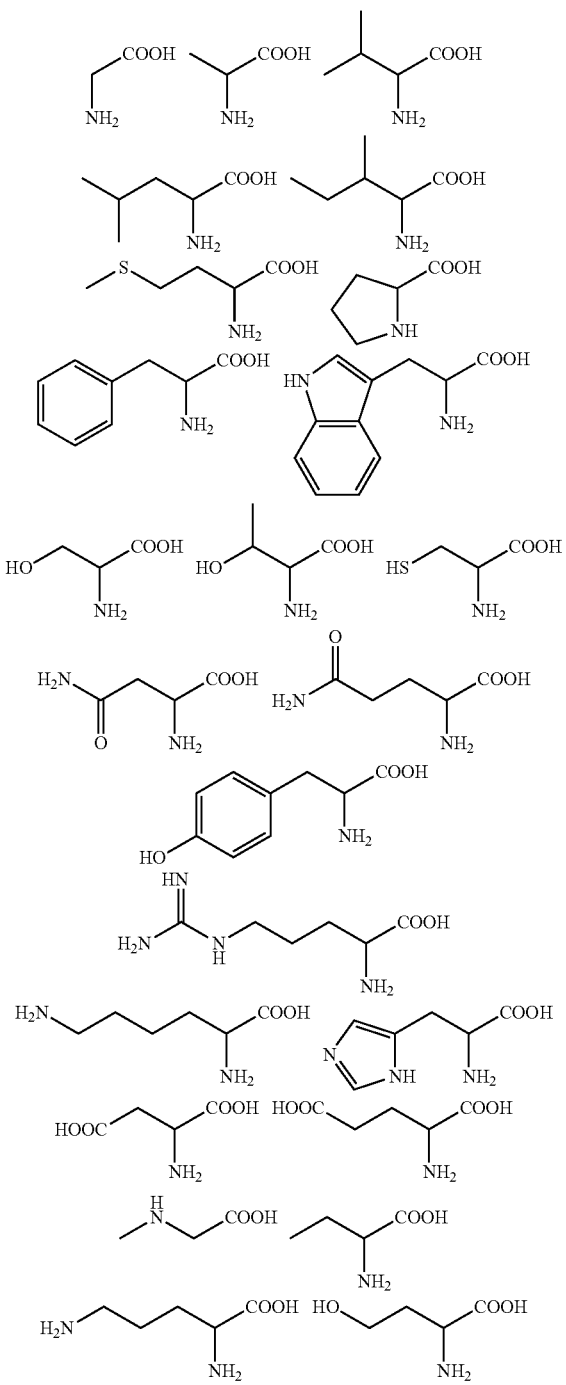

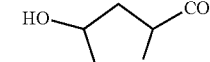
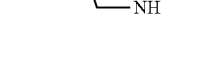
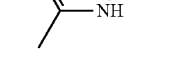
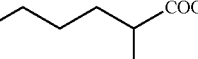
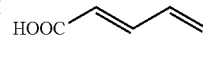
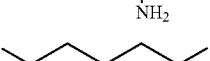
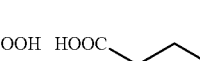
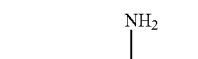
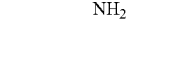
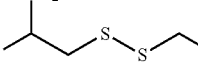
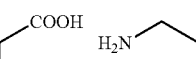

Preferably, the inventive conductive polymer composition contains the compound shown by the general formula (3) in which L represents a linear, branched, or cyclic tetravalent organic group having 2 to 10 carbon atoms optionally having a hetero atom.

Other than the structure shown by the general formula (3), the following structures can be suitably used in the present invention.

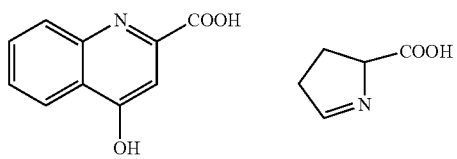

In the inventive conductive polymer composition, the content of the compound shown by the general formula (3) and compounds shown by the general formulae in the preceding paragraph is preferably 1 part by mass to 50 parts by mass, further preferably 5 parts by mass to 30 parts by mass, based on 100 parts by mass of the conductive polymer containing the π-conjugated polymer (A) and the dopant polymer (B). When the compound shown by the general formula (3) and compounds shown by the general formulae in the preceding paragraph is contained in these ranges, the acid diffusion from an antistatic film formed of the inventive conductive polymer composition to a resist layer is reduced.
(Surfactant)

In the present invention, a surfactant may be added to further increase wettability to a material to be processed such as a substrate. Examples of such a surfactant include various surfactants such as nonionic, cationic, and anionic surfactants. Specific examples thereof include nonionic surfactants such as polyoxyethylene alkyl ether, polyoxyethylene alkylphenyl ether, polyoxyethylene carboxylic acid ester, sorbitan ester, and polyoxyethylene sorbitan ester; cationic surfactants such as alkyltrimethyl ammonium chloride and alkylbenzyl ammonium chloride; anionic surfactants such as alkyl or alkylallyl sulfates, alkyl or alkylallyl sulfonate, and dialkyl sulfosuccinate; amphoteric ionic surfactants such as amino acid type and betaine type; and the like.

As has been described above, the inventive conductive polymer composite and the inventive composition are capable of efficiently removing residual moisture in the film during the film formation, have good filterability and film formability by spin coating, and are capable of forming a conductive film having good flatness and high transparency.
[Conductive Film]

The conductive polymer composite and composition obtained as described above can form a conductive film by coating on a material to be processed such as a substrate. Examples of the coating method with the conductive polymer composite (solution) include coating with a spin coater or the like, bar coating, dipping, comma coating, spray coating, roll coating, screen printing, flexographic printing, gravure printing, ink-jet printing, and the like. After the coating, a heat treatment with a hot air circulation furnace, hot plate, or the like, IR or UV irradiation, or the like may be performed to form a conductive film.

Thus, the inventive conductive polymer composite and composition can form a conductive film by coating and film formation on a substrate and the like. In addition, the conductive film formed in this manner is excellent in conductivity and transparency, and hence can function as a transparent electrode layer or hole injection layer.
[Substrate]

Further, the present invention provides a substrate on which a conductive film is formed from any of the inventive conductive polymer composite and composition described above. Particularly suitably, on the substrate, a transparent electrode layer or a hole injection layer in an organic EL device is formed.

Examples of the substrate include a glass substrate, a quartz substrate, a photomask blank substrate, a resin substrate, a silicon wafer; compound semiconductor wafers such as a gallium arsenide wafer and an indium phosphide wafer; a flexible substrate, and the like. Furthermore, a photoresist film may be coated with any of the inventive conductive polymer composite and composition, and the resultant can be used as an antistatic top coating.

As described above, in each of the inventive conductive polymer composite and composition, the dopant polymer (B) containing a sulfo group as a super strong acid and a non-doping fluorinated unit forms a composite with the π-conjugated polymer (A). Thus, the inventive conductive polymer composite and composition have low viscosity, good filterability, and favorable film formability by spin coating; when a film is formed, a conductive film having good transparency, flatness, durability, and conductivity can be formed. Moreover, in order to relieve diffusion of $H^+$ derived from an acid unit in a non-doping state, the compound (C) shown by the general formula (3) is added, which makes it possible to suppress the $H^+$ diffusion to the outside of the film after the film formation while keeping an appropriate acidity as a composition. Such conductive polymer composite and composition have good film formability on any of an organic substrate and an inorganic substrate having strong hydrophobicity.

Further, the conductive film formed from such conductive polymer composite and composition is excellent in conductivity, transparency, and so forth, and accordingly can function as a transparent electrode layer or a hole injection layer in an organic EL device.

EXAMPLE

Hereinafter, the present invention will be specifically described with reference to Examples and Comparative Examples, but the present invention is not limited thereto.
[Synthesis Examples of Dopant Polymers]

Raw-material monomers used in polymerization for dopant polymers (B) in conductive polymer composites used in Examples are shown below.

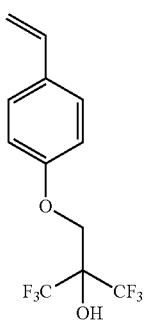

Monomer a″1

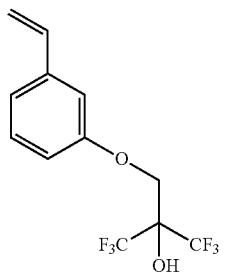

Monomer a″2

Monomer a″6
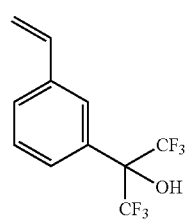
Monomer a″7
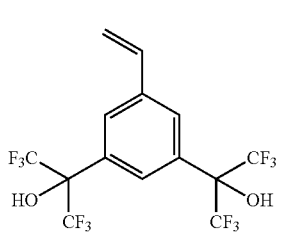
Monomer a″8
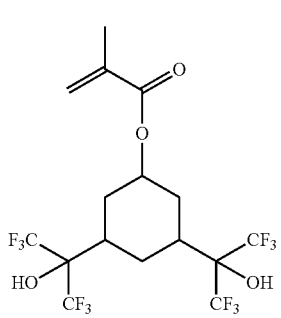
Monomer b″1
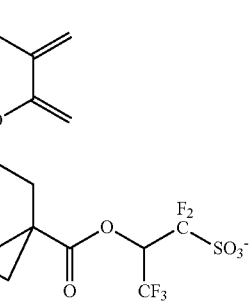
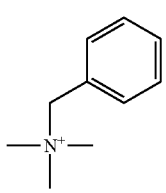
Monomer b″2
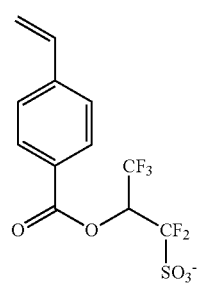
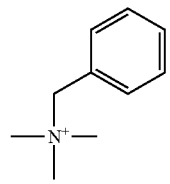
Monomer b″3
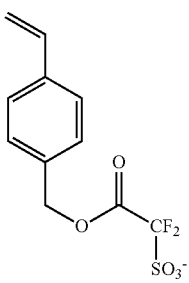
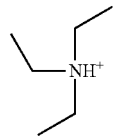
Monomer b″4
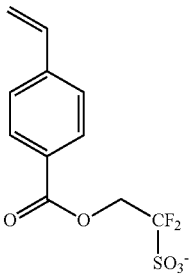
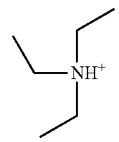

-continued

Monomer b″5

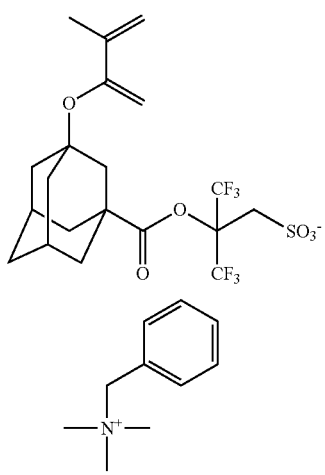

Monomer b″6

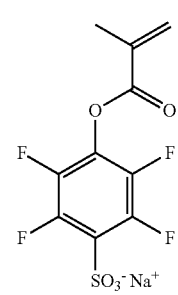

Monomer b″7

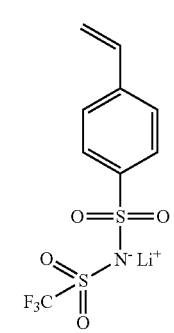

Monomer b″8

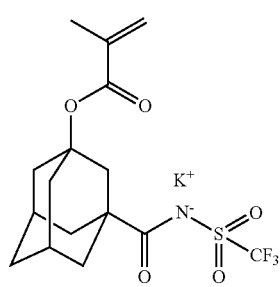

-continued

Monomer b″9

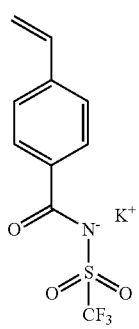

Synthesis Example 1

Under nitrogen atmosphere, to 10 g of methanol stirred at 64° C. was added dropwise over 4 hours a solution of 1.20 g of Monomer a″1, 3.75 g of Monomer b″1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}F$-, $^{1}H$-NMR and GPC, the following analytical results were obtained.

Weight average molecular weight (Mw)=21,000
Molecular weight distribution (Mw/Mn)=1.90
This polymer compound is made (Polymer 1).

Polymer 1

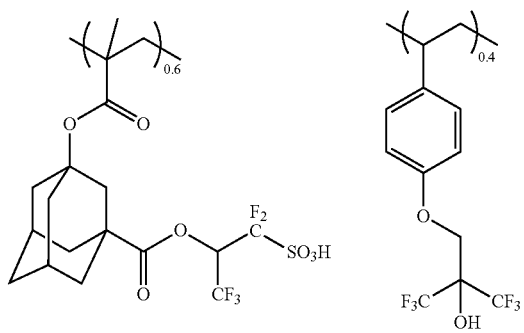

Synthesis Example 2

Under nitrogen atmosphere, to 10 g of methanol stirred at 64° C. was added dropwise over 4 hours a solution of 0.6 g of Monomer a″1, 5.00 g of Monomer b″1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}F$-, $^{1}H$-NMR and GPC, the following analytical results were obtained.

Weight average molecular weight (Mw)=20,500
Molecular weight distribution (Mw/Mn)=1.94
This polymer compound is made (Polymer 2).

Polymer 2

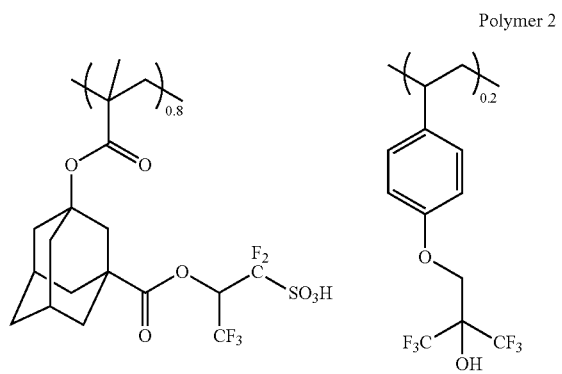

Synthesis Example 3

Under nitrogen atmosphere, to 10 g of methanol stirred at 64° C. was added dropwise over 4 hours a solution of 1.20 g of Monomer a"2, 3.75 g of Monomer b"1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}F$-, $^{1}H$-NMR and GPC, the following analytical results were obtained.

Weight average molecular weight (Mw)=20,000
Molecular weight distribution (Mw/Mn)=1.88
This polymer compound is made (Polymer 3).

Polymer 3

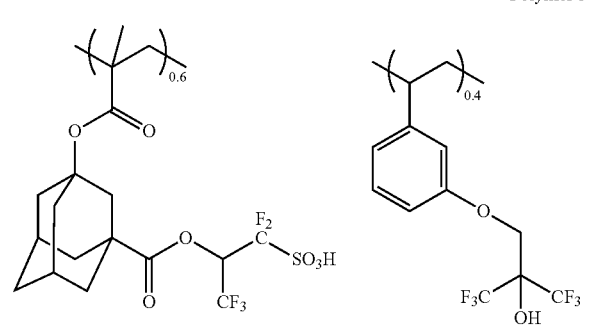

Synthesis Example 4

Under nitrogen atmosphere, to 10 g of methanol stirred at 64° C. was added dropwise over 4 hours a solution of 1.51 g of Monomer a"1, 2.55 g of Monomer b"2, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}F$-, $^{1}H$-NMR and GPC, the following analytical results were obtained.

Weight average molecular weight (Mw)=22,000
Molecular weight distribution (Mw/Mn)=1.93
This polymer compound is made (Polymer 4).

Polymer 4

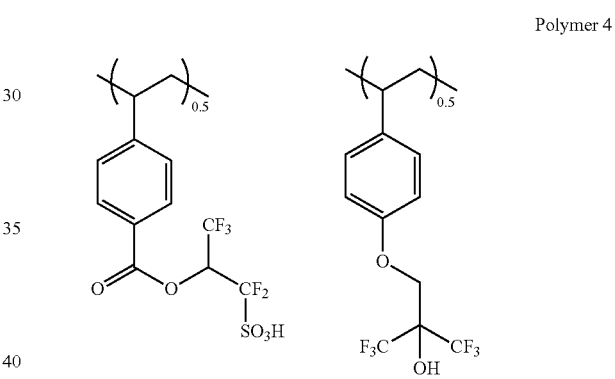

Synthesis Example 5

Under nitrogen atmosphere, to 10 g of methanol stirred at 64° C. was added dropwise over 4 hours a solution of 0.60 g of Monomer a"1, 4.07 g of Monomer b"2, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}F$-, $^{1}H$-NMR and GPC, the following analytical results were obtained.

Weight average molecular weight (Mw)=19,500
Molecular weight distribution (Mw/Mn)=1.99
This polymer compound is made (Polymer 5).

Polymer 5

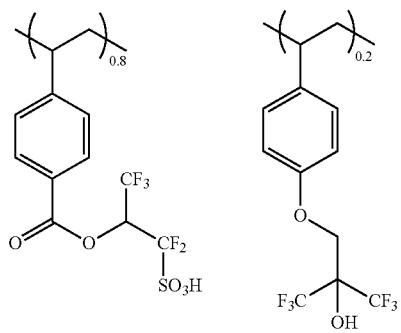

Synthesis Example 6

Under nitrogen atmosphere, to 10 g of methanol stirred at 64° C. was added dropwise over 4 hours a solution of 3.75 g of Monomer a"6, 1.08 g of Monomer b"1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=21,500
Molecular weight distribution (Mw/Mn)=2.07
This polymer compound is made (Polymer 6).

Polymer 6

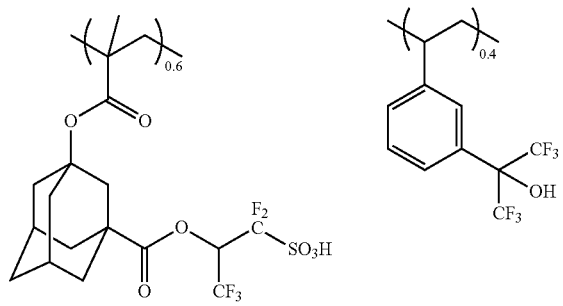

Synthesis Example 7

Under nitrogen atmosphere, to 10 g of methanol stirred at 64° C. was added dropwise over 4 hours a solution of 0.87 g of Monomer a"7, 5.00 g of Monomer b"1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=19,500
Molecular weight distribution (Mw/Mn)=2.00
This polymer compound is made (Polymer 7).

Polymer 7

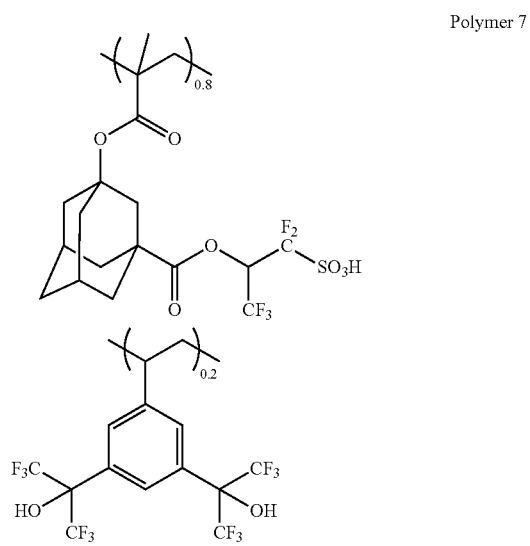

Synthesis Example 8

Under nitrogen atmosphere, to 10 g of methanol stirred at 64° C. was added dropwise over 4 hours a solution of 1.00 g of Monomer a"8, 5.00 g of Monomer b"1, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=20,000
Molecular weight distribution (Mw/Mn)=1.85
This polymer compound is made (Polymer 8).

Polymer 8

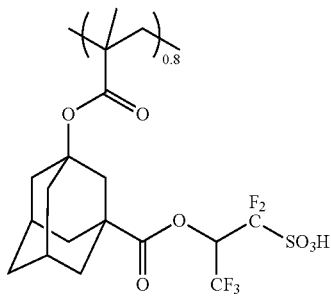

-continued

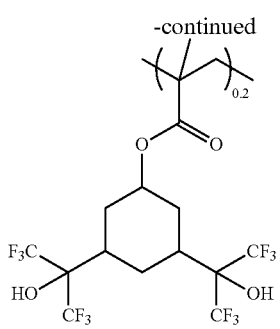

Synthesis Example 9

Under nitrogen atmosphere, to 10 g of methanol stirred at 64° C. was added dropwise over 4 hours a solution of 1.51 g of Monomer a"1, 1.97 g of Monomer b"3, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=19,000
Molecular weight distribution (Mw/Mn)=1.61
This polymer compound is made (Polymer 9).

Polymer 9

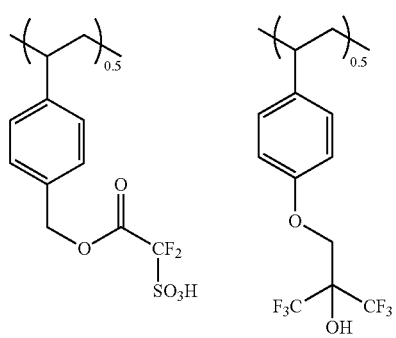

Synthesis Example 10

Under nitrogen atmosphere, to 10 g of methanol stirred at 64° C. was added dropwise over 4 hours a solution of 1.51 g of Monomer a"1, 1.97 g of Monomer b"4, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=18,000
Molecular weight distribution (Mw/Mn)=1.68
This polymer compound is made (Polymer 10).

Polymer 10

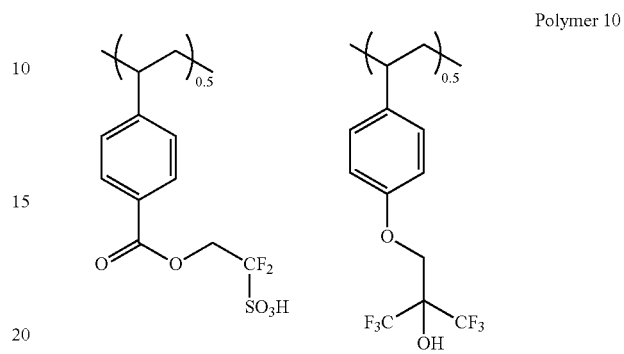

Synthesis Example 11

Under nitrogen atmosphere, to 10 g of methanol stirred at 64° C. was added dropwise over 4 hours a solution of 0.90 g of Monomer a"1, 4.60 g of Monomer b"5, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.
Weight average molecular weight (Mw)=26,000
Molecular weight distribution (Mw/Mn)=2.04
This polymer compound is made (Polymer 11).

Polymer 11

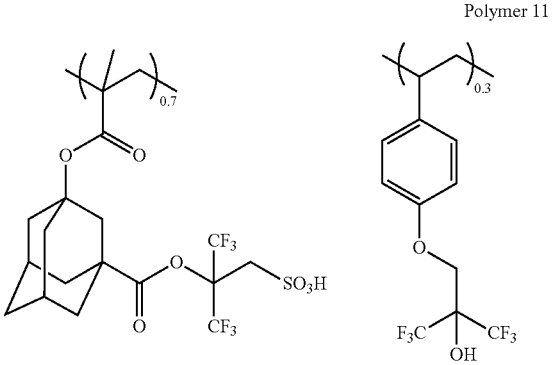

Synthesis Example 12

Under nitrogen atmosphere, to 10 g of methanol stirred at 64° C. was added dropwise over 4 hours a solution of 0.90 g of Monomer a"1, 2.35 g of Monomer b"6, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the sodium salt was changed to a sulfo group by using an ion exchange resin. When the obtained polymer was measured by $^{19}$F-, $^1$H-NMR and GPC, the following analytical results were obtained.

Weight average molecular weight (Mw)=31,000
Molecular weight distribution (Mw/Mn)=2.11
This polymer compound is made (Polymer 12).

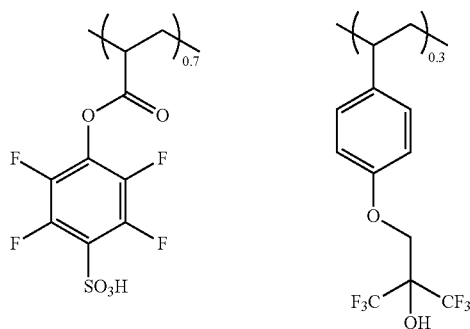

Polymer 12

Synthesis Example 13

Under nitrogen atmosphere, to 10 g of methanol stirred at 64° C. was added dropwise over 4 hours a solution of 1.20 g of Monomer a"1, 1.93 g of Monomer b"7, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the lithium salt was changed to a sulfonimide group by using an ion exchange resin. When the obtained polymer was measured by $^{19}$F-, $^1$H-NMR and GPC, the following analytical results were obtained.

Weight average molecular weight (Mw)=23,000
Molecular weight distribution (Mw/Mn)=1.88
This polymer compound is made (Polymer 13).

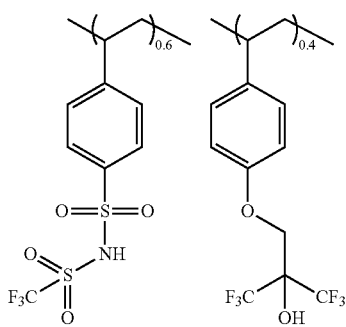

Polymer 13

Synthesis Example 14

Under nitrogen atmosphere, to 10 g of methanol stirred at 64° C. was added dropwise over 4 hours a solution of 1.20 g of Monomer a"1, 2.60 g of Monomer b"8, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the potassium salt was changed to a n-carbonyl-sulfonamide group by using an ion exchange resin. When the obtained polymer was measured by $^{19}$F-, $^1$H-NMR and GPC, the following analytical results were obtained.

Weight average molecular weight (Mw)=29,000
Molecular weight distribution (Mw/Mn)=1.66
This polymer compound is made (Polymer 14).

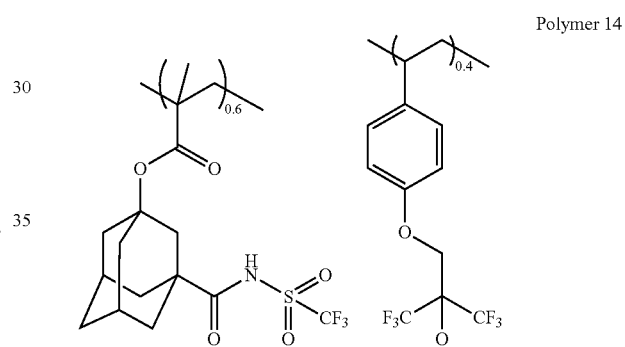

Polymer 14

Synthesis Example 15

Under nitrogen atmosphere, to 10 g of methanol stirred at 64° C. was added dropwise over 4 hours a solution of 1.20 g of Monomer a"1, 1.90 g of Monomer b"9, and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the potassium salt was changed to a n-carbonyl-sulfonamide group by using an ion exchange resin. When the obtained polymer was measured by $^{19}$F-, $^1$H-NMR and GPC, the following analytical results were obtained.

Weight average molecular weight (Mw)=27,000
Molecular weight distribution (Mw/Mn)=1.61
This polymer compound is made (Polymer 15).

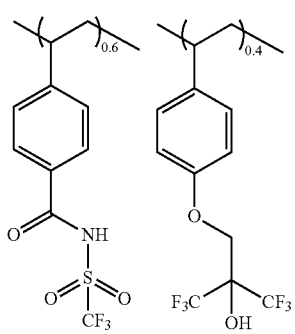

Polymer 15

Synthesis Example 16

Under nitrogen atmosphere, to 10 g of methanol stirred at 64° C. was added dropwise over 4 hours a solution of 6.25 g of Monomer b"1 and 0.12 g of dimethyl 2,2'-azobis(isobutyrate) dissolved in 3 g of methanol. The mixture was further stirred at 64° C. for 4 hours. After cooled to room temperature, the resulting reaction solution was added dropwise to 10 g of ethyl acetate under vigorous stirring. The formed solid product was collected by filtration, and dried under vacuum at 50° C. for 15 hours to obtain a white polymer.

The obtained white polymer was dissolved in 100 g of pure water, and the ammonium salt was changed to a sulfo group by using an ion exchange resin. When the obtained polymer was measured by $^{19}$F-, $^{1}$H-NMR and GPC, the following analytical results were obtained.

Weight average molecular weight (Mw)=22,500
Molecular weight distribution (Mw/Mn)=1.90
This polymer compound is made (Polymer 16).

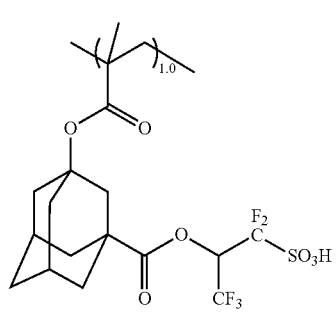

Polymer 16

[Preparation of Conductive Polymer Composite Dispersion Containing Polythiophene as π-Conjugated Polymer]

Preparation Example 1

2.27 g of 3,4-ethylenedioxythiophene and a solution in which 15.0 g of Dopant Polymer 1 had been dissolved in 1,000 mL of ultrapure water were mixed at 30° C.

The obtained mixture solution was maintained at 30° C., and under stirring, 4.99 g of sodium persulfate dissolved in 100 mL of ultrapure water and an oxidizing catalyst solution of 1.36 g of ferric sulfate were gradually added thereto and stirred for 4 hours to react these materials.

To the obtained reaction solution, 1,000 mL of ultrapure water was added, and about 1,000 mL of the solution was removed by using the ultrafiltration method. This operation was repeated three times.

Then, to the processed solution after the filtration treatment were added 200 mL of sulfuric acid diluted to 10 mass % and 2,000 mL of deionized water. About 2,000 mL of the processed solution was removed by using the ultrafiltration method, and 2,000 mL of deionized water was added thereto. About 2,000 mL of the solution was removed by using the ultrafiltration method. This operation was repeated three times.

Further, to the obtained processed solution was added 2,000 mL of deionized water. About 2,000 mL of the processed solution was removed by using the ultrafiltration method. This operation was repeated five times to obtain 1.3 mass % of blue-colored Conductive Polymer Composite Dispersion 1.

The ultrafiltration conditions are as follows.
Molecular weight cutoff of ultrafiltration membrane: 30K
Cross Flow Type
Flow amount of supplied liquid: 3,000 mL/min.
Membrane partial pressure: 0.12 Pa
Ultrafiltration was carried out with the same conditions in the other Preparation Examples.

Preparation Example 2

Preparation was carried out in the same manner as in Preparation Example 1 except for changing 15.0 g of Dopant Polymer 1 to Dopant Polymer 2, and changing the amount of 3,4-ethylenedioxythiophene blended to 2.09 g, the amount of sodium persulfate blended to 4.59 g, and the amount of ferric sulfate blended to 1.25 g. Thus, Conductive Polymer Composite Dispersion 2 was obtained.

Preparation Example 3

Preparation was carried out in the same manner as in Preparation Example 1 except for changing 15.0 g of Dopant Polymer 1 to Dopant Polymer 3, and changing the amount of 3,4-ethylenedioxythiophene blended to 2.27 g, the amount of sodium persulfate blended to 4.99 g, and the amount of ferric sulfate blended to 1.36 g. Thus, Conductive Polymer Composite Dispersion 3 was obtained.

Preparation Example 4

Preparation was carried out in the same manner as in Preparation Example 1 except for changing 15.0 g of Dopant Polymer 1 to Dopant Polymer 4, and changing the amount of 3,4-ethylenedioxythiophene blended to 2.79 g, the amount of sodium persulfate blended to 6.13 g, and the amount of ferric sulfate blended to 1.67 g. Thus, Conductive Polymer Composite Dispersion 4 was obtained.

Preparation Example 5

Preparation was carried out in the same manner as in Preparation Example 1 except for changing 15.0 g of Dopant Polymer 1 to Dopant Polymer 5, and changing the amount of 3,4-ethylenedioxythiophene blended to 2.64 g, the amount of sodium persulfate blended to 5.82 g, and the amount of ferric sulfate blended to 1.59 g. Thus, Conductive Polymer Composite Dispersion 5 was obtained.

Preparation Example 6

Preparation was carried out in the same manner as in Preparation Example 1 except for changing 15.0 g of Dopant Polymer 1 to Dopant Polymer 6, and changing the amount of 3,4-ethylenedioxythiophene blended to 2.34 g, the amount of sodium persulfate blended to 5.14 g, and the amount of ferric sulfate blended to 1.40 g. Thus, Conductive Polymer Composite Dispersion 6 was obtained.

Preparation Example 7

Preparation was carried out in the same manner as in Preparation Example 1 except for changing 15.0 g of Dopant Polymer 1 to Dopant Polymer 7, and changing the amount of 3,4-ethylenedioxythiophene blended to 1.97 g, the amount of sodium persulfate blended to 4.32 g, and the amount of ferric sulfate blended to 1.17 g. Thus, Conductive Polymer Composite Dispersion 7 was obtained.

Preparation Example 8

Preparation was carried out in the same manner as in Preparation Example 1 except for changing 15.0 g of Dopant Polymer 1 to Dopant Polymer 8, and changing the amount of 3,4-ethylenedioxythiophene blended to 1.91 g, the amount of sodium persulfate blended to 4.20 g, and the amount of ferric sulfate blended to 1.12 g. Thus, Conductive Polymer Composite Dispersion 8 was obtained.

Preparation Example 9

Preparation was carried out in the same manner as in Preparation Example 1 except for changing 15.0 g of Dopant Polymer 1 to Dopant Polymer 9, and changing the amount of 3,4-ethylenedioxythiophene blended to 3.11 g, the amount of sodium persulfate blended to 6.62 g, and the amount of ferric sulfate blended to 1.87 g. Thus, Conductive Polymer Composite Dispersion 9 was obtained.

Preparation Example 10

Preparation was carried out in the same manner as in Preparation Example 1 except for changing 15.0 g of Dopant Polymer 1 to Dopant Polymer 10, and changing the amount of 3,4-ethylenedioxythiophene blended to 3.11 g, the amount of sodium persulfate blended to 6.85 g, and the amount of ferric sulfate blended to 1.87 g. Thus, Conductive Polymer Composite Dispersion 10 was obtained.

Preparation Example 11

Preparation was carried out in the same manner as in Preparation Example 1 except for changing 15.0 g of Dopant Polymer 1 to Dopant Polymer 11, and changing the amount of 3,4-ethylenedioxythiophene blended to 2.06 g, the amount of sodium persulfate blended to 4.54 g, and the amount of ferric sulfate blended to 1.24 g. Thus, Conductive Polymer Composite Dispersion 11 was obtained.

Preparation Example 12

Preparation was carried out in the same manner as in Preparation Example 1 except for changing 15.0 g of Dopant Polymer 1 to Dopant Polymer 12, and changing the amount of 3,4-ethylenedioxythiophene blended to 2.97 g, the amount of sodium persulfate blended to 6.53 g, and the amount of ferric sulfate blended to 1.78 g. Thus, Conductive Polymer Composite Dispersion 12 was obtained.

Preparation Example 13

Preparation was carried out in the same manner as in Preparation Example 1 except for changing 15.0 g of Dopant Polymer 1 to Dopant Polymer 13, and changing the amount of 3,4-ethylenedioxythiophene blended to 2.97 g, the amount of sodium persulfate blended to 6.55 g, and the amount of ferric sulfate blended to 1.79 g. Thus, Conductive Polymer Composite Dispersion 13 was obtained.

Preparation Example 14

Preparation was carried out in the same manner as in Preparation Example 1 except for changing 15.0 g of Dopant Polymer 1 to Dopant Polymer 14, and changing the amount of 3,4-ethylenedioxythiophene blended to 1.78 g, the amount of sodium persulfate blended to 5.67 g, and the amount of ferric sulfate blended to 1.55 g. Thus, Conductive Polymer Composite Dispersion 14 was obtained.

Preparation Example 15

Preparation was carried out in the same manner as in Preparation Example 1 except for changing 15.0 g of Dopant Polymer 1 to Dopant Polymer 15, and changing the amount of 3,4-ethylenedioxythiophene blended to 3.20 g, the amount of sodium persulfate blended to 7.04 g, and the amount of ferric sulfate blended to 1.92 g. Thus, Conductive Polymer Composite Dispersion 15 was obtained.

Comparative Preparation Example 1

Preparation was carried out in the same manner as in Preparation Example 1 except for changing 15.0 g of Dopant Polymer 1 to Dopant Polymer 16, and changing the amount of 3,4-ethylenedioxythiophene blended to 1.93 g, the amount of sodium persulfate blended to 4.25 g, and the amount of ferric sulfate blended to 1.16 g. Thus, Conductive Polymer Composite Dispersion 16 was obtained.

Comparative Preparation Example 2

5.0 g of 3,4-ethylenedioxythiophene and a solution in which 83.3 g of an aqueous polystyrenesulfonic acid solution (18.0 mass %, available from Aldrich) had been diluted with 250 mL of deionized water were mixed at 30° C. Except for this, preparation was carried out in the same manner as in Preparation Example 1 to obtain 1.3 mass % of blue-colored Conductive Polymer Composite Dispersion 17 (PEDOT-PSS dispersion).

[Evaluation of Conductive Polymer Compositions Containing Polythiophene as $\pi$-Conjugated Polymer]

With 2.5 mass % of one of the conductive polymer composite dispersions obtained in Preparation Examples 1 to 15 were mixed 0.43 mass % of L-(+)-Lysine, one of the compounds (C) shown by the general formula (3) and a fluoroalkyl-based nonionic surfactant FS-31 (available from DuPont). Then, the mixture was filtered using cellulose filters (manufactured by ADVANTEC Corporation) having a pore size of 3.00 to 0.45 μm. In this manner, conductive polymer compositions were prepared and respectively designated as Examples 1 to 15.

Comparative Examples

In the same manner as in Examples except for using Conductive Polymer Composite Dispersions 16, 17 obtained in Comparative Preparation Examples 1, 2, conductive polymer compositions were prepared and respectively designated as Comparative Examples 1, 2.

The conductive polymer compositions of Examples and Comparative Examples thus prepared were evaluated as follows.

(Filterability)

In the preparations of the conductive polymer compositions of Examples and Comparative Examples, when the filtration was carried out using the regenerated cellulose filters having a pore size of 3.0 to 0.45 µm, the pore size limit of the filter through which the compositions were successfully filtered and passed is shown in Table 1.

(Coatability)

First, each conductive polymer composition was spin-coated onto a Si wafer by using 1H-360S SPINCOATER (manufactured by MIKASA Co., Ltd.) to have a film thickness of 100±5 nm. Next, baking was carried out in a precise constant temperature oven at 120° C. for 5 minutes, and the solvent was removed to obtain a conductive film. For this conductive film, the refractive index (n, k) at a wavelength of 636 nm was obtained using a spectroscopic ellipsometer VASE (manufactured by J.A. Woollam Co.) with variable incident angle. A sample which had a uniform film successfully formed was evaluated as good, while a sample from which the refractive index was measured but defect derived from particles or partial striation occurred in the film was evaluated as poor and shown in Table 1.

square roughness) was measured with AFM NANO-IM-8 (manufactured by Image Metrology A/S). Table 1 shows the result.

(Transmittance)

From the refractive index (n, k) at a wavelength of 636 nm measured using a spectroscopic ellipsometer (VASE) with variable incident angle, the transmittance for light beam with a wavelength of 550 nm at FT=200 nm was calculated. Table 1 shows the result.

(Conductivity)

Onto a $SiO_2$ wafer having a diameter of 4 inches (100 mm), 1.0 mL of a conductive polymer composition was added dropwise, and 10 seconds later, was spin-coated on the whole wafer by using a spinner. The spin-coating conditions were so adjusted that the film thickness became 100±5 nm. Baking was carried out in a precise constant temperature oven at 120° C. for 5 minutes, and the solvent was removed to obtain a conductive film.

The conductivity (S/cm) of the obtained conductive film was obtained from the actually measured value of the film thickness and the surface resistivity (Q/D) measured by using Hiresta-UP MCP-HT450 and Loresta-GP MCP-T610 (both manufactured by Mitsubishi Chemical Corporation). Table 1 shows the result.

TABLE 1

| | Filterability (filter pore size limit for passage) | Coatability | Viscosity (mPa/S) | pH | Surface Roughness (RMS, nm) | Transmittance (FT = 200 nm, λ = 550 nm) | Conductivity (S/cm) |
|---|---|---|---|---|---|---|---|
| Example 1 | 0.45 µm | good | 3.74 | 7.0 | 0.155 | 97% | 4.70E−05 |
| Example 2 | 0.45 µm | good | 5.00 | 6.4 | 0.152 | 95% | 9.18E−05 |
| Example 3 | 0.45 µm | good | 4.23 | 6.9 | 0.155 | 98% | 3.92E−05 |
| Example 4 | 0.45 µm | good | 4.01 | 6.8 | 0.149 | 95% | 3.32E−05 |
| Example 5 | 0.45 µm | good | 4.89 | 6.3 | 0.135 | 97% | 1.11E−04 |
| Example 6 | 0.45 µm | good | 3.56 | 6.9 | 0.159 | 97% | 5.52E−05 |
| Example 7 | 0.45 µm | good | 4.85 | 6.5 | 0.132 | 92% | 1.12E−04 |
| Example 8 | 0.45 µm | good | 5.12 | 6.4 | 0.201 | 96% | 8.87E−05 |
| Example 9 | 0.45 µm | good | 3.33 | 7.0 | 0.176 | 95% | 4.04E−05 |
| Example 10 | 0.45 µm | good | 3.41 | 6.8 | 0.155 | 91% | 3.87E−05 |
| Example 11 | 0.45 µm | good | 4.99 | 6.9 | 0.167 | 95% | 6.75E−05 |
| Example 12 | 0.45 µm | good | 4.88 | 6.9 | 0.149 | 93% | 1.07E−04 |
| Example 13 | 0.45 µm | good | 3.03 | 6.9 | 0.171 | 96% | 5.56E−05 |
| Example 14 | 0.45 µm | good | 3.21 | 6.8 | 0.155 | 91% | 4.10E−05 |
| Example 15 | 0.45 µm | good | 3.43 | 6.9 | 0.129 | 94% | 9.44E−05 |
| Comparative Example 1 | 0.45 µm | good | 8.00 | 6.0 | 0.278 | 97% | 2.10E−04 |
| Comparative Example 2 | 1.0 µm | poor | 11.40 | 6.1 | 2.520 | 84% | 2.32E−03 |

(Viscosity)

The content of the solid components in a conductive polymer composition was made 1.3 mass %, and the liquid temperature was adjusted to 25° C. Then, 35 mL of the sample was weighed into a measurement cell specifically attached to a tuning fork vibration type viscometer SV-10 (manufactured by A&D Company Limited), and the viscosity immediately after preparation was measured. Table 1 shows the result.

(pH Measurement)

The pH of a conductive polymer composition was measured by using a pH meter D-52 (manufactured by HORIBA, Ltd.). Table 1 shows the result.

(Surface Roughness)

In the same manner as in the conductivity evaluation method, a conductive film was obtained on a $SiO_2$ wafer having a diameter of 4 inches (100 mm). RMS (root mean As shown in Table 1, in each of Examples 1 to 15 containing polythiophene as the π-conjugated polymer and Dopant Polymers having the repeating units "a" and "b", the filterability was good, and uniform coating films were successfully obtained by coating with a spin coater. In addition, the conductivity of E-04 to E-05 S/cm appropriate as a hole injection layer material was exhibited, the transmittance for visible light with λ=550 nm was also good, and the surface roughness was good, too.

In contrast, in Comparative Example 1 having no repeating unit "a" and Comparative Example 2 using polystyrenesulfonic acid having no repeating units "a" and "b" as the dopant polymer, the viscosity reduction was limited. The filterability of Comparative Example 1 was equivalent to those of Examples 1 to 15, but the surface roughness of the film after the formation was inferior. Comparative Example 2 was further inferior in filterability, and the filter pore size filtration limit was so large as 1.0 µm. Hence, in Comparative Example 2, particles were consequently observed on the film after the spin coating, and the particles and air bubbles caused striation. Moreover, the conductivity was high. In a light emission test in a mounted state on an organic EL device to be described later, electrode-like function was demonstrated at a portion other than an ITO-deposited surface where the ITO vapor was deposited as a transparent electrode on a substrate. Light was excessively emitted at a portion other than the light emission area of a device stacked on the ITO electrode, thereby decreasing the original light emission efficiency of the device portion. Furthermore, the transmittance for visible light with $\lambda=550$ nm was inferior to those of Examples 1 to 15.

The conductive compositions of Examples 1 to 15 and Comparative Examples 1, 2 were each mounted as a hole injection layer in an organic EL device. The percentage of luminance decrease in each device was measured.

A washed glass substrate with ITO was coated with one of the compositions of Examples 1 to 15 and Comparative Examples 1, 2 by spin coating to have a film thickness of 100 nm. α-NPD (diphenylnaphthyldiamine) was stacked thereon as a hole transport layer by vapor deposition to have a film thickness of 80 nm. Then, as a light emitting layer, $Alq_3$ (tris(8-hydroxyquinoline)aluminum complex) was vapor-deposited to have a film thickness of 35 nm. 8-Liq (8-hydroxyquinolinato-lithium) was vapor-deposited thereon to have a film thickness of 30 nm. An electrode made of an alloy in which magnesium and silver had been mixed was formed thereon to have a film thickness of 100 nm. Thus, an organic EL device was obtained. This device was caused to continuously emit light under high load conditions with a fixed current density of 200 $mA/m^2$ to measure an elapsed time until the luminance became 70% of the initial luminance. Table 2 shows these results.

TABLE 2

|  | Elapsed time (h) until 70% of initial luminance |
|---|---|
| Example 1 | 5823 |
| Example 2 | 4867 |
| Example 3 | 5800 |
| Example 4 | 5772 |
| Example 5 | 4961 |
| Example 6 | 5559 |
| Example 7 | 5206 |
| Example 8 | 4893 |
| Example 9 | 5121 |
| Example 10 | 5362 |
| Example 11 | 5077 |
| Example 12 | 5252 |
| Example 13 | 4789 |
| Example 14 | 4581 |
| Example 15 | 4936 |
| Comparative Example 1 | 756 |
| Comparative Example 2 | 205 |

As shown in Table 2, in Examples 1 to 15 of the conductive polymer compositions each obtained by adding the compound (C) to the conductive polymer composite containing (A) polythiophene as the π-conjugated polymer and (B) Dopant Polymer having the repeating unit "a", the effect of reducing moisture remaining during the film formation was remarkably exhibited by the repeating unit "a". In the organic EL devices in which these films are mounted as the hole injection layers, the percentage of luminance decrease was improved (the device lifetime was extended).

In contrast, in the compositions (Comparative Examples 1 and 2) containing the compound (C) and the conductive polymer composite containing the dopant polymer having no repeating unit "a", significant decreases in luminance were observed, and the device lifetime was short.

As described above, it was clarified that: the inventive conductive polymer composites and the inventive compositions have low viscosity, good filterability, and favorable coating film formability by spin coating as an example; residual moisture in the film is efficiently removed during film formation by the influence of fluorine atoms present in the repeating units "a" and "b" in the components of the dopant polymer (B); and the formed film can form a conductive film having good transparency, flatness, and conductivity or hole injection efficiency. Moreover, in the dopant polymer (B), the repeating unit "b" containing a sulfo group is copolymerized with the non-doping fluorinated unit "a" having no sulfonated terminal; the use of this polymer as a dopant to form a composite together with the π-conjugated polymer (A) reduces extra non-doping sulfonated terminals, consequently generating few $H^+$. Thus, when the inventive materials are employed as a constituent film of a thin film-stacked device, it is possible to suppress the influence of $H^+$ on other constituent layers. Further, it was revealed that such conductive polymer composite and composition have good affinity to organic and inorganic substrates having high hydrophobicity, and have good film formability on any of an organic substrate and an inorganic substrate.

Furthermore, the conductive film formed from each of the conductive polymer composite and composition is excellent in conductivity, hole injection efficiency, transparency, and so forth, and can reduce moisture volatilization from the film, moisture condensation, and so forth when employed as a constituent film of a thin film-stacked device, too. Accordingly, such a conductive film is capable of effectively functioning as a transparent electrode layer or a hole injection layer of the thin film-stacked device.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A conductive polymer composition comprising:
a conductive polymer composite which comprises a composite comprising:
(A) a π-conjugated polymer; and
(B) a dopant polymer comprising a copolymer containing a repeating unit shown by the following general formula (1) and at least one repeating unit selected from repeating units shown by the following general formulae (2-1) to (2-7),

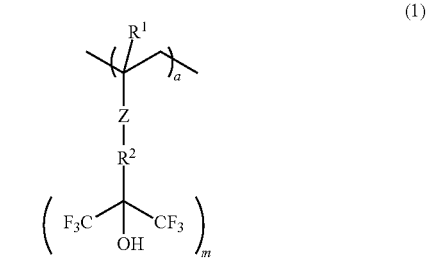

(1)

(2-1)
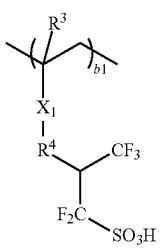

(2-2)
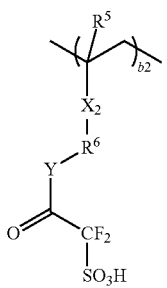

(2-3)
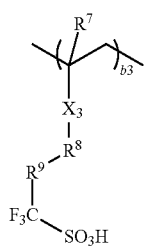

(2-4)
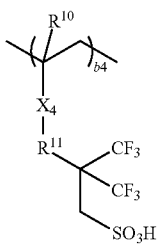

(2-5)
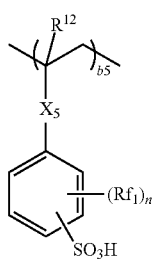

(2-6)
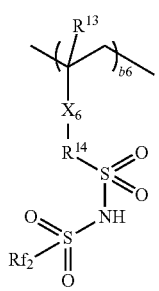

(2-7)
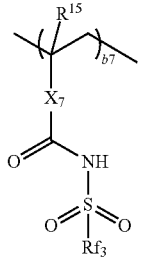

wherein $R^1$ represents a hydrogen atom or a methyl group; Z represents any of a phenylene group, a naphthylene group, and an ester group; when Z is a phenylene group or a naphthylene group, $R^2$ represents any of a single bond and a linear, branched, or cyclic hydrocarbon group having 1 to 12 carbon atoms optionally having one or both of an ester group and an ether group; when Z is an ester group, $R^2$ represents a linear, branched, or cyclic hydrocarbon group having 1 to 12 carbon atoms optionally having one or both of a single bond and an ether group; "m" represents any one of 1 to 3; $R^3$, $R^5$, $R^7$, $R^{10}$, $R^{12}$, $R^{13}$, and $R^{15}$ each independently represent a hydrogen atom or a methyl group; $R^4$, $R^6$, $R^8$, $R^{11}$, and $R^{14}$ each independently represent any of a single bond and a linear, branched, or cyclic hydrocarbon group having 1 to 12 carbon atoms optionally having one or both of an ether group and an ester group; $R^9$ represents a linear or branched alkylene group having 1 to 4 carbon atoms, and one or two hydrogen atoms in $R^9$ are optionally substituted with a fluorine atom; $X_1$, $X_2$, $X_3$, $X_4$, $X_6$, and $X_7$ each independently represent any of a single bond, a phenylene group, a naphthylene group, an ether group, an ester group, and an amide group; $X_5$ represents any of a single bond, an ether group, and an ester group; Y represents any of an ether group, an ester group, an amino group, and an amide group, and the amino group and the amide group optionally contain any of a hydrogen atom and a linear, branched, or cyclic hydrocarbon group having 1 to 12 carbon atoms optionally containing a hetero atom; $Rf_1$ represents a fluorine atom or a trifluoromethyl group; $Rf_2$ and $Rf_3$ each represent a linear or branched alkyl group having 1 to 4 carbon atoms with one or more fluorine atoms, or a phenyl group substituted with a fluorine atom or a trifluoromethyl group; "n" represents an integer of 1 to 4; and "a", b1, b2, b3, b4, b5, b6, and b7 are molar ratio in the dopant polymer and satisfy $0<a<1.0$, $0\le b1<1.0$, $0\le b2<1.0$, $0\le b3\le 1.0$, $0\le b4<1.0$, $0\le b5<1.0$, $0\le b6<1.0$, $0\le b7<1.0$, and $0<b1+b2+b3+b4+b5+b6+b7<1.0$;

water or an organic solvent as a solvent; and a compound (C) which is any of the compounds shown in the following formulae (T1) to (T3), (T1)
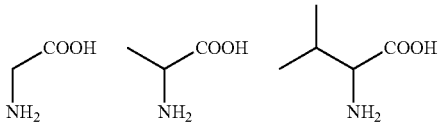
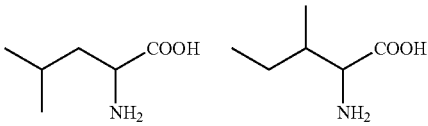

-continued
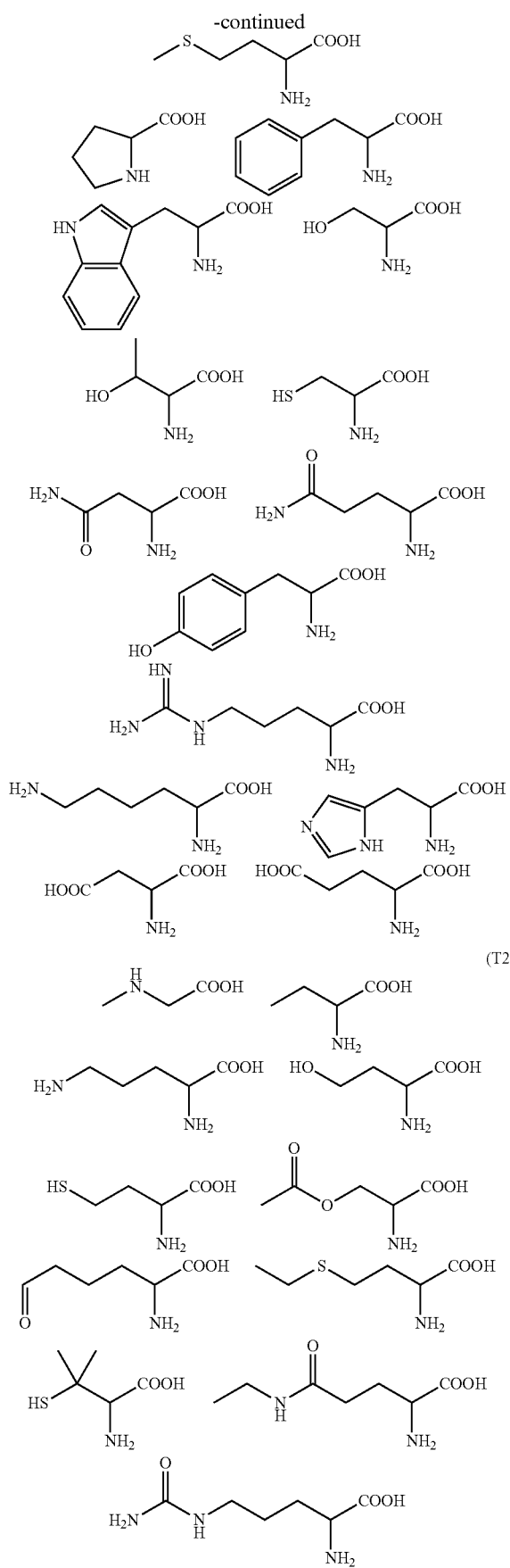
-continued
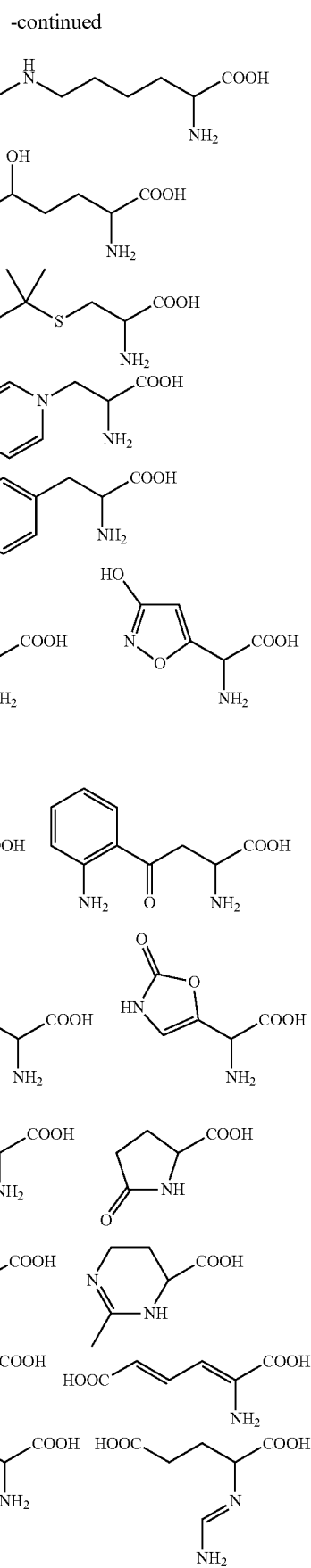
(T2)

-continued

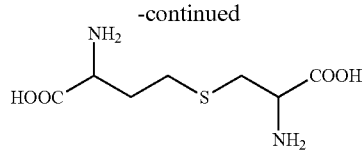

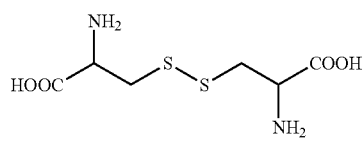

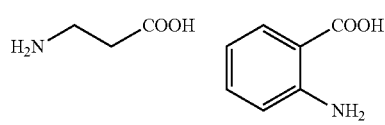 (T3)

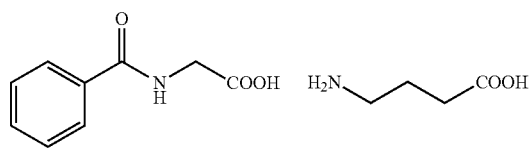

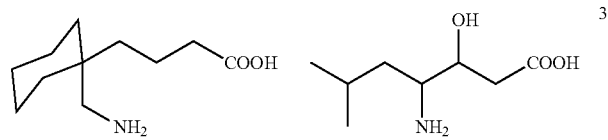

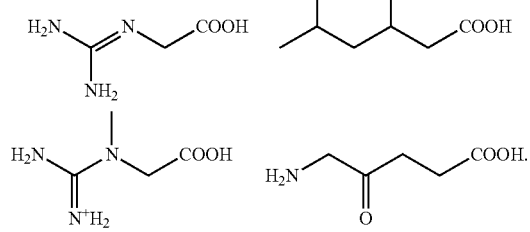

2. The conductive polymer composition according to claim 1, wherein the compound (C) is contained in an amount of 1 to 30 parts by mass based on 100 parts by mass of the conductive polymer composite.

3. The conductive polymer composition according to claim 1, wherein the conductive polymer composition has a pH of 4.0 to 9.0.

4. The conductive polymer composition according to claim 1, further comprising a nonionic surfactant.

5. The conductive polymer composition according to claim 4, wherein the nonionic surfactant is contained in an amount of 1 to 15 parts by mass based on 100 parts by mass of the conductive polymer composite.

6. The conductive polymer composition according to claim 1, wherein the conductive polymer composition is used to form a transparent electrode layer or a hole injection layer of an organic EL device.

7. The conductive polymer composition according to claim 1, wherein the repeating unit shown by the following general formula (1) in the dopant polymer (B) contains one or more selected from repeating units shown by the following general formulae (4-1) to (4-5):

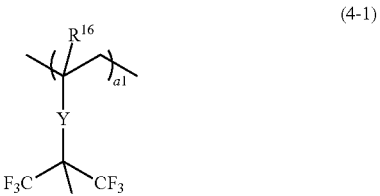 (4-1)

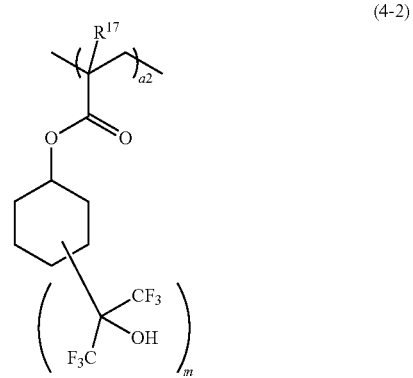 (4-2)

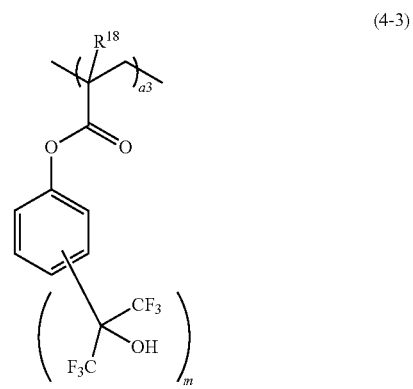 (4-3)

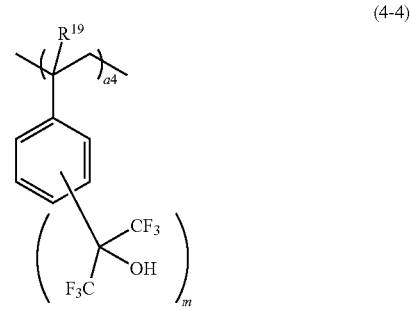 (4-4)

-continued (4-5)

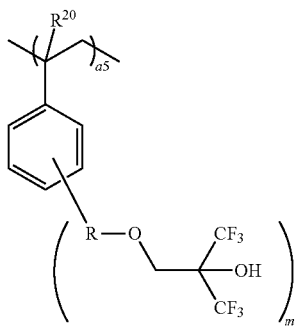

wherein $R^{16}$, $R^{17}$, $R^{18}$, $R^{19}$, and $R^{20}$ each independently represent a hydrogen atom or a methyl group; R represents a single bond, a methylene group, an ethylidene group, or an isopropylidene group; and Y and "m" are as defined above; and a1, a2, a3, a4, and a5 are molar ratio in the dopant polymer and satisfy $0 \leq a1 < 1.0$, $0 \leq a2 < 1.0$, $0 \leq a3 < 1.0$, $0 \leq a4 < 1.0$, $0 \leq a5 < 1.0$, and $0 < a1+a2+a3+a4+a5 < 1.0$.

8. The conductive polymer composition according to claim 1, wherein
the at least one repeating unit selected from repeating units shown by the following general formulae (2-1) to (2-7) in the dopant polymer (B) contains one or more selected from repeating units shown by the following general formulae (5-1) to (5-4):

(5-1)

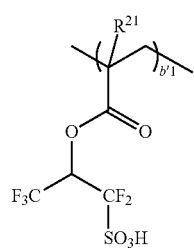

(5-2)

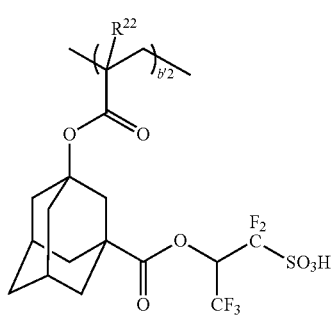

(5-3)

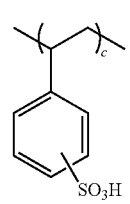

(5-4)

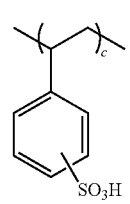

wherein $R^{21}$, $R^{22}$, $R^{23}$, and $R^{24}$ each independently represent a hydrogen atom or a methyl group; and b'1, b'2, b'3, and b'4 are molar ratio in the dopant polymer and satisfy $0 \leq b'1 < 1.0$, $0 \leq b'2 < 1.0$, $0 \leq b'3 < 1.0$, $0 \leq b'4 < 1.0$, and $0 < b'1+b'2+b'3+b'4 < 1.0$.

9. The conductive polymer composition according to claim 1, wherein the dopant polymer (B) further contains a repeating unit shown by the following general formula (6):

(6)

wherein "c" is molar ratio in the dopant polymer and satisfies $0 < c < 1.0$.

10. The conductive polymer composition according to claim 1, wherein the dopant polymer (B) has a weight average molecular weight of 1,000 to 500,000.

11. The conductive polymer composition according to claim 1, wherein the repeating unit shown by the following general formula (1) in the dopant polymer (B) has a copolymerization ratio of 10% to 60% relative to all the repeating units.

12. The conductive polymer composition according to claim 1, wherein the dopant polymer (B) is a block copolymer.

13. The conductive polymer composition according to claim 1, wherein the π-conjugated polymer (A) is a material in which one or more precursor monomers selected from the group consisting of pyrrole, thiophene, selenophene, tellurophene, aniline, polycyclic aromatic compounds, and derivatives thereof are polymerized.

* * * * *